United States Patent [19]

Hull et al.

[11] Patent Number: 5,059,359
[45] Date of Patent: Oct. 22, 1991

[54] METHODS AND APPARATUS FOR PRODUCTION OF THREE-DIMENSIONAL OBJECTS BY STEREOLITHOGRAPHY

[75] Inventors: Charles W. Hull, Arcadia; Stuart T. Spence, South Pasadena; David J. Albert, Saratoga; Dennis R. Smalley, Baldwin Park; Richard A. Harlow, Malibu; Phil Steinbaugh, Mountain View; Harry L. Tarnoff, Van Nuys; Hop D. Nguyen, Littlerock; Charles W. Lewis, Van Nuys; Tom J. Vorgitch, Simi Valley; David Z. Remba, Studio City, all of Calif.

[73] Assignee: 3 D Systems, Inc., Valencia, Calif.

[21] Appl. No.: 182,830

[22] Filed: Apr. 18, 1988

[51] Int. Cl.$^5$ .................. B29C 35/08; B29C 67/00
[52] U.S. Cl. ...................................... 264/22; 118/620; 156/272.8; 156/273.3; 156/379.6; 250/492.1; 264/308; 364/476; 364/522; 365/107; 425/174.4; 427/53.1; 427/54.1
[58] Field of Search ................ 264/22, 40.1, 255, 298, 264/308, 236, 347; 425/135, 150, 174.4, 404, 445; 364/474.05, 474.24, 476, 522; 365/107, 119, 120, 127; 156/64, 272.8, 273.3, 273.5, 275.5, 307.1, 378, 379.6; 427/8, 53.1, 54.1, 430.1; 118/402, 403, 428, 429, 620, 712; 250/492.1

[56] References Cited

U.S. PATENT DOCUMENTS

| | | | |
|---|---|---|---|
| 2,775,758 | 12/1956 | Munz | 156/58 X |
| 4,575,330 | 3/1986 | Hull | 425/174.4 |
| 4,863,538 | 9/1989 | Deckard | 156/272.8 X |

FOREIGN PATENT DOCUMENTS 250121 2/1987 European Pat. Off. .

*Primary Examiner*—Leo B. Tentoni
*Attorney, Agent, or Firm*—Lyon & Lyon

[57] ABSTRACT

An improved sterolithography system for generating a three-dimensional object by creating a cross-sectional pattern of the object to be formed at a selected surface of a fluid medium capable of altering its physical state in response to appropriate synergistic stimulation by impinging radiation, particle bombardment or chemical reaction, information defining the object being specially processed to reduce curl and distortion, and increase resolution, strength, accuracy, speed and economy of reproduction even for rather difficult object shapes, and successive adjacent laminae, representing corresponding successive adjacent cross-sections of the object, being automatically formed and integrated together to provide a step-wise laminar buildup of the desired object, whereby a three-dimensional object is formed and drawn from a substantially planar surface of the fluid medium during the forming process.

57 Claims, 80 Drawing Sheets

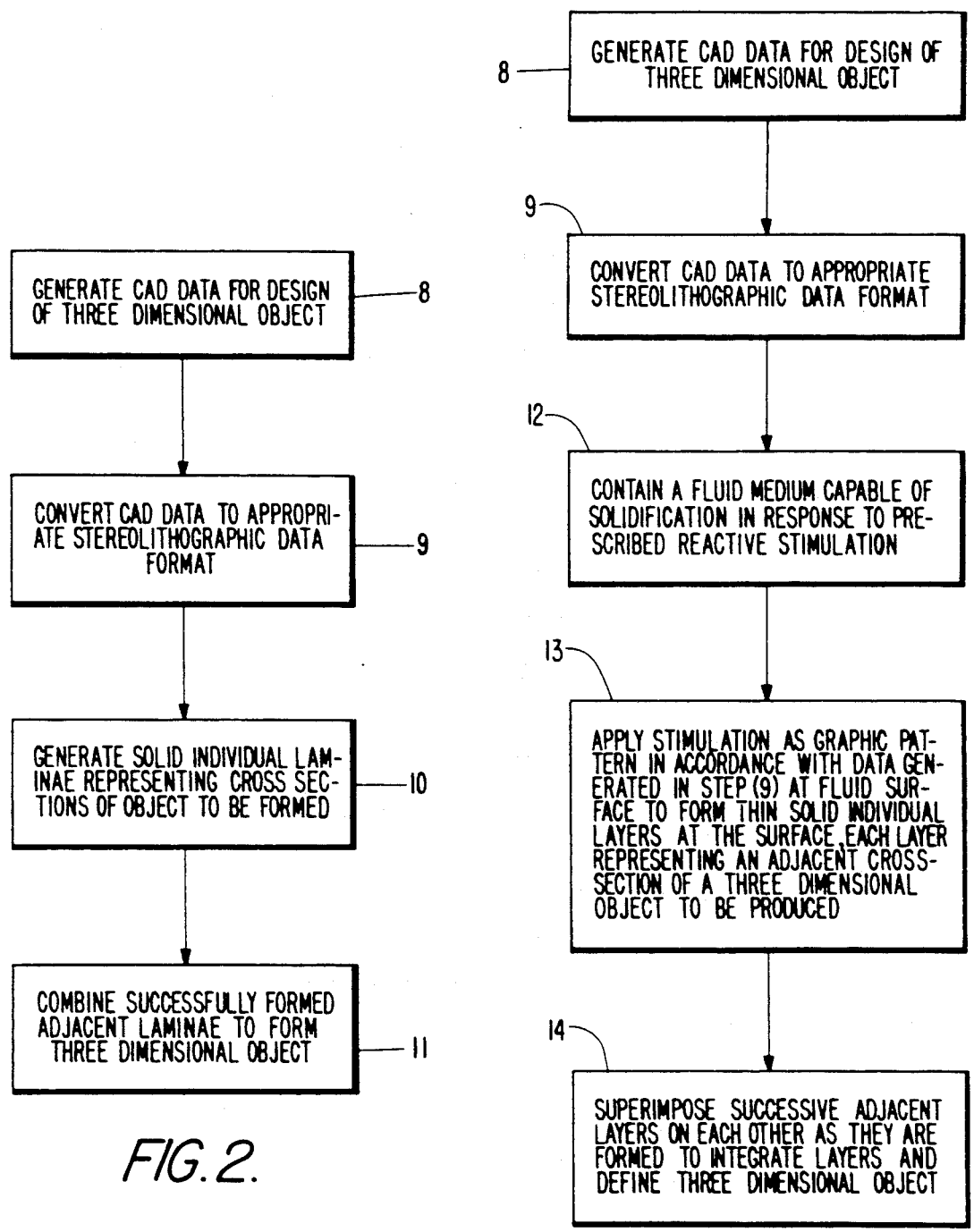

MAJOR COMPONENTS OF THE STEREOLITHOGRAPHY SYSTEM

MAJOR COMPONENTS OF THE STEREOLITHOGRAPHY SYSTEM

BLOCK DIAGRAM OF THE STEREOLITHOGRAPHY SYSTEM

THE SLA-I LASER AND OPTICAL SYSTEM

SOFTWARE DIAGRAM OF STEREOLITHOGRAPHY SYSTEM

FIG. 11a.
1. DESIGN SOLID MODEL ON CAD SYSTEM
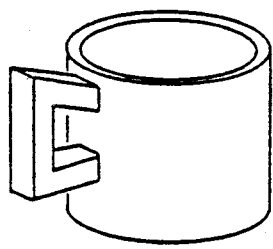

FIG. 11b.
2. PREPARE MODEL FOR STEREOLITHOGRAPHY (ORIENT PART IN CAD SPACE, ADD SUPPORTS)
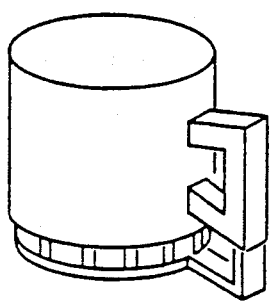

FIG. 11c.
3. SOFTWARE TRANSLATES SOLID MODEL INTO TRIANGLE (PHIGS) FORMAT
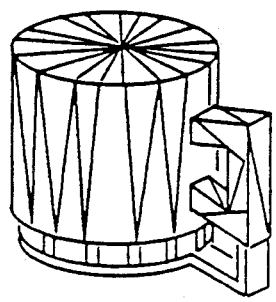

FIG. 11h.
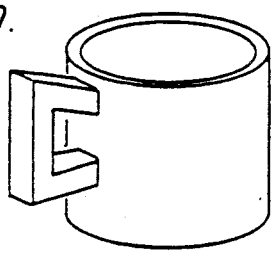
8. POST PROCESSING (DRAIN, UV POST-CURE, AND REMOVE SUPPORTS)

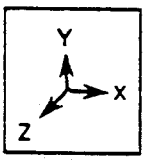

FIG. 11d.
4. TRANSMIT TRIANGLE (PHIGS) FILE TO SLA-1 SLICE COMPUTER
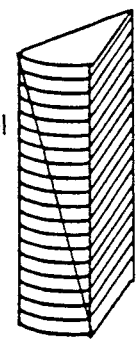

5. SLICE SOFTWARE FILES (TRIANGLE) INTO SELECTED 2 DIMENSIONAL PART CROSS-SECTIONS

5A. MERGE SOFTWARE COMBINES VARIOUS SLICED FILES (SUPPORT FILE, PART FILES, ETC.)

5. OPERATOR EDITS PARAMETER FILE AND LAYER FILE

FIG. 11e.

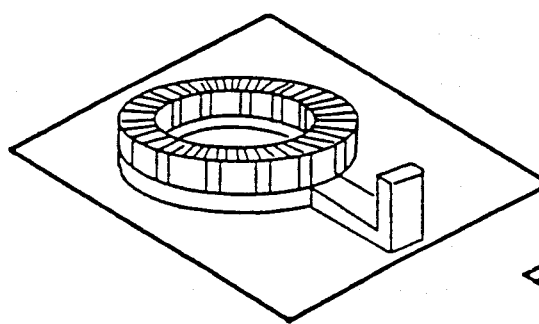

7. FORM OBJECT LAYER BY LAYER (SUPPORTS AND BOTTOM LAYER FIRST) ON ELEVATOR PLATFORM IMMERSED IN PHOTOCURABLE RESIN BY TRACING VECTORS WITH LASER BEAM

6. SOFTWARE USES PARAMETER FILE INFORMATION TO DRIVE LASER BEAM ALONG PROPER VECTORS FOR EACH LAYER

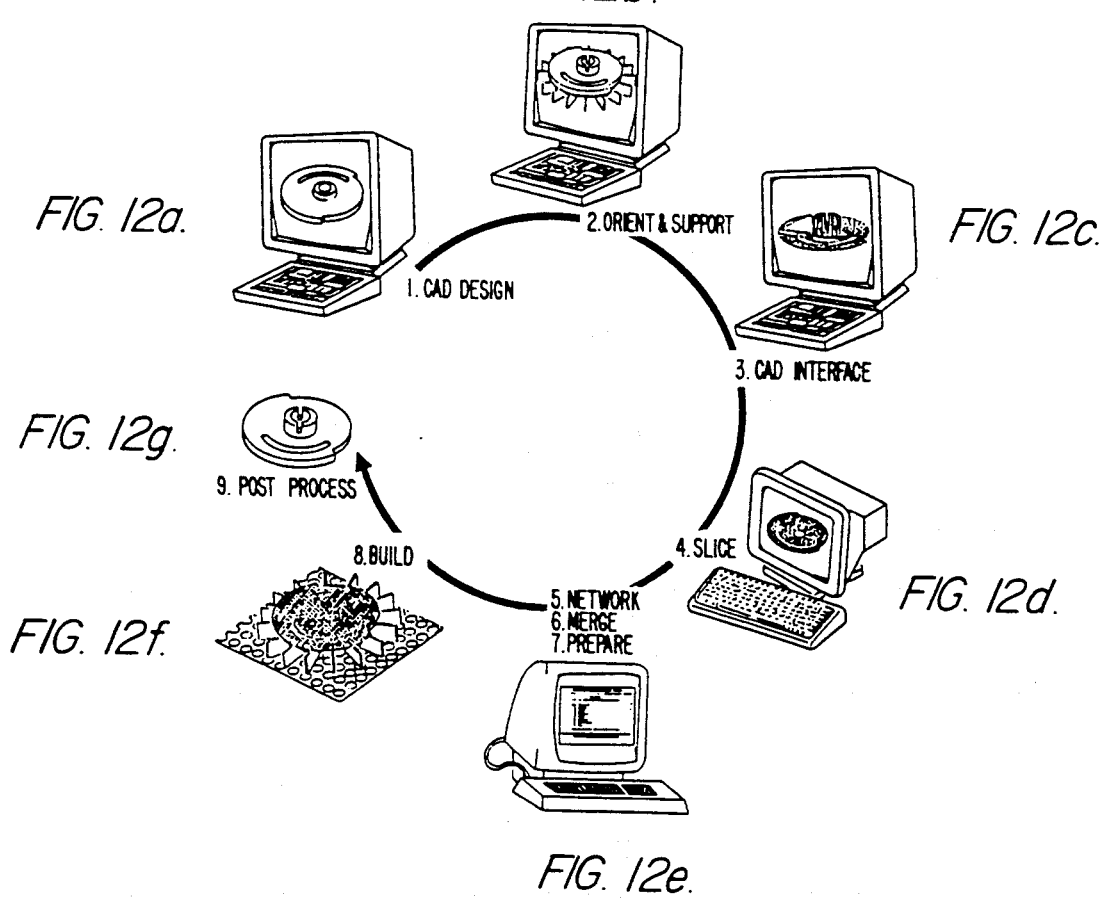

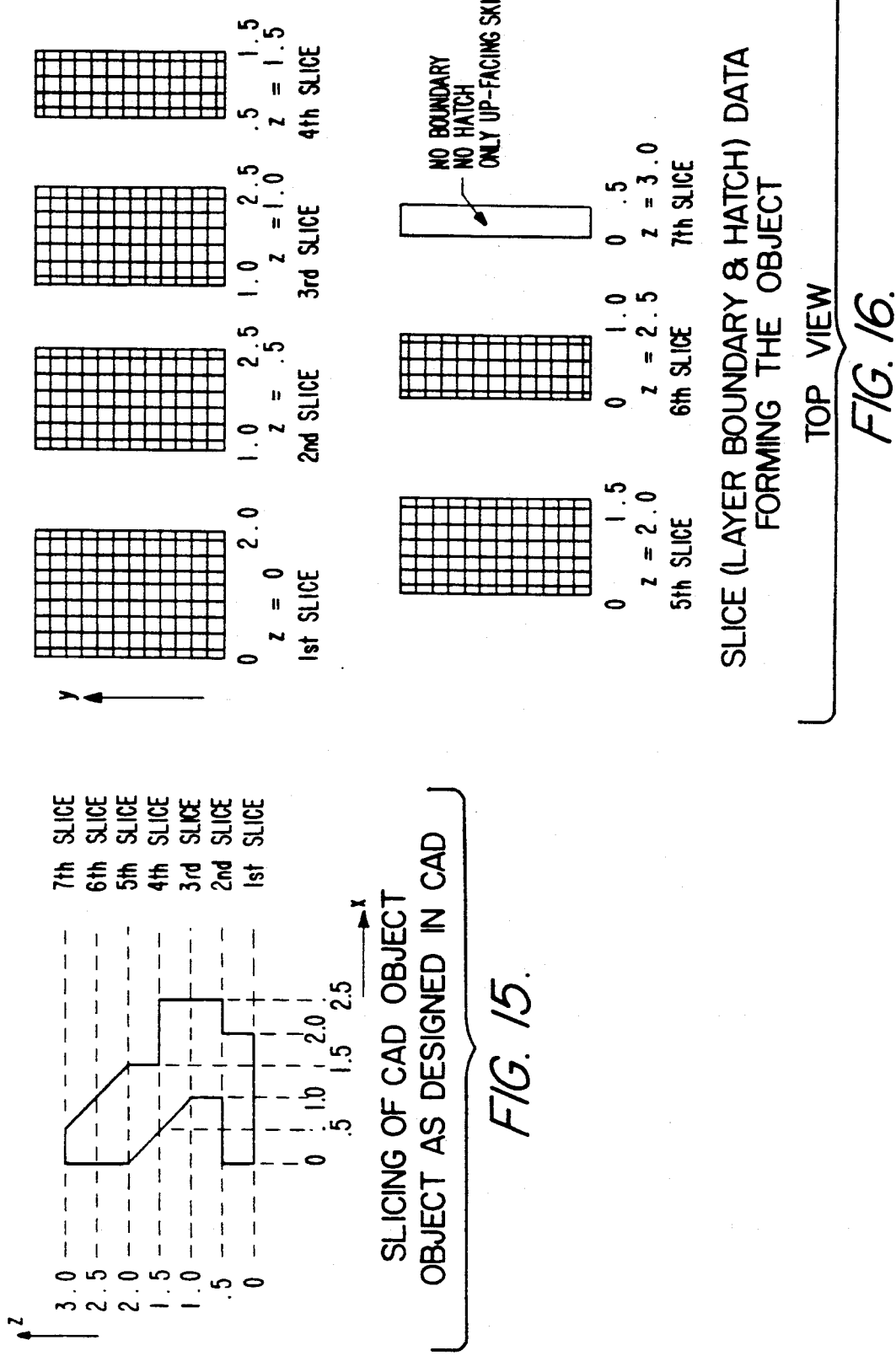

SLICE SKIN DATA SURFACING THE OBJECT STYLE 1

OBJECT AS BUILT USING STYLE 1

SOLID OCTAGON CYLINDER
NO. OF FACETS: 28

HOLLOW CUBE
NO. OF FACETS: 32

SOLID CUBE
NO. OF FACETS: 12

FACETS GENERATED BY CAD IN GRIDDED SPACE

ROUNDING OF FACETS
— SCALE 1
* NOTICE NO. OF FACETS

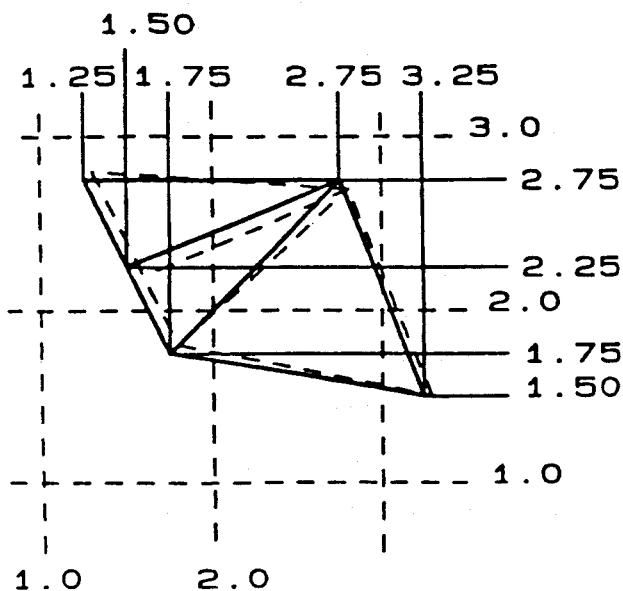
ROUNDING OF FACETS
— SCALE 4
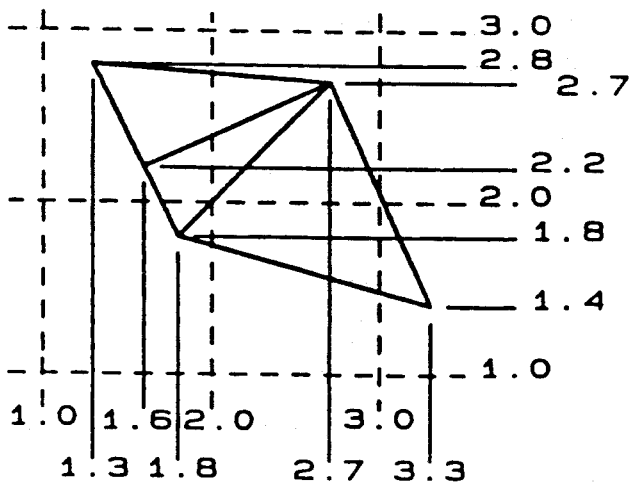
ROUNDING OF FACETS
— SCALE 10
FIG. 20b.
continued

FACET CONFIGURATION THAT CAN LEAD TO OVERLAPPING OF FACETS

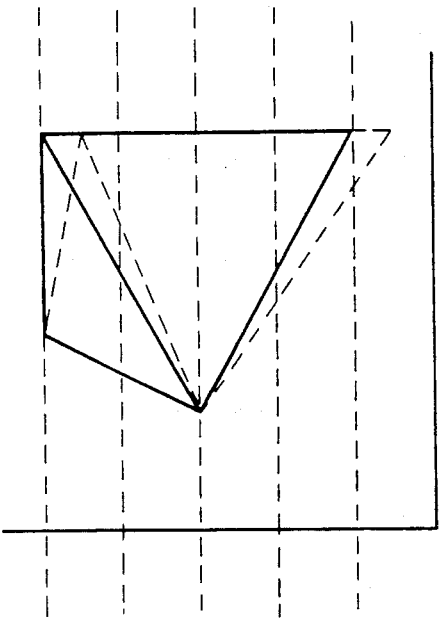
FIG. 2Ib. SAME FACETS AFTER ROUNDING OF FACETS IN THE VERTICAL TO SLICING LAYERS—20 MIL LAYER THICK
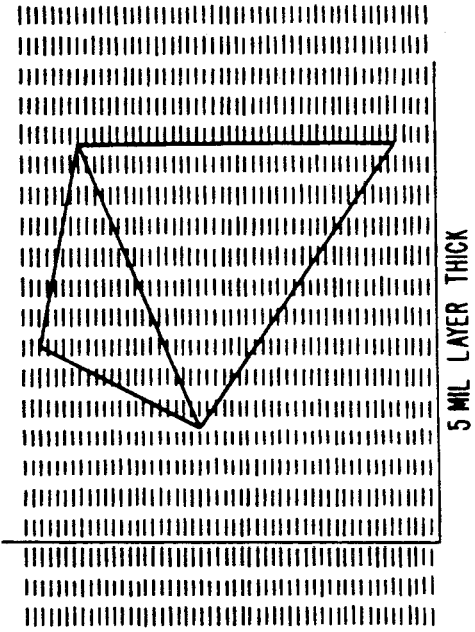
FIG. 2Ic. 5 MIL LAYER THICK
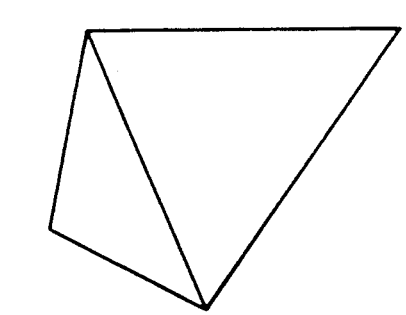
FIG. 2Ia. CAD GENERATED FACETS AFTER ROUNDING OF FACETS BASED ON SCALE FACTOR

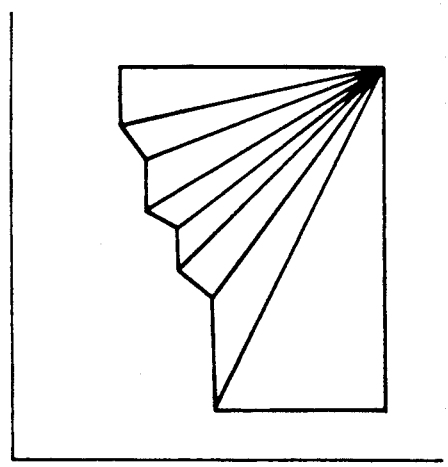
FIG. 22a.
FACETED CAD DESIGN OBJECT
SAME OBJECT SLICED AT 20 mil THICK LAYERS
FIG. 22b.
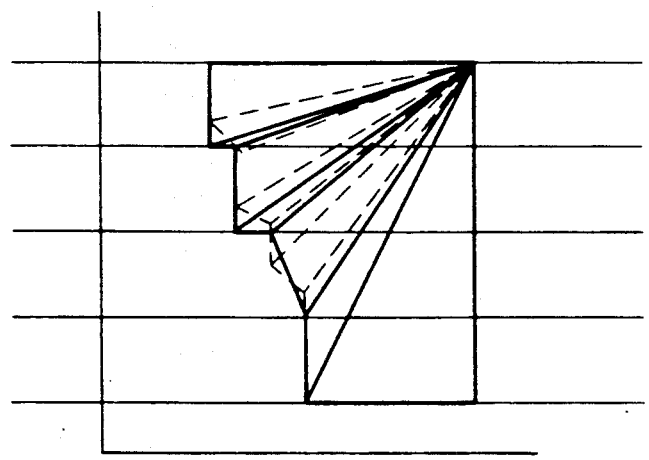
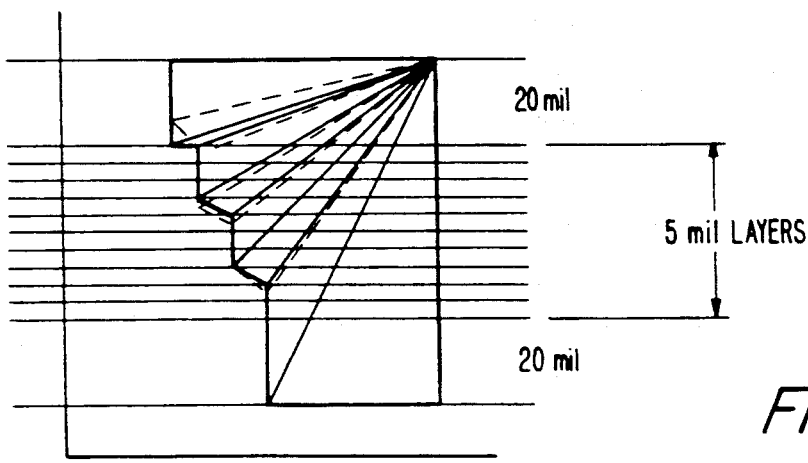
FIG. 22c.
VARIABLE LAYER THICKNESS OF 5 mil AND 20 mil

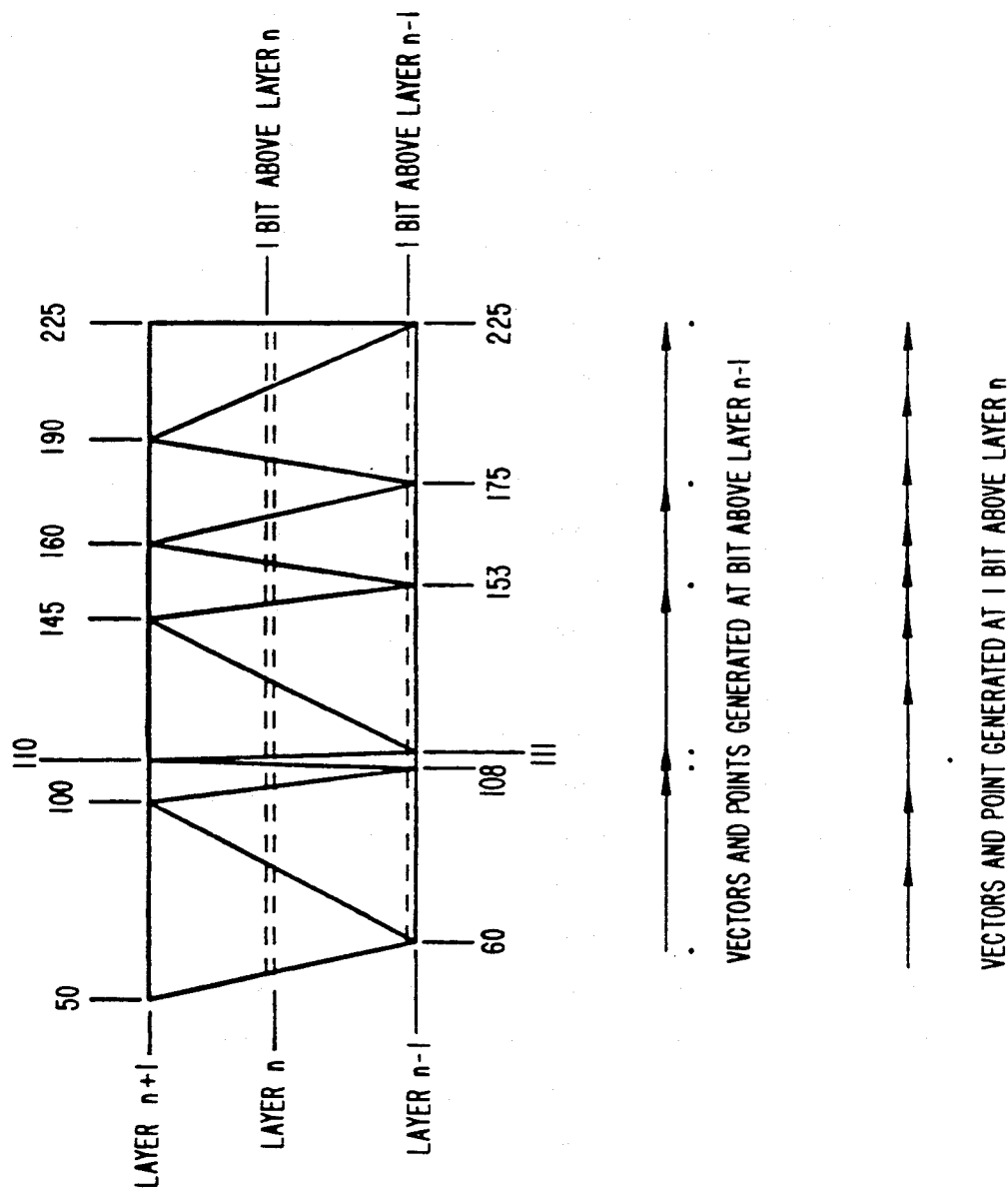

VIEW OF A CAD DESIGNED OBJECT WITH INTERNAL FEATURES (WINDOWS) AFTER ROUNDING HAS OCCURRED

VIEW OF THE SAME OBJECT AFTER BEING BUILT FROM OBTAINING BOUNDARY VECTORS AT THE SLICING LAYER

VIEW OF THE SAME OBJECT AFTER BEING BUILT FROM OBTAINING BOUNDARY VECTORS AT 1 BIT ABOVE THE SLICING LAYER

HATCH PATHS ARE ORIENTED IN SCALED CAD SPACE REGARDLESS OF PART ORIENTATION. THE PART ORIENTATION ONLY TRIGGERS THE NEED TO MAKE A DECISION AS TO WHETHER TO TURN HATCH ON OR OFF.

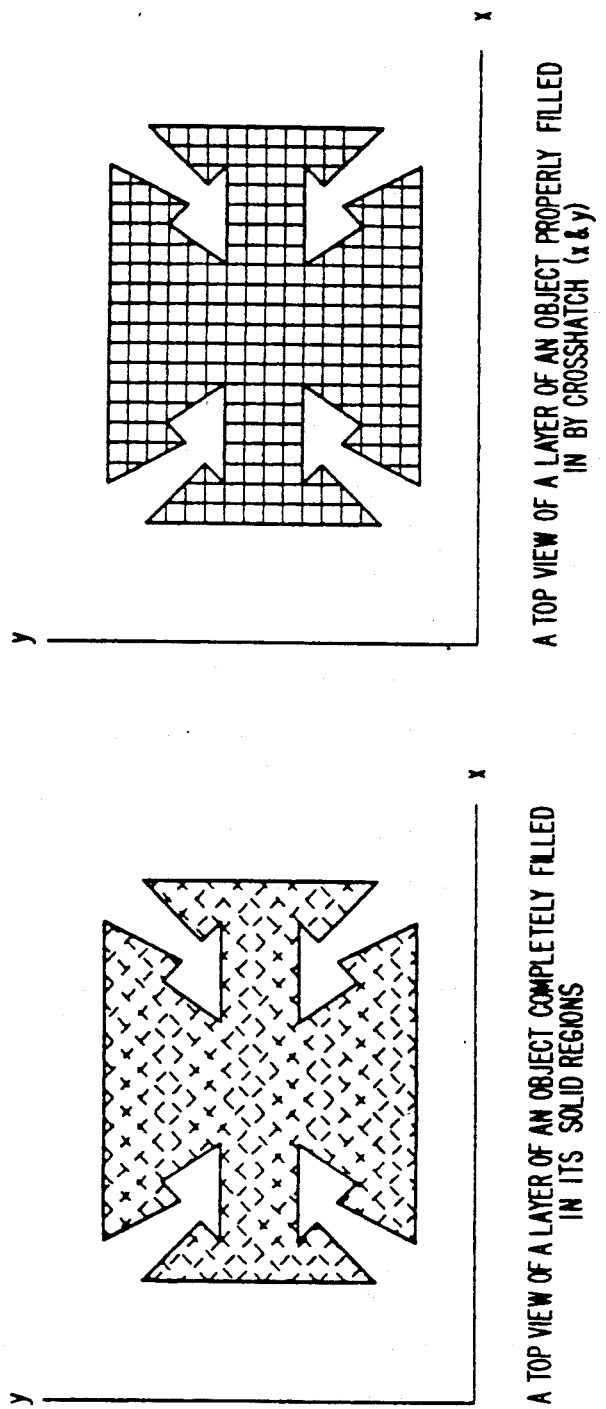
FIG. 24e. A TOP VIEW OF A LAYER OF AN OBJECT PROPERLY FILLED IN BY CROSSHATCH (x & y)
FIG. 24d. A TOP VIEW OF A LAYER OF AN OBJECT COMPLETELY FILLED IN ITS SOLID REGIONS TOP VIEW OF LAYER BOUNDARY ALONG WITH HATCH VECTORS GENERATED BY THE FIRST ALGORITHM (X AND Y)

TOP VIEW OF LAYER BOUNDARY ALONG WITH HATCH VECTORS GENERATED BY THE SECOND ALGORITHM (X AND Y)

A TOP VIEW OF A LAYER OF BOUNDARY VECTORS ALONG WITH HATCH VECTORS GENERATED BY THE PROPOSED ALGORITHM (x & y)

X AND Y CROSSHATCH USING MIA=0

X AND Y CROSSHATCH USING MIA=45°

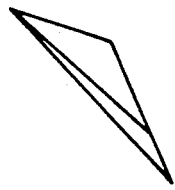
VIEW BEFORE FLIPPING
(SINGLE SURFACE)
FIG. 25h.
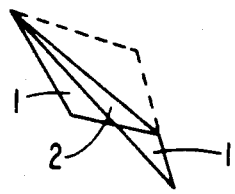
VIEW AFTER FLIPPING AND FORMATION
OF DOUBLE / SINGLE SURFACE
FIG. 25h'.
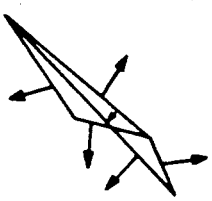
VIEW WITH SEGMENT NORMALS
FIG. 25h".
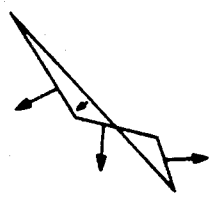
VIEW AFTER CANCELLATION
OF DUPLICATE PAIRS
FIG. 25h'".
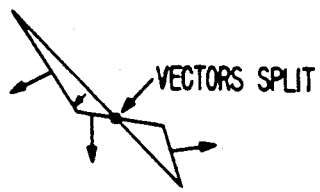
AFTER SPLITTING OF VECTORS
FIG. 25h"".
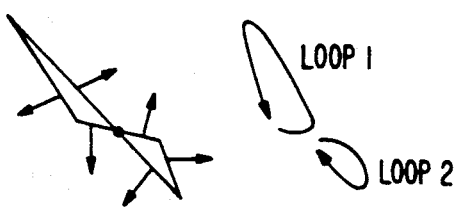
AFTER LOOP DETERMINATION AND
RECALCULATION OF NORMALS
FIG. 25h""'.

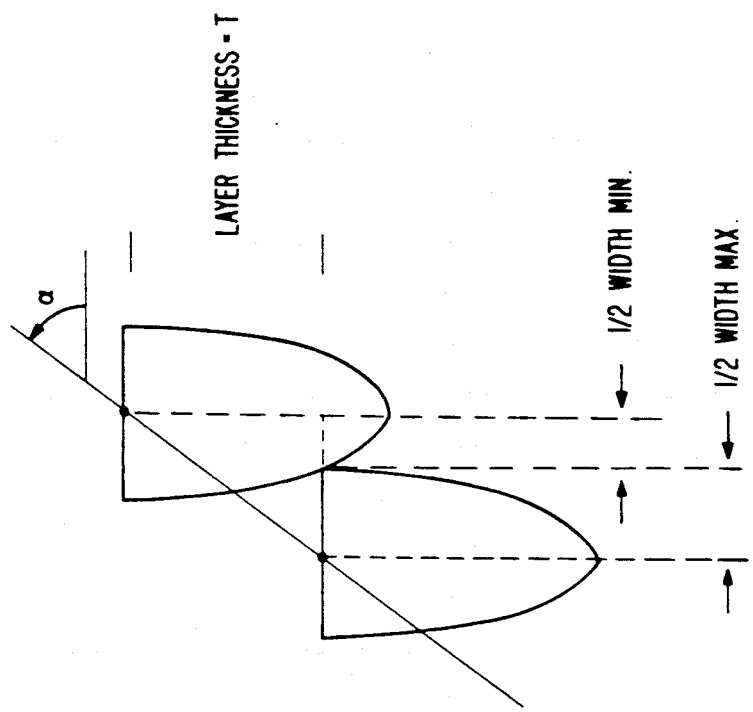

NEAR FLAT TRIANGLE BOUNDARY FOR A CROSS SECTION OF A 4 SIDED PYRAMID

SAME CROSS SECTION AFTER REMOVAL OF PAIRS OF DUPLICATE BOUNDARY VECTORS

X HATCH VECTORS (WITHOUT DIRECTIONS) SHOWING VECTOR NUMBERS FROM INDIVIDUAL HATCH PATHS

X HATCH VECTORS SHOWING DRAWING ORDER

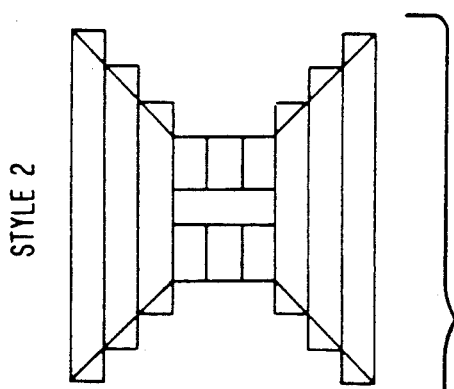
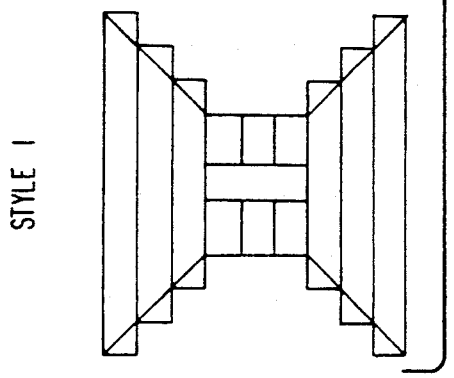
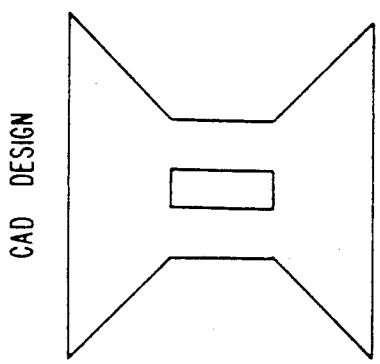
FIG. 28a.
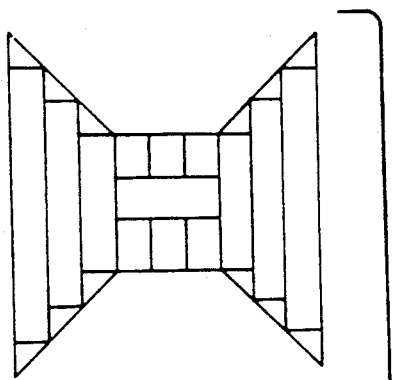
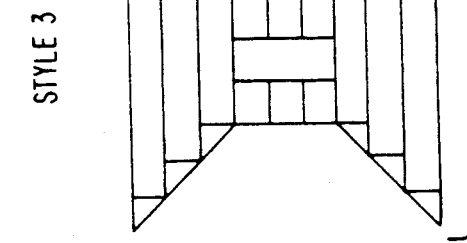
FIG. 28b.
FIG. 28c.

LAYERS AND PLANES 1 BIT UP (FOR CREATING BOUNDARY VECTORS)

FORMATION OF SOLID MATERIAL FROM CURING LAYER BOUNDARY VECTORS

SUPERPOSITION OF LAYER BOUNDARIES AND NEAR-FLAT BOUNDARIES
AFTER CURING

SUPERPOSITION OF LAYER BOUNDARIES & NEAR FLAT BOUNDARIES WITH
SKINS (DOWN-FACING SKINS DRAWN AT THE BOTTOM OF THEIR LAYERS

LAYERS & PLANES 1 BIT DOWN (FOR CREATION OF BOUNDARY VECTORS)

LAYER BOUNDARIES

FORMATION OF SOLID AFTER CURING NEAR FLAT BOUNDARIES

R—INDICATES OVERLAP WITH BOUNDARY AND HATCH

SUPERPOSITION OF LAYER BOUNDARIES AND NEAR FLAT BOUNDARIES AFTER CURING

SUPERPOSITION OF LAYER BOUNDARIES, NEAR FLAT BOUNDARIES AND
SKINS (DOWN FACING SKINS DRAWN AT THE BOTTOM OF THEIR LAYERS)

LAYER BOUNDARY (N) = LB(N)(SI) - LB(N)(SI) ∩ NFUB(N)(SI)

(LAYER BOUNDARIES REMAIN ON THE SAME LAYER FOR BUILDING AS FOR CREATING)
LAYER BOUNDARIES AFTER BEING GIVEN A FULL LAYER CURE

NEAR FLAT BOUNDARIES (DOWN-FACING)

NEAR FLAT BOUNDARIES (DOWN-FACING) AFTER BEING MOVED TO THE LAYERS ON WHICH THEY ARE TO BE BUILT (SINCE THEY ARE CREATED FROM AN INTERSECTION WITH LAYER BOUNDARIES THEY ADD NOTHING NEW TO X Y DIMENSIONS OF THE LAYERS)

NEAR FLAT BOUNDARIES (UP-FACING)

NEAR FLAT BOUNDARIES AFTER BEING MOVED TO THE LAYER
THAT THEY WILL BE BUILT ON (UP-FACING)

FLAT BOUNDARIES (DOWN-FACING) (BUILT ON SAME LAYER FOUND ON)

SUPERPOSITION OF LAYER BOUNDARIES, NEAR FLAT BOUNDARIES, AND SKINS
(DOWN-FACING SKINS DRAWN AT THE BOTTOM OF THEIR LAYERS)

BOUNDARY VECTORS

BOUNDARY VECTORS AFTER BEING GIVEN FULL LAYER CURE

NEAR-FLAT DOWN-FACING BOUNDARIES

NEAR-FLAT DOWN-FACING BOUNDARIES AFTER BEING MOVED TO THE LAYER
THEY WILL BE BUILT ON

NEAR-FLAT UP-FACING BOUNDARIES (NOT MOVED TO NEW LAYERS WHEN BUILT)

FLAT-UP FACING BOUNDARIES (STAY ON SAME LAYER WHEN BUILT)

FLAT-DOWN FACING BOUNDARIES

FLAT-DOWN FACING BOUNDARIES AFTER BEING MOVED TO THE LAYERS ON WHICH THEY WILL BE BUILT

SUPERPOSITION OF LAYER BOUNDARIES, NEAR FLAT BOUNDARIES AND SKIN AFTER ALL HAVE BEEN MOVED TO THE LAYERS ON WHICH THEY WILL BE BUILT AND LAYERS ARE GIVEN APPROPRIATE CURE DEPTHS. DOWN FACING SKINS DRAWN THE BOTTOMS OF THEIR LAYERS.

FIG. 31t.
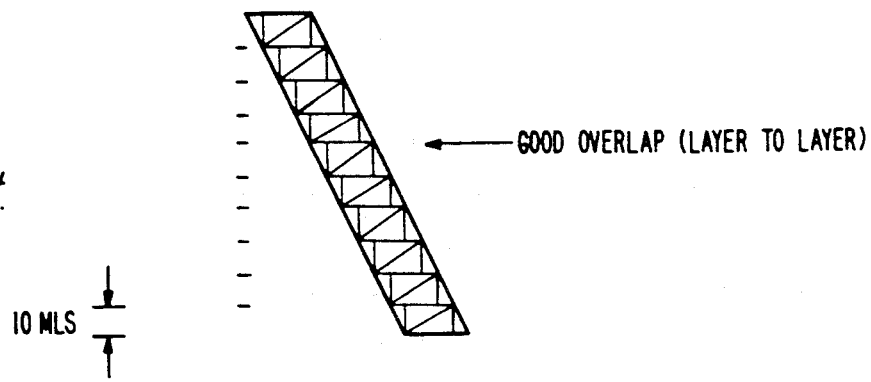
FIG. 31t'.
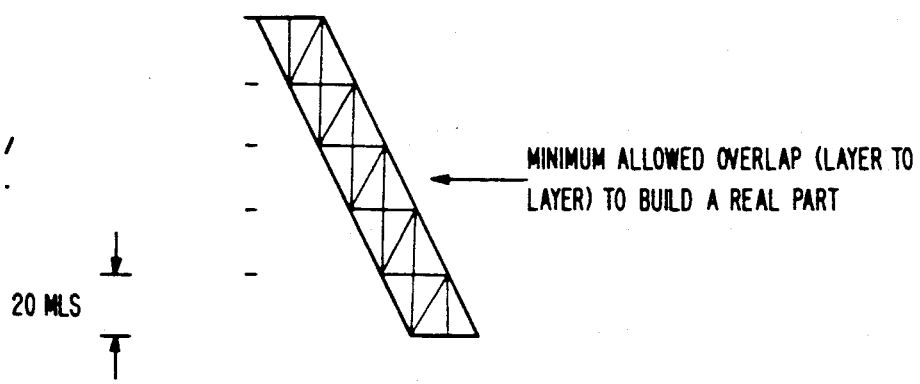
FIG. 31t".
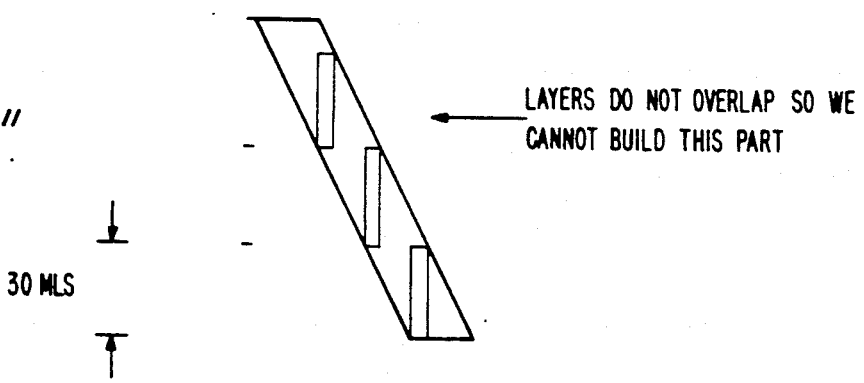
FIG. 31t'''.
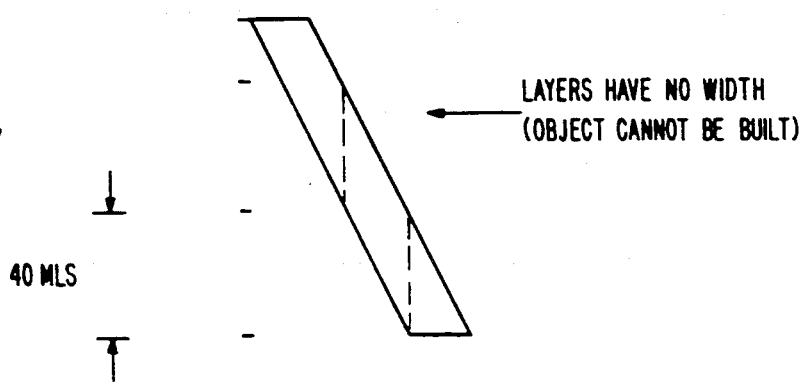

OBJECT CANNOT BE BUILT WITH THIS LAYER SPACING BECAUSE OF GAPS BETWEEN LAYERS.

OBJECT CAN BE BUILT WITH THIS LAYER SPACING BECAUSE THE GAPS HAVE BEEN FILLED.

DESIRED BOUNDARIES

BOUNDARIES AFTER CURING WITHOUT CURE COMPENSATION

VECTORS BEFORE COMPENSATION

VECTORS AFTER COMPENSATION WITHOUT GUARDING AGAINST CROSSOVERS.

VECTORS AFTER COMPENSATION WITH GUARDING AGAINST CROSSOVER.

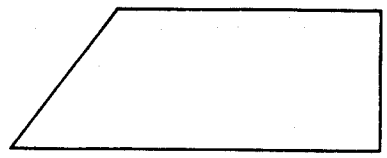
FIG. 34e.   BOUNDARY OUTLINE (TOP VIEW)
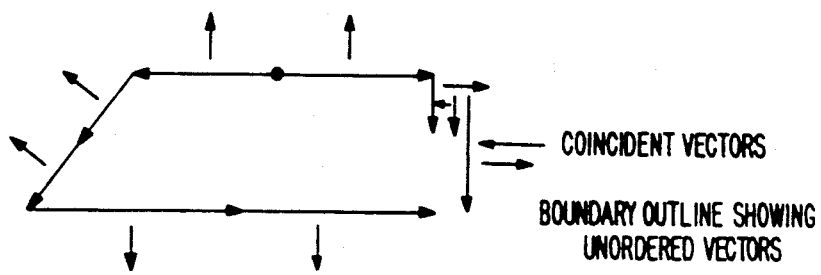
FIG. 34f.   COINCIDENT VECTORS
BOUNDARY OUTLINE SHOWING UNORDERED VECTORS
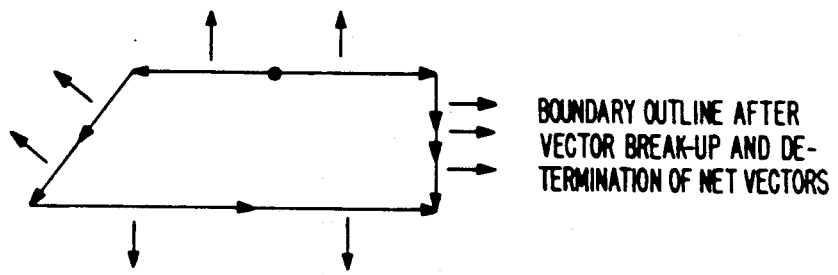
FIG. 34g.   BOUNDARY OUTLINE AFTER VECTOR BREAK-UP AND DETERMINATION OF NET VECTORS
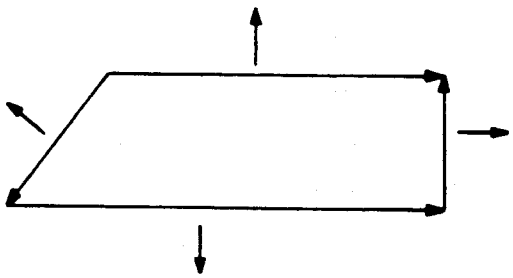
FIG. 34h.   BOUNDARY OUTLINE AFTER MAXIMIZED VECTOR LENGTH

BOUNDARY OUTLINE AFTER ORDERING OF VECTORS.

BOUNDARY OUTLINE AFTER OFFSETTING OF VECTORS.

BOUNDARY AFTER RECALCULATION OF INTERSECTION POINTS.

BEFORE OFFSET    AFTER OFFSET — CHANGE DIRECTIONS

AFTER RECALCULATION OF INTERSECTIONS AND REMOVAL OF VECTORS THAT CHANGED DIRECTIONS.

```
   ∇R←CURE A;C;DV;F;N;P;UDV
[1]
[2]  ⍝ APPLY CURE COMPENSATION TO VERTICES OF A POLYGON
[3]  ⍝ PROPRIETARY INFORMATION OF 3D SYSTEMS INC.
[4]  ⍝ AUTHOR: DAVE REMBA   FEB. 1988
[5]
[6]  ⍝ A      INPUT POLYGON MATRIX, ROWS ARE VERTICES, COLS ARE X Y COORS.
[7]  ⍝ R      OUTPUT POLYGON MATRIX AFTER CURE COMPENSATION
[8]
[9]  ⍝ INTERNAL VARIABLES:
[10] ⍝ P      PREVIOUS VECTOR TO EACH VERTEX
[11] ⍝ N      NEXT VECTOR FROM EACH VERTEX
[12] ⍝ UDV    UNIT DISPLACEMENT VECTOR FOR EACH VECTOR
[13]
[14] ⍝ FUNCTIONS CALLED:
[15] ⍝
[16] ⍝ A DOT B              RETURNS THE DOT PRODUCT OF VECTORS A AND B
[17] ⍝ SQRT (A)             RETURNS THE SQUARE ROOT OF A
[18] ⍝ UNIT (A)             RETURNS VECTOR A NORMALIZED (WITH UNIT LENGTH)
[19] ⍝ A CP B               RETURNS THE CROSS PRODUCT OF 2D VECTORS A AND B
[20]
[21] ⍝ DELETE COINCIDENT POINTS
[22]
[23]   P←(¯1⊖A) ⍝       ROTATE POINTS FORWARD 1 VERTEX
[24]   A←(∨/A≠P)⌿A ⍝    REMOVE POINTS EQUAL TO NEXT POINT
[25]
[26] ⍝ PREPARATION: COMPUTE P AND N
[27]
[28]   P←(¯1⊖A) ⍝       ROTATE POINTS FORWARD 1 VERTEX
[29]   N←(1⊖A) ⍝        ROTATE POINTS BACKWARD 1 VERTEX
[30]   P←P-A ⍝          CONVERT TO VECTOR
[31]   N←N-A ⍝          CONVERT TO VECTOR
[32]   P←UNIT(P) ⍝      NORMALIZE PREVIOUS VECTORS (SAVE FOR DOT)
[33]   N←UNIT(N) ⍝      NORMALIZE NEXT VECTORS (SAVE FOR DOT)
[34]
[35] ⍝ COMPUTE DISPLACEMENT VECTOR
[36]
[37]   DV←P+N ⍝         ADD PREVIOUS VECTORS TO NEXT VECTORS
[38]
[39] ⍝ DELETE NULL DISPLACEMENT VECTORS AND ASSOCIATED DATA
[40]
[41]   F←0≠NORM DV ⍝    SET DISPLACEMENT FLAG TRUE IF VECTOR IS >0
[42]   DV←F⌿DV ⍝        DELETE ZERO VECTORS
[43]   P←F⌿P ⍝          DELETE PREVIOUS POINTS
[44]   N←F⌿N ⍝          DELETE NEXT POINTS
[45]   A←F⌿A ⍝          DELETE POLYGON POINTS
[46]
[47] ⍝ NORMALIZE THE DISPLACEMENT VECTOR
[48]
[49]   UDV←UNIT(DV)
[50]
[51] ⍝ COMPUTE INSIDE OR OUTSIDE BY CROSS PRODUCT METHOD
[52]
[53]   F←×N CP P ⍝      TAKE THE SIGN ONLY AS 1 OR -1 (× GIVES ONLY SIGN)
```

FIG. 35a.

[54]
[55] ⋔ COMPUTE COMPENSATION FACTOR (VECTOR SCALING FACTOR)
[56]
[57] C←FxBEAMRADIUS+SQRT(0.5x1-P DOT N) ⋔ % IS DIVIDE
[58]
[59] ⋔ SCALE UDVs BY MULTIPLYING X AND Y COMPONENTS BY COMPENSATION FACTOR
[60]
[61] C←C,[1.5]C ⋔   DUPLICATE SCALE FACTOR FOR X AND Y COMPONENTS OF UDVs

*FIG. 35a. continued*

```
[62] DV←UDVxC ⍝   SCALE UDVs
[63]
[64] ⍝ APPLY DISPLACEMENT VECTORS TO POLYGON VERTICES
[65]
[66] R←A+DV
[67]
[68] ⍝ END
[69]
    ▽

▽ R←UNIT A;B
[1] ⍝ NORMALIZE ROW VECTORS IN MATRIX A TO UNIT MAGNITUDE
[2]   B←NORM A
[3]   ±(0∊B)/'⎕SOUND 10 2⊖50 2000 100  ◊  ⎕ERROR "UNIT ZERO!"◊R←♦ ◊→'
[4]
[5]   R←A÷B,[1.5]B
[6]
    ▽

▽ R←A CP B
[1] ⍝ CROSS PRODUCT (FOR 2D VECTORS IN XY PLANE)
[2]
[3] ⍝ A      MATRIX OF ROW VECTORS
[4] ⍝ B      MATRIX OF ROW VECTORS
[5]
[6]   R←(A[;1]xB[;2])-A[;2]xB[;1]
[7]
    ▽
```

*FIG. 35b.*

```
    ▽ R←A DOT B
[1] ⍝ CALCULATE THE DOT PRODUCT BETWEEN VECTORS A AND B
[2]
[3] ⍝ x1 x2 + y1 y2
[4]   R←(A[;1]xB[;1])+A[;2]xB[;2]
[5]
[6] ⍝   |V1|      |V2|
[7]   A←(NORM A)xNORM B ⍝  GENERAL FORM
[8]
[9] ⍝ HANDLE 0 CASE
[10]  ±(0∊A)/'R←0 ◊ ⎕SOUND 440 100 ◊ ⎕ERROR "DOT ZERO!" ◊ →0'
[11]
[12]  R←R÷A
    ▽

▽ R←NORM A
[1] ⍝ CALCULATE THE NORM OF A VECTOR
[2]
[3] ⍝ ||v||=SQUARE-ROOT OF THE SUM OF SQUARES OF COMPONENTS
[4]
[5]   R←(+/A*2)*0.5
[6]
    ▽
```

4 INSIDE ANGLE CASE

5 COLLINEAR VERTEX CASE

6 COINCIDENT POINT CASE

7 INVASIVE ANGLE CASE

8 COMPLEX POLYGON CASE

9 WALLS

10 ADJOINIG OUTER PERIMETERS

10 CURED OUTER PERIMETERS

CURE COMPENSATION

MATHEMATICAL DERIVATION:

GIVEN TWO VECTORS, $\vec{p}$ AND $\vec{n}$, SHARING ORIGIN POINT O, OBTAIN A VECTOR $\vec{r}$ WHICH DISPLACES POINT O TO O', i.e. $O' = \vec{r} + O$.

THIS PROCEDURE IS APPLIED TO EACH VERTEX OF A POLYGONAL BOUNDARY. HERE WE SHALL DERIVE AN EXPRESSION TO CALCULATE $\vec{r}$ IN TERMS OF $\vec{p}$ AND $\vec{n}$.

VECTOR $\vec{p} = P - O$ WHERE P IS THE PREVIOUS VERTEX.

VECTOR $\vec{n} = N - O$ WHERE N IS THE NEXT VERTEX.

VECTORS ARE NORMALIZED:

$$\vec{p} = \frac{\vec{p}}{\|\vec{p}\|} \quad \vec{n} = \frac{\vec{n}}{\|\vec{n}\|}$$

DELETE ANY VECTORS $\vec{p} = 0$ AND $\vec{n} = 0$

COMPUTE THE DISPLACEMENT VECTOR $\vec{d} = \vec{p} + \vec{n}$

NORMALIZE THE DISPLACEMENT VECTOR $\vec{d} = \dfrac{\vec{d}}{\|\vec{d}\|}$

*FIG. 37a.*

CURE COMPENSATION

DETERMINE WHETHER ANGLE $\alpha$ BETWEEN $\vec{p}$ AND $\vec{n}$ IS GREATER THAN 180°.

$$\frac{f \cdot \vec{p} \otimes \vec{n}}{\|\vec{p}\|\|\vec{n}\|} = \sin \alpha \qquad \text{CROSS PRODUCT}$$

$f = 1$ IF $f > 0$ $\qquad$ $f' = -1$ IF $f < 0$ $c = f' \times \dfrac{b}{j}$ WHERE b IS THE LASER BEAM RADIUS AND j IS A COMPENSATION FACTOR.

DERIVATION OF j :

$$\cos \alpha = \frac{\vec{p} \cdot \vec{n}}{\|\vec{p}\|\|\vec{n}\|} \qquad \text{DOT PRODUCT}$$

$$j = \sin \frac{\alpha}{2} = \pm \sqrt{\frac{1 - \cos \alpha}{2}} \qquad \text{HALF ANGLE FORMULA}$$

SCALE THE NORMALIZED DISPLACEMENT VECTOR : $\vec{r} = c\vec{d}$

*FIG. 37b.*

CURE COMPENSATION COMPUTATIONS

CROSS PRODUCT: $\vec{A} \times \vec{B} = (a2*b3 - a3*b2)i + (a3*b1 - a1*b3)j + (a1*b2 - a2*b1)k$ DOT PRODUCT: $\vec{A} \cdot \vec{B} = a_1 b_1 + a_2 b_2 + a_3 b_3$

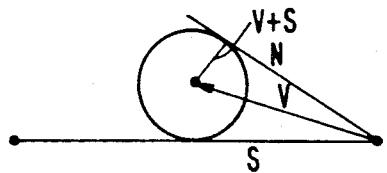

1. REMOVE POINT SEGS. (ALREADY DONE)
2. COMBINE "STRAIGHT" VECTORS (NOT NECESSARY BUT $\vec{S} \times \vec{N} = 0$ IF STRAIGHT)

> LET $\vec{S}$ = CURRENT SEGMENT AS VECTOR (DISPLACE TO ORIG.) NORMALIZED
> LET $\vec{N}$ = NEXT SEGMENT AS VECTOR " " " NORMALIZED
> LET $\vec{V}$ = DISPLACEMENT VECTOR
> LET $\vec{UV}$ = UNIT DISPLACEMENT VECTOR 3. $\vec{UV} = -\left(\dfrac{\vec{S}+\vec{N}}{|\vec{S}+\vec{N}|}\right)$ $|\vec{V}| = \dfrac{\text{BEAM RADIUS}}{\sqrt{\dfrac{1-(\vec{S}\cdot\vec{N})}{2}}} \quad /(|\vec{S}||\vec{N}|) = 1 \qquad \text{IF } \dfrac{\vec{S}\cdot\vec{N}}{|\vec{S}||\vec{N}|} = 1 \text{ THEN } |\vec{V}| \to \infty$ $\boxed{\vec{V} = |\vec{V}|\,\vec{UV}}$    IF $|\vec{V}|$ "TOO BIG" NEED TO DECIDE WHAT TO DO.
(COMPARE $|\vec{S}|$ OR $|\vec{N}|$, SET TO BEAM RADIUS, ETC.

NOTE: BEAM RADIUS IS CAD UNITS x RESOLUTION

*FIG. 37c.*

METHODS AND APPARATUS FOR PRODUCTION OF THREE-DIMENSIONAL OBJECTS BY STEREOLITHOGRAPHY

CROSS-REFERENCE TO RELATED PATENT APPLICATIONS

This application is related by subject matter to each of the following patent applications filed concurrently herewith: Ser. Nos. 182,823; 183,015; 182,801; 183,016; 183,014; and 183,012

All of these cases are assigned to a common assignee, 3D Systems, Inc., 26081 Avenue Hall, Valencia, Calif. 91355 and the entire subject matter of each of these related applications is specifically incorporated by reference, as though attached hereto, in the present application as part of the disclosure of the present application.

BACKGROUND OF THE INVENTION

This invention relates generally to improvements in and apparatus for forming three-dimensional objects from a fluid medium and, more particularly, to a new and improved stereolithography system involving the application of enhanced data manipulation and lithographic techniques to production of three-dimensional objects, whereby such objects can be formed more rapidly, reliably, accurately and economically.

It is common practice in the production of plastic parts and the like to first design such a part and then painstakingly produce a prototype of the part, all involving considerable time, effort and expense. The design is then reviewed and, oftentimes, the laborious process is again and again repeated until the design has been optimized. After design optimization, the next step is production. Most production plastic parts are injection molded. Since the design time and tooling costs are very high, plastic parts are usually only practical in high volume production. While other processes are available for the production of plastic parts, including direct machine work, vacuum-forming and direct forming, such methods are typically only cost effective for short run production, and the parts produced are usually inferior in quality to molded parts.

Very sophisticated techniques have been developed in the past for generating three-dimensional objects within a fluid medium which is selectively cured by beams of radiation brought to selective focus at prescribed intersection points within the three-dimensional volume of the fluid medium. Typical of such three-dimensional systems are those described in U.S. Pat. Nos. 4,041,476; 4,078,229; 4,238,840 and 4,288,861. All of these systems rely upon the buildup of synergistic energization at selected points deep within the fluid volume, to the exclusion of all other points in the fluid volume. Unfortunately, however, such three-dimensional forming systems face a number of problems with regard to resolution and exposure control. The loss of radiation intensity and image forming resolution of the focused spots as the intersections move deeper into the fluid medium create rather obvious complex control situations. Absorption, diffusion, dispersion and diffraction all contribute to the difficulties of working deep within the fluid medium on an economical and reliable basis.

In recent years, "stereolithography" systems, such as those described in U.S. Pat. No. 4,575,330 entitled "Apparatus For Production Of Three-Dimensional Objects By Stereolithography" have come into use. Basically, stereolithography is a method for automatically building complex plastic parts by successively printing cross-sections of photopolymer or the like (such as liquid plastic) on top of each other until all of the thin layers are joined together to form a whole part. With this technology, the parts are literally grown in a vat of liquid plastic. This method of fabrication is extremely powerful for quickly reducing design ideas to physical form and for making prototypes.

Photocurable polymers change from liquid to solid in the presence of light and their photospeed with ultraviolet light (UV) is fast enough to make them practical model building materials. The material that is not polymerized when a part is made is still usable and remains in the vat as successive parts are made. An ultraviolet laser generates a small intense spot of UV. This spot is moved across the liquid surface with a galvanometer mirror X-Y scanner. The scanner is driven by computer generated vectors or the like. Precise complex patterns can be rapidly produced with this technique.

The laser scanner, the photopolymer vat and the elevator, along with a controlling computer, combine together to form a stereolithography apparatus, referred to as on "SLA". An SLA is programmed to automatically make a plastic part by drawing one cross section at a time, and building it up layer by layer.

Stereolithography represents an unprecedented way to quickly make complex or simple parts without tooling. Since this technology depends on using a computer to generate its cross sectional patterns, there is a natural data link to CAD/CAM. However, such systems have encountered difficulties relating to structural stress, shrinkage, curl and other distortions, as well as resolution, speed, accuracy and difficulties in producing certain object shapes.

The following background discussion sets forth some of the history in the development of the system of the present invention, including problems encountered and solutions developed, in the course of providing an enhanced SLA incorporating the features of the invention.

The original stereolithography process approach to building parts was based on building walls that were one line width thick, a line width being the width of plastic formed after a single pass was made with a beam of ultraviolet light. This revealed two primary problems: 1) relatively weak structural strength, along with 2) layer to layer adhesion problems when making the transition from the vertical to the horizontal. This technique was based on building parts using the Basic Programming Language to control the motion of a U.V. laser light beam.

Another approach to solving the transition problem was to build parts with a solid wall thickness based on completely solidifying the material between two surface boundaries. This procedure experienced problems with distortion of parts and with relatively long exposure times required. This procedure provided good structural strength and produced better results in connection with the transition from vertical to horizontal.

Another approach was based on using inner and outer walls as boundaries for a section of an object, as all real objects have, but the area between these boundaries was not to be completely solidified, but rather crisscrossed by a grid structure known as cross-hatching. This technique provides good structural strength and resolved much of the transition problem. It also reduced the exposure time and distortion problem. However it now created a new potential problem in that, what had originally been a solid object, was now an object with walls but missing top and bottom surfaces.

The "hollowness" problem was then approached by filling in all horizontal sections with closely-spaced vectors thereby forming a top and bottom skin. This approach had all the advantages of the previous one, but still had problems of its own. As one made the transition from vertical to horizontal, one would find holes in the part where the boundary lines were offset greater than one line width between layers. The original version of this approach also had skins that did not always fit as well as desired, but this was later solved by rounding the triangle boundaries to slicing layers. This rounding technique also solved another problem which could cause misdirected cross-hatching.

This problem of holes was approached by deciding to create skin fill in the offset region between layers when the triangles forming that portion of a layer had a slope less than a specified amount from the horizontal plane. This is known as near-horizontal or near-flat skin. This technique worked well for completing the creation of solid parts. A version of this technique also completed the work necessary for solving the transition problem. The same version of this technique that solved the transition problem also yielded the best vertical feature accuracy of objects.

There continues to be a long existing need in the design and production arts for the capability of rapidly and reliably moving from the design stage to the prototype stage and to ultimate production, particularly moving directly from the computer designs for such plastic parts to virtually immediate prototypes and the facility for large scale production on an economical and automatic basis.

Accordingly, those concerned with the development and production of three-dimensional plastic objects and the like have long recognized the desirability for further improvement in more rapid, reliable, accurate, economical and automatic means which would facilitate quickly moving from a design stage to the prototype stage and to production. The present invention clearly fulfills all of these needs.

SUMMARY OF THE INVENTION

Briefly, and in general terms, the present invention provides a new and improved stereolithography system for generating a three-dimensional object by forming successive, adjacent, cross-sectional laminae of that object at the face of a fluid medium capable of altering its physical state in response to appropriate synergistic stimulation, information defining the object being specially processed to reduce stress, curl and distortion, and increase resolution, strength, accuracy, speed and economy of reproduction, even for rather difficult object shapes, the successive laminae being automatically integrated as they are formed to define the desired three-dimensional object.

In a presently preferred embodiment, by way of example and not necessarily by way of limitation, the present invention harnesses the principles of computer generated graphics in combination with stereolithography, i.e. the application of lithographic techniques to the production of three-dimensional objects, to simultaneously execute computer aided design (CAD) and computer aided manufacturing (CAM) in producing three-dimensional objects directly from computer instructions. The invention can be applied for the purposes of sculpturing models and prototypes in a design phase of product development, or as a manufacturing system, or even as a pure art form.

"Stereolithography" is a method and apparatus for making solid objects by successively "printing" thin layers of a curable material, e.g., a UV curable material, one on top of the other. A programmed movable spot beam of UV light shining on a surface or layer of UV curable liquid is used to form a solid cross-section of the object at the surface of the liquid. The object is then moved, in a programmed manner, away from the liquid surface by the thickness of one layer, and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

Of course, it will be appreciated that other forms of appropriate synergistic stimulation for a curable fluid medium, such as particle bombardment (electron beams and the like), chemical reactions by spraying materials through a mask or by ink jets, or impinging radiation other than ultraviolet light, may be used in the practice of the invention without departing from the spirit and scope of the invention.

By way of example, in the practice of the present invention, a body of a fluid medium capable of solidification in response to prescribed stimulation is first appropriately contained in any suitable vessel to define a designated working surface of the fluid medium at which successive cross-sectional laminae can be generated. Thereafter, an appropriate form of synergistic stimulation, such as a spot of UV light or the like, is applied as a graphic pattern at the specified working surface of the fluid medium to form thin, solid, individual layers at the surface, each layer representing an adjacent cross-section of the three-dimensional object to be produced. In accordance with the invention, information defining the object is specially processed to reduce curl and distortion, and increase resolution, strength, accuracy, speed and economy of reproduction.

Superposition of successive adjacent layers on each other is automatically accomplished, as they are formed, to integrate the layers and define the desired three-dimensional object In this regard, as the fluid medium cures and solid material forms as a thin lamina at the working surface, a suitable platform to which the first lamina is secured is moved away from the working surface in a programmed manner by any appropriate actuator, typically all under the control of a micro-computer of the like. In this way, the solid material that was initially formed at the working surface is moved away from that surface and new liquid flows into the working surface position. A portion of this new liquid is, in turn, converted to solid material by the programmed UV light spot to define a new lamina, and this new lamina adhesively connects to the material adjacent to it, i.e. the immediately preceding lamina. This process continues until the entire three-dimensional object has been formed. The formed object is then removed from the container and the apparatus is ready to produce another object, either identical to the first object or an entirely new object generated by a computer or the like.

The data base of a CAD system can take several forms. One form consists of representing the surface of an object as a mesh of polygons, typically triangles. These triangles completely form the inner and outer surfaces of the object. This CAD representation also includes a unit length normal vector for each triangle. The normal points away from the solid which the triangle is bounding and indicates slope. This invention provides a means of processing CAD data, which may be provided as "PHIGS" or the like, into layer-by-layer vector data that can be used for forming models through stereolithography. Such information may ultimately be converted to raster scan output data or the like, without in any way departing from the spirit and scope of the invention.

For stereolithography to successfully work, there must be good adhesion from one cross-sectional layer to the next. Hence, plastic from one layer must overlay plastic that was formed when the previous layer was built. In building models that are made of vertical segments, plastic that is formed on one layer will fall exactly on previously formed plastic from the preceding layer and, therefore, good adhesion is achieved. As one starts to make a transition from vertical to horizontal features using finite jumps in layer thickness, a point is eventually reached where the plastic formed on one layer does not make contact with the plastic formed on the previous layer, and this can result in severe adhesion problems. Horizontal surfaces themselves do not present adhesion problems since, by being horizontal, the whole section is built on one layer with side-to-side adhesion maintaining structural integrity. This invention provides a general means of insuring adequate adhesion between layers when making transitions from vertical to horizontal or horizontal to vertical sections, as well as providing a means for completely bounding a surface and reducing stress and strain in formed objects.

As previously indicated, stereolithography is a three-dimensional printing process which uses a moving laser beam to build parts by solidifying successive layers of liquid plastic. This method enables a designer to create a design on a CAD system and build an accurate plastic model in a few hours. By way of example and not necessarily by way of limitation, a stereolithographic process in accordance with the invention may include the following steps.

First, the solid model is designed in the normal way on the CAD system, without specific reference to the stereolithographic process.

Model preparation for stereolithography involves selecting the optimum orientation, adding supports, and selecting the operating parameters of the stereolithography system. The optimum orientation will (1) enable the object to drain, (2) have the least number of unsupported surfaces, (3) optimize important surfaces, and (4) enable the object to fit in the resin vat. Supports must be added to secure unattached sections and for other purposes, and a CAD library of supports can be prepared for this purpose. The stereolithography operating parameters include selection of the model scale and layer (slice) thickness.

The surface of the solid model is then divided into triangles, typically "PHIGS". A triangle is the least complex polygon for vector calculations. The more triangles formed, the better the surface resolution and hence, the more accurate the formed object with respect to the CAD design.

Data points representing the triangle coordinates and normals thereto are then transmitted typically as PHIGS, to the stereolithographic system via appropriate network communication such as ETHERNET. The software of the stereolithographic system then slices the triangular sections horizontally (X-Y plane) at the selected layer thickness.

The stereolithographic unit (SLA) next calculates the section boundary, hatch, and horizontal surface (skin) vectors. Hatch vectors consist of cross-hatching between the boundary vectors. Several "styles" or slicing formats are available. Skin vectors, which are traced at high speed and with a large overlap, form the outside horizontal surfaces of the object. Interior horizontal areas, those within top and bottom skins, are not filled in other than by cross-hatch vectors.

The SLA then forms the object one horizontal layer at a time by moving the ultraviolet beam of a helium-cadmium laser or the like across the surface of a photocurable resin and solidifying the liquid where it strikes. Absorption in the resin prevents the laser light from penetrating deeply and allows a thin layer to be formed. Each layer is comprised of vectors which are typically drawn in the following order: border, hatch, and surface.

The first layer that is drawn by the SLA adheres to a horizontal platform located just below the liquid surface. This platform is attached to an elevator which then lowers the platform under computer control. After drawing a layer, the platform dips a short distance, such as several millimeters into the liquid to coat the previously cured layer with fresh liquid, then rises up a smaller distance leaving a thin film of liquid from which the second layer will be formed. After a pause to allow the liquid surface to flatten out, the next layer is drawn. Since the resin has adhesive properties, the second layer becomes firmly attached to the first. This process is repeated until all the layers have been drawn and the entire three-dimensional object is formed. Normally, the bottom 0.25 inch or so of the object is a support structure on which the desired part is built. Resin that has not been exposed to light remains in the vat to be used for the next part. There is very little waste of material.

Post processing typically involves draining the formed object to remove excess resin, ultraviolet or heat curing to complete polymerization, and removing supports. Additional processing, including sanding and assembly into working models, may also be performed.

The new and improved stereolithographic system of the present invention has many advantages over currently used apparatus for producing plastic objects. The methods and apparatus of the present invention avoid the need of producing design layouts and drawings, and of producing tooling drawings and tooling. The designer can work directly with the computer and a stereolithographic device, and when he is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method of the invention becomes even more useful because all of the part designs can be quickly changed and made again so that the total assembly can be made and examined, repeatedly if necessary. Moreover, the data manipulation techniques of the present invention enable production of objects with reduced stress, curl and distortion, and increased resolution, strength, accuracy, speed and economy of production, even for difficult and complex object shapes.

After the design is complete, part production can begin immediately, so that the weeks and months between design and production are avoided. Stereolithography is particularly useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

Hence, the new and improved stereolithographic methods and apparatus of the present invention satisfy a long existing need for an improved CAD and CAM system capable of rapidly, reliably, accurately and economically designing and fabricating three-dimensional parts and the like.

The above and other objects and advantages of this invention will be apparent from the following more detailed description when taken in conjunction with the accompanying drawings of illustrative embodiments.

BRIEF DESCRIPTION OF THE DRAWINGS

FIGS. 2 and 3 are flow charts illustrating the basic concepts employed in practicing the method of stereolithography of the present invention;

FIGS. 6, 7a and 7b are exploded, perspective views of the major component groups in a suitable stereolithography system;

FIGS. 11a-11h and 12a-12g are symbolic flowcharts of a suitable stereolithographic process;

FIG. 15 shows typical slicing of CAD object;

FIGS. 16, 17 and 18 show slice (layer) data forming the object;

FIG. 21a illustrates a faceted CAD designed object after rounding of triangles based on scale factor;

FIG. 21b shows a faceted CAD designed object after rounding of triangles in the vertical to slicing layers —layer thickness 20 mils;

FIG. 21c shows a faceted CAD designed object after rounding of triangles in the vertical to slicing layers —layer thickness 5 mils;

FIG. 21d illustrates a faceted CAD designed object after rounding of triangle vertices to slice layers in which overlap will occur;

FIG. 22a shows a faceted CAD designed object to be sliced;

FIG. 22b shows a faceted CAD designed object sliced at 20 mil layers;

FIG. 22c illustrates a faceted CAD designed sliced at variable layer thicknesses of 5 mil and 20 mil;

FIG. 23b shows a side view of a faceted section of an object, the slicing layer, the offset, the vectors created, including a point vector;

FIG. 24d is a top view of a layer of an object completely filled in its solid regions;

FIG. 24e is a top view of a layer of an object properly filled in by cross-hatch (X and Y);

FIGS. 25h'-25h''''' is a top view of flat triangles forming a single double surface before flipping, after flipping, with segment normals, after cancellation of duplicate pairs, after splitting of vectors, and after loop determination (two);

FIGS. 26a and 26b are side views illustrating boundaries on two consecutive layers and the associated variables for determination of the MSA;

FIG. 28a is a side view of a CAD designed object;

FIG. 28b is a side view of the same CAD designed object built using slicing Style 1 or 2, with the perimeter of the CAD object drawn around it;

FIG. 28c is a side view of the same CAD designed object built using slicing Style 3 or 4, with the perimeter of the CAD object drawn around it;

FIG. 29d is a side view of a CAD designed object depicting flat skin boundaries after they have been moved to the layers on which they will be built;

FIG. 30f is a side view of a CAD designed object along with flat skin boundaries;

FIG. 31t–31t' are side views of straight but slanted beams showing that objects can be built with particular layer thicknesses but not with others;

FIG. 31u–31u' reside views of an object similar to that used in describing Styles 3 and 4 but with a wider window and varying layer thicknesses;

FIGS. 34d through 34l are further schematic diagrams illustrating vector order;

FIGS. 35a and 35b are APL programs for such a model;

FIGS. 36a through 36m are graphs relevant to cure compensation; and

FIGS. 37a, 37b and 37c illustrate the mathematical basis and derivations for cure compensation.

DESCRIPTION OF THE PREFERRED EMBODIMENT

Figure 1:
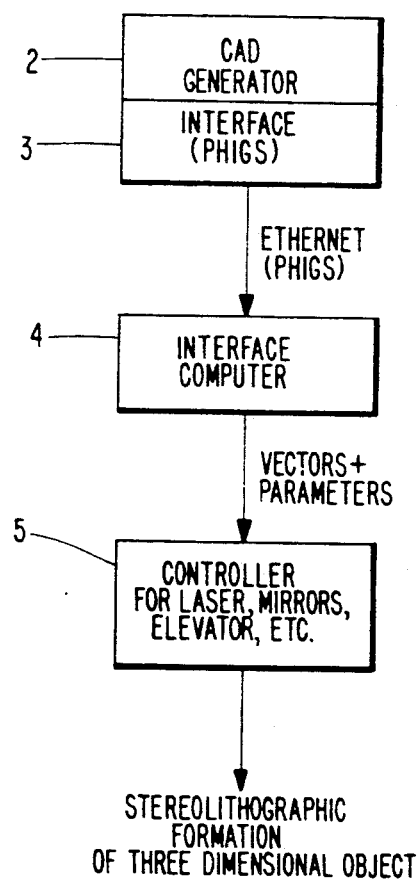
FIG. 1 is a overall block diagram of a stereolithography system for the practice of the present invention.

Referring now to the drawings, and particularly to FIG. 1 thereof, there is shown a block diagram of an overall stereolithography system suitable for practicing the present invention. A CAD generator 2 and appropriate interface 3 provide a data description of the object to be formed, typically in PHIGS format, via network communication such as ETHERNET or the like to an interface computer 4 where the object data is manipulated to optimize the data and provide output vectors which reduce stress, curl and distortion, and increase resolution, strength, accuracy, speed and economy of reproduction, even for rather difficult and complex object shapes. The interface computer 4 generates layer data by slicing, varying layer thickness, rounding polygon vertices, filling, generating flat skins, near-flat skins, up-facing and down-facing skins, scaling, cross-hatching, offsetting vectors and ordering of vectors.

The vector data and parameters from the computer 4 are directed to a controller subsystem 5 for operating the stereolithography system laser, mirrors, elevator and the like.

Figure 3L:
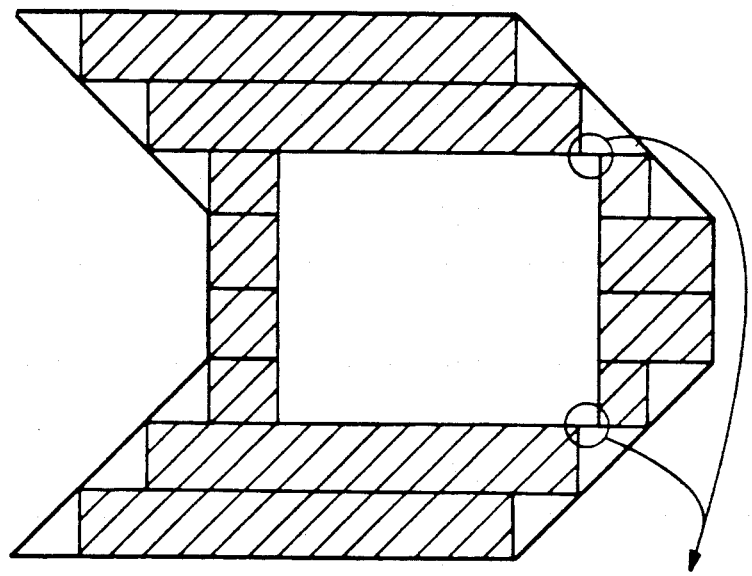
Figure 3L:
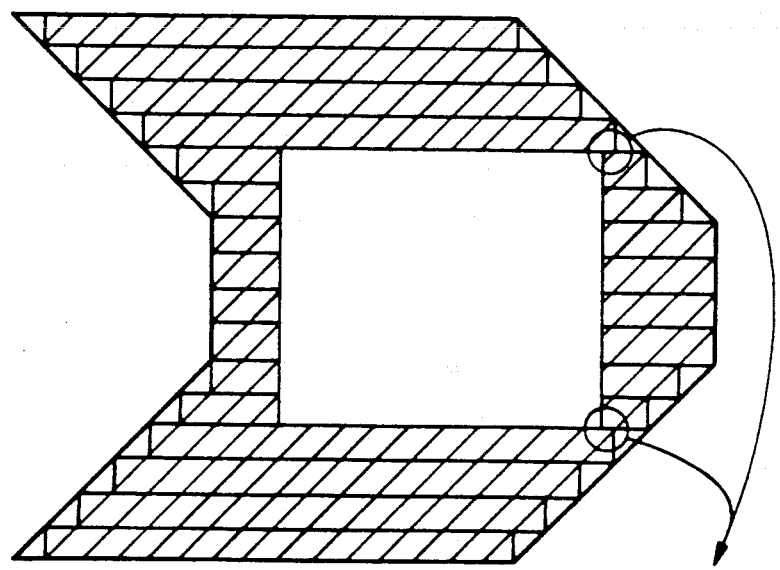

FIGS. 2 and 3 are flow charts illustrating the basic system of the present invention for generating three-dimensional objects by means of stereolithography.

Many liquid state chemicals are known which can be induced to change to solid state polymer plastic by irradiation with ultraviolet light (UV) or other forms of synergistic stimulation such as electron beams, visible or invisible light, reactive chemicals applied by ink jet or via a suitable mask. UV curable chemicals are currently used as ink for high speed printing, in processes of coating or paper and other materials, as adhesives, and in other specialty areas.

Lithography is the art of reproducing graphic objects, using various techniques. Modern examples include photographic reproduction, xerography, and microlithography, as is used in the production of microelectronics. Computer generated graphics displayed on a plotter or a cathode ray tube are also forms of lithography, where the image is a picture of a computer coded object.

Computer aided design (CAD) and computer aided manufacturing (CAM) are techniques that apply the abilities of computers to the processes of designing and manufacturing. A typical example of CAD is in the area of electronic printed circuit design, where a computer and plotter draw the design of a printed circuit board, given the design parameters as computer data input. A typical example of CAM is a numerically controlled milling machine, where a computer and a milling machine produce metal parts, given the proper programming instructions. Both CAD and CAM are important and are rapidly growing technologies.

A prime object of the present invention is to harness the principles of computer generated graphics, combined with UV curable plastic and the like, to simultaneously execute CAD and CAM, and to produce three-dimensional objects directly from computer instructions. This invention, referred to as stereolithography, can be used to sculpture models and prototypes in a design phase of product development, or as a manufacturing device, or even as an art form. The present invention enhances the developments in stereolitho set forth in U.S. Pat. No. 4,575,330, issued Mar. 11, 1986, to Charles W. Hull, one of the inventors herein.

Referring now more specifically to FIG. 2 of the drawings, the stereolithographic method is broadly outlined. Step 8 calls for generation of CAD or other data, typically in digital form, representing a three-dimensional object to be formed by the system. This CAD data usually defines surfaces in polygon format, triangles and normals perpendicular to the planes of those triangles, e.g., for slope indications, being presently preferred, and in a presently preferred embodiment of the invention conforms to the Programmer's Hierarchial Interactive Graphics System (PHIGS) now adapted as an ANSI standard. This standard is described, by way of example in the publication "Understanding PHIGS", published by Template, Megatek Corp, San Diego, Calif.

In Step 9, the PHIGS data or its equivalent is converted, in accordance with the invention, by a unique conversion system to a modified data base for driving the stereolithography output system in forming three-dimensional objects. In this regard, information defining the object is specially processed to reduce stress, curl and distortion, and increase resolution, strength and accuracy of reproduction.

Step 10 in FIG. 2 calls for the generation of individual solid laminae representing cross-sections of a three-dimensional object to be formed. Step 11 combines the successively formed adjacent laminae to form the desired three-dimensional object which has been programmed into the system for selective curing.

Hence, the stereolithographic system of the present invention generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation, electron beam or other particle bombardment, or applied chemicals (as by ink jet or spraying over a mask adjacent the fluid surface), successive adjacent laminae, representing corresponding successive adjacent cross-sections of the object, being automatically formed and integrated together to provide a step-wise laminar or thin layer buildup of the object, whereby a three-dimensional object is formed and drawn from a substantially planar or sheet-like surface of the fluid medium during the forming process.

The aforedescribed technique illustrated in FIG. 2 is more specifically outlined in the flowchart of FIG. 3, where again Step 8 calls for generation of CAD or other data, typically in digital form, representing a three-dimensional object to be formed by the system. Again, in Step 9, the PHIGS data is converted by a unique conversion system to a modified data base for driving the stereolithography output system in forming three-dimensional objects. Step 12 calls for containing a fluid medium capable of solidification in response to prescribed reactive stimulation. Step 13 calls for application of that stimulation as a graphic pattern, in response to data output from the computer 4 in FIG. 1, at a designated fluid surface to form thin, solid, individual layers at that surface, each layer representing an adjacent cross-section of a three-dimensional object to be produced. In the practical application of the invention, each lamina will be a thin lamina, but thick enough to be adequately cohesive in forming the cross-section and adhering to the adjacent laminae defining other cross-sections of the object being formed.

Step 14 in FIG. 3 calls for superimposing successive adjacent layers or laminae on each other as they are formed, to integrate the various layers and define the desired three-dimensional object. In the normal practice of the invention, as the fluid medium cures and solid material forms to define one lamina, that lamina is moved away from the working surface of the fluid medium and the next lamina is formed in the new liquid which replaces the previously formed lamina, so that each successive lamina is superimposed and integral with (by virtue of the natural adhesive properties of the cured fluid medium) all of the other cross-sectional laminae. Of course, as previously indicated, the present invention also deals with the problems posed in transitioning between vertical and horizontal.

The process of producing such cross-sectional laminae is repeated over and over again until the entire three-dimensional object has been formed. The object is then removed and the system is ready to produce another object which may be identical to the previous object or may be an entirely new object formed by changing the program controlling the stereolithographic system.

Figure 4:
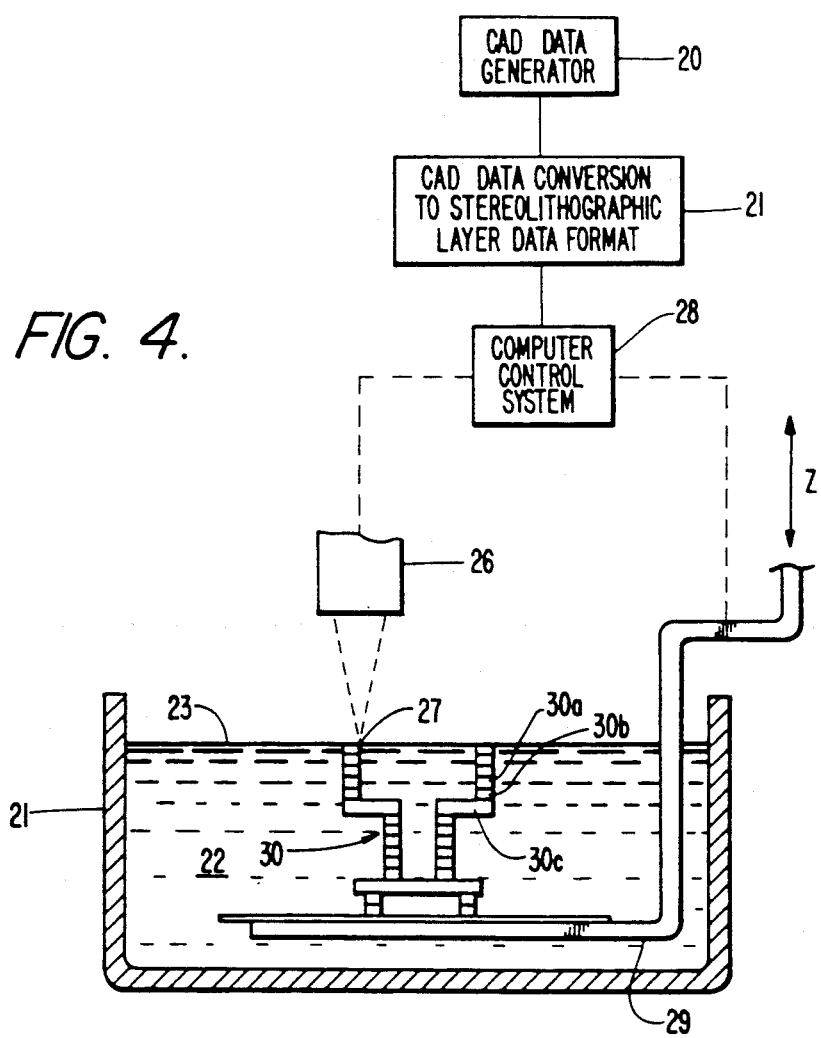
FIG. 4 is a combined block diagram, schematic and elevational sectional view of a system suitable for showing the invention.
Figure 5:
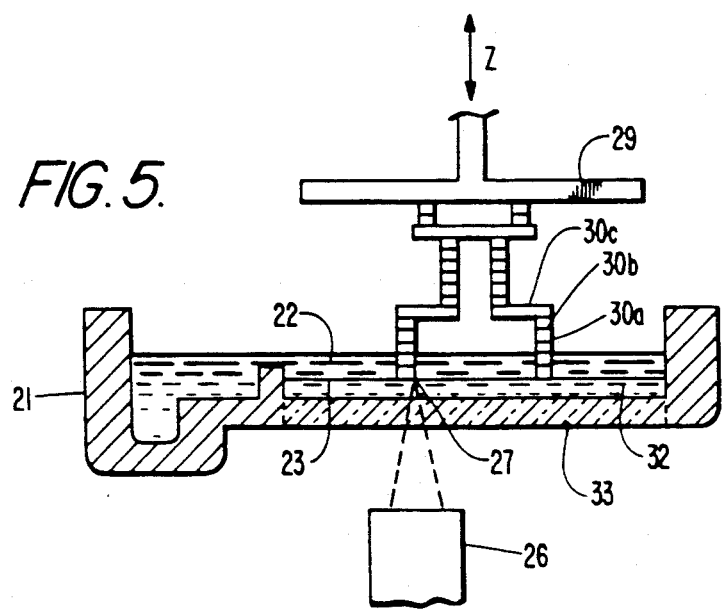
FIG. 5 is an elevational sectional view of a second embodiment of a stereolithography system for the practice of the invention.

FIGS. 4–5 of the drawings illustrate various apparatus suitable for implementing the stereolithographic methods illustrated and described by the systems and flow charts of FIGS. 1–3.

As previously indicated, "Stereolithography" is a method and apparatus for making solid objects by successively "printing" thin layers of a curable material, e.g., a UV curable material, one on top of the other. A programmable movable spot beam of UV light shining on a surface or layer of UV curable liquid is used to form a solid cross-section of the object at the surface of the liquid. The object is then moved, in a programmed manner, away from the liquid surface by the thickness of one layer and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

The data base of a CAD system can take several forms. One form, as previously indicated, consists of representing the surface of an object as a mesh of triangles (PHIGS). These triangles completely form the inner and outer surfaces of the object. This CAD representation also includes a unit length normal vector for each triangle. The normal points away from the solid which the triangle is bounding. This invention provides a means of processing such CAD data into the layer-by-layer vector data that is necessary for forming objects through stereolithography.

For stereolithography to successfully work, there must be good adhesion from one layer to the next. Hence, plastic from one layer must overlay plastic that was formed when the previous layer was built. In building models that are made of vertical segments, plastic that is formed on one layer will fall exactly on previously formed plastic from the preceding layer, and thereby provide good adhesion. As one starts to make a transition from vertical to horizontal features, using finite jumps in layer thickness, a point will eventually be reached where the plastic formed on one layer does not make contact with the plastic formed on the previous layer, and this causes severe adhesion problems. Horizontal surfaces themselves do not present adhesion problems because by being horizontal the whole section is built on one layer with side-to-side adhesion maintaining structural integrity. This invention provides a general means of insuring adhesion between layers when making transitions from vertical to horizontal or horizontal to vertical sections, as well as providing a way to completely bound a surface, and ways to reduce or eliminate stress and strain in formed parts.

A presently preferred embodiment of a new and improved stereolithographic system is shown in elevational cross-section in FIG. 4. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown in FIG. 4) used with the light source 26. The position of the spot 27 on surface 23 is controlled by a computer control system 28. As previously indicated, the system 28 may be under control of CAD data produced by a generator 20 in a CAD design system or the like and directed in PHIGS format or its equivalent to a computerized conversion system 25 where information defining the object is specially processed to reduce stress, curl and distortion, and increase resolution, strength and accuracy of reproduction.

A movable elevator platform 29 inside container 21 can be moved up and down selectively, the position of the platform being controlled by the system 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The curable liquid 22, e.g., UV curable liquid, must have several important properties. (A) It must cure fast enough with the available UV light source to allow practical object formation times. (B) It must be adhesive, so that successive layers will adhere to each other. (C) Its viscosity must be low enough so that fresh liquid material will quickly flow across the surface when the elevator moves the object. (D) It should absorb UV so that the film formed will be reasonably thin. (E) It must be reasonably insoluble in that same solvent in the solid state, so that the object can be washed free of the UV cure liquid and partially cured liquid after the object has been formed. (F) It should be as non-toxic and non-irritating as possible.

The cured material must also have desirable properties once it is in the solid state. These properties depend on the application involved, as in the conventional use of other plastic materials. Such parameters as color, texture, strength, electrical properties, flammability, and flexibility are among the properties to be considered. In addition, the cost of the material will be important in many cases.

The UV curable material used in the presently preferred embodiment of a working stereolithograph (e.g., FIG. 3) is DeSoto SLR 800 stereolithography resin, made by DeSoto, Inc. of Des Plains, Ill.

The light source 26 produces the spot 27 of UV light small enough to allow the desired object detail to be formed, and intense enough to cure the UV curable liquid being used quickly enough to be practical. The source 26 is arranged so it can be programmed to be turned off and on, and to move, such that the focused spot 27 moves across the surface 23 of the liquid 22. Thus, as the spot 27 moves, it cures the liquid 22 into a solid, and "draws" a solid pattern on the surface in much the same way a chart recorder or plotter uses a pen to draw a pattern on paper.

The light source 26 for the presently preferred embodiment of a stereolithography is typically a helium-cadmium ultraviolet laser such as the Model 4240-N HeCd Multimode Laser, made by Liconix of Sunnyvale, Calif.

In the system of FIG. 4, means may be provided to keep the surface 23 at a constant level and to replenish this material after an object has been removed, so that the focus spot 27 will remain sharply in focus on a fixed focus plane, thus insuring maximum resolution in forming a layer along the working surface. In this regard, it is desired to shape the focal point to provide a region of high intensity right at the working surface 23, rapidly diverging to low intensity and thereby limiting the depth of the curing process to provide the thinnest appropriate cross-sectional laminae for the object being formed.

The elevator platform 29 is used to support and hold the object 30 being formed, and to move it up and down as required. Typically, after a layer is formed, the object 30 is moved beyond the level of the next layer to allow the liquid 22 to flow into the momentary void at surface 23 left where the solid was formed, and then it is moved back to the correct level for the next layer. The requirements for the elevator platform 29 are that it can be moved in a programmed fashion at appropriate speeds, with adequate precision, and that it is powerful enough to handle the weight of the object 30 being formed. In addition, a manual fine adjustment of the elevator platform position is useful during the set-up phase and when the object is being removed.

The elevator platform 29 can be mechanical, pneumatic, hydraulic, or electrical and may also be optical or electronic feedback to precisely control its position. The elevator platform 29 is typically fabricated of either glass or aluminum, but any material to which the cured plastic material will adhere is suitable.

A computer controlled pump (not shown) may be used to maintain a constant level of the liquid 22 at the working surface 23. Appropriate level detection system and feedback networks, well known in the art, can be used to drive a fluid pump or a liquid displacement device, such as a solid rod (not shown) which is moved out of the fluid medium as the elevator platform is moved further into the fluid medium, to offset changes in fluid volume and maintain constant fluid level at the surface 23. Alternatively, the source 26 can be moved relative to the sensed level 23 and automatically maintain sharp focus at the working surface 23. All of these alternatives can be readily achieved by appropriate data operating in conjunction with the computer control system 28.

As an overview, the portion of our processing referred to as "SLICE" takes in the object that you want to build, together with any scaffolding or supports that are necessary to make it more buildable. These supports are typically generated by the user's CAD. The first thing SLICE does is to find the outlines of the object and its supports.

SLICE defines each microsection or layer one at a time under certain specified controlling and styles. SLICE produces a boundary to the solid portion of the object. If, for instance, the object is hollow, there will be an outside surface and an inside one. This outline then is the primary information. The SLICE program then takes that outline or series of outlines and says, but if you build an outside skin and an inside skin they won't join to one another, you'll have liquid between them. It will collapse. So let us turn this into a real product, a real part by putting in cross-hatching between the surfaces or solidifying everything inbetween or adding skins where it's so gentle a slope that one layer wouldn't join on top of the next, remembering past history or slope of the triangles (PHIGS) whichever way you look at it. SLICE does all those things and may use some lookup tables of the chemical characteristics of the photopolymer, how powerful the laser is, and related parameters to indicate how long to expose each of the output vectors used to operate the system. That output consists of identifiable groups. One group consists of the boundaries or outlines. Another group consists of cross-hatches. A third group consists of skins and there are subgroups of those, upward facing skins, downward facing skins which have to be treated slightly differently. These subgroups are all tracked differently because they may get slightly different treatment, in the process the output data is then appropriately managed to form the desired object and supports.

After the three-dimensional object 30 has been formed, the elevator platform 29 is raised and the object is removed from the platform for post processing.

In addition, there may be several containers 21 used in the practice of the invention, each container having a different type of curable material that can be automatically selected by the stereolithographic system. In this regard, the various materials might provide plastics of different colors, or have both insulating and conducting material available for the various layers of electronic products.

Referring now more particularly to the remaining drawings, in connection with various alternative embodiments of the invention, like reference numerals throughout the various figures of the drawings denote like or corresponding parts as those previously discussed in connection with the preferred embodiment of the invention shown in FIG. 4.

As will be apparent from FIG. 5 of the drawings, there is shown an alternate configuration of a stereolithograph system wherein the UV curable liquid 22 or the like floats on a heavier UV transparent liquid 32 which is non-miscible and non-wetting with the curable liquid 22. By way of example, ethylene glycol or heavy water are suitable for the intermediate liquid layer 32. In the system of FIG. 4, the three-dimensional object 30 is pulled up from the liquid 22, rather than down and further into the liquid medium, as shown in the system of FIG. 3.

The UV light source 26 in FIG. 5 focuses the spot 27 at the interface between the liquid 22 and the non-miscible intermediate liquid layer 32, the UV radiation passing through a suitable UV transparent window 33, of quartz or the like, supported at the bottom of the container 21. The curable liquid 22 is provided in a very thin layer over the non-miscible layer 32 and thereby has the advantage of limiting layer thickness directly rather than relying solely upon absorption and the like to limit the depth of curing since ideally an ultrathin lamina is to be provided. Hence, the region of formation will be more sharply defined and some surfaces will be formed smoother with the system of FIG. 5 than with that of FIG. 4. In addition a smaller volume of UV curable liquid 22 is required, and the substitution of one curable material for another is easier.

A commercial stereolithography system will have additional components and subsystems besides those previously shown in connection with the schematically depicted systems of FIGS. 1-5. For example, the commercial system would also have a frame and housing, and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks. Such commercial units will also have means to effectively shield the sensitive electronics from electronic noise sources.

As previously mentioned, a number of other possible apparatus may be utilized to practice the stereolithographic method. For example, an electron source, a visible light source, or an x-ray source or other radiation source could be substituted for the UV light source 26, along with appropriate fluid media which are cured in response to these particular forms of reactive stimulation. For example, alphaoctadecylacrylic acid that has been slightly prepolymerized with UV light can be polymerized with an electron beam. Similarly, poly(2,3-dichloro-1-propyl acrylate) can be polymerized with an x-ray beam.

Figure 6:
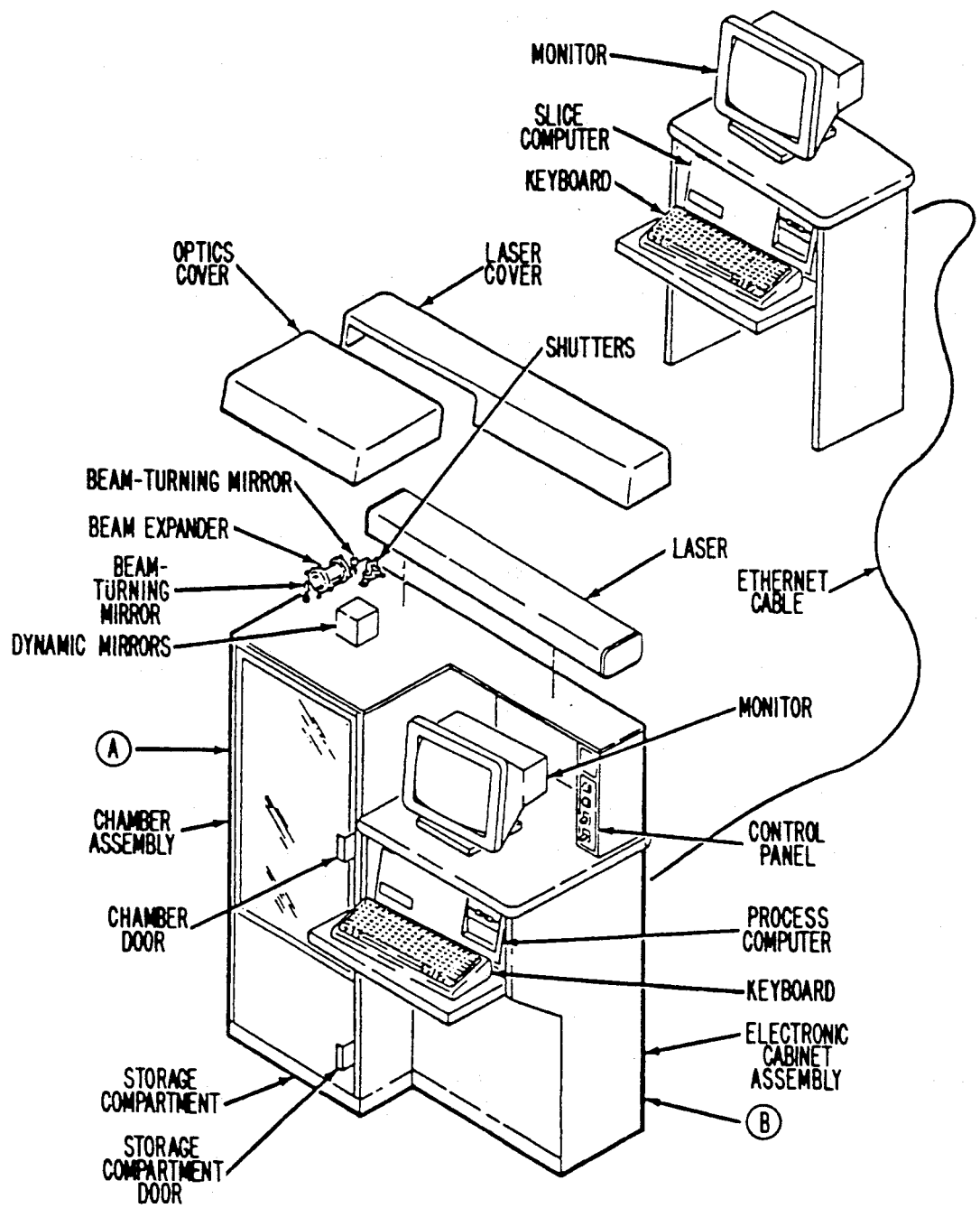
Figure 7B:
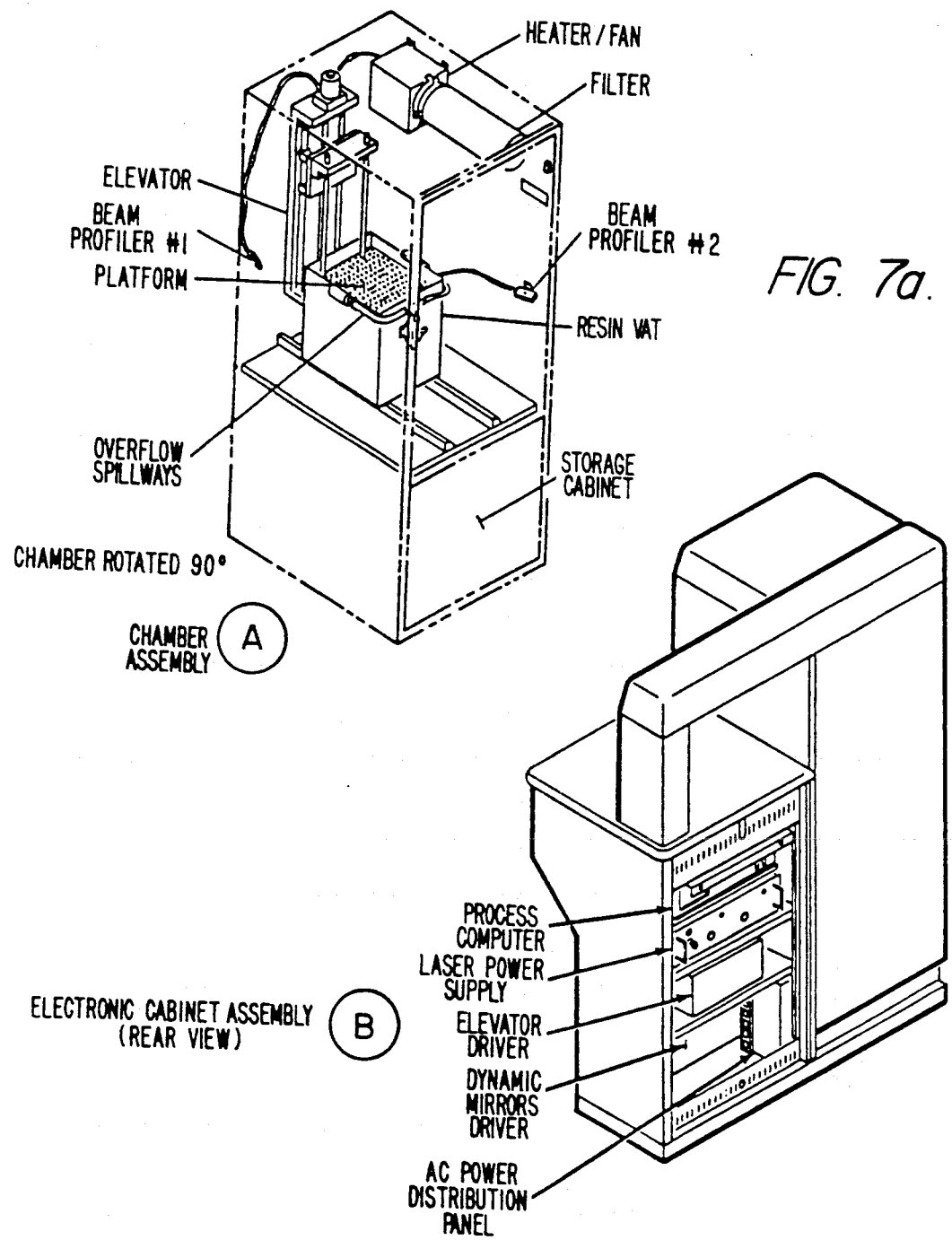
Figure 8:
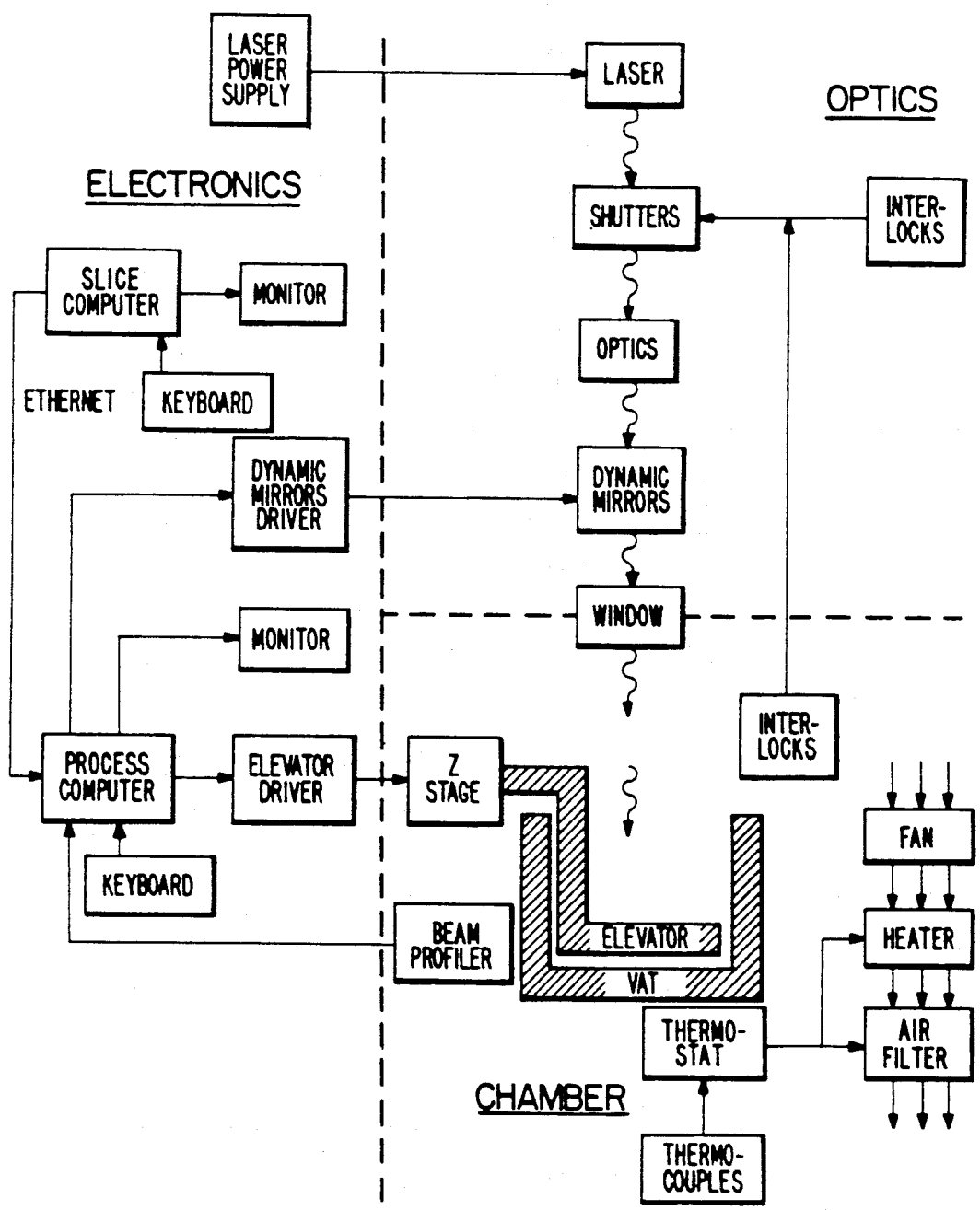
FIG. 8 is a block diagram of a suitable stereolithography system.

The commercialized SLA is a self-contained system that interfaces directly with the user's CAD system. The SLA, as shown in FIGS. 6, 7a and 7b consists of four major component groups: the slice computer terminal, the electronic cabinet assembly, the optics assembly, and the chamber assembly. A block diagram of the SLA is shown in FIG. 8.

The electronic cabinet assembly includes the process computer (disc drive), keyboard, monitor, power supplies, ac power distribution panel and control panel. The computer assembly includes plug-in circuit boards for control of the terminal, high-speed scanner mirrors, and vertical (Z-stage) elevator. Power supplies for the laser, dynamic mirrors, and elevator motor are mounted in the lower portion of the cabinet.

The control panel includes a power on switch/indicator, a chamber light switch/indicator, a laser on indicator, and a shutter open indicator.

Operation and maintenance parameters, including fault diagnostics and laser performance information, are also typically displayed on the monitor. Operation is controlled by keyboard entries. Work surfaces around the key-board and disc drive are covered with formica or the like for easy cleaning and long wear.

The helium cadmium (HeCd) laser and optical components are mounted on top of the electronic cabinet and chamber assembly. The laser and optics plate may be accessed for service by removing separate covers. For safety reasons, a special tool is required to unlock the cover fasteners and interlock switches are activated when the covers are removed. The interlocks activate a solenoid-controlled shutter to block the laser beam when either cover is removed.

Figure 9:
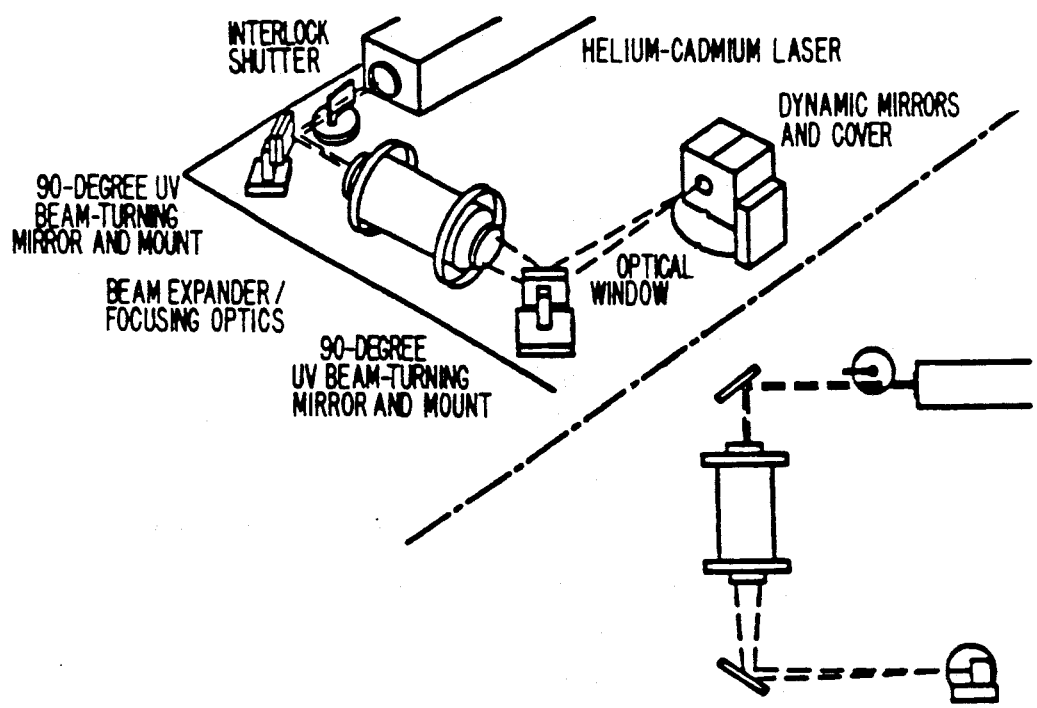
FIG. 9 is a perspective view of the laser and optic system in a stereolithography system which may utilize the present invention.

As shown in FIG. 9, the shutter assembly, two ninety degree beam-turning mirrors, a beam expander, an X-Y scanning mirror assembly, and precision optical window are mounted on the optics plate. The rotary solenoid-actuated shutters are installed at the laser output and rotate to block the beam when a safety interlock is opened. The ninety degree beam-turning mirrors reflect the laser beam to the next optical component. The beam expander enlarges and focuses the laser beam on the liquid surface. The high speed scanning mirrors direct the laser beam to trace vectors on the resin surface. A quartz window between the optics enclosure and reaction chamber allows the laser beam to pass into the reaction chamber, but otherwise isolates the two regions.

The chamber assembly contains an environmentally-controlled chamber, which houses a platform, reaction vat, elevator, and beam profiler.

The chamber in which the object is formed is designed for operator safety and to ensure uniform operating conditions. The chamber may be heated to approximately 40° (104° F.) and the air is circulated and filtered. An overhead light illuminates the reaction vat and work surfaces. An interlock on the glass access door activates a shutter to block the laser beam when opened.

The reaction vat is designed to minimize handling of the resin. It is typically installed in the chamber on guides which align it with the elevator and platform.

The object is formed on a platform attached to the vertical axis elevator, or Z-stage. The platform is immersed in the resin vat and it is adjusted incrementally downward while the object is being formed. To remove the formed part, it is raised to a position above the vat. The platform is then disconnected from the elevator and removed from the chamber for post processing. Handling trays are usually provided to catch dripping resin.

The beam profilers are mounted at the sides of the reaction vat at the focal length of the laser. The scanning mirror is periodically commanded to direct the laser beam onto the beam profiler, which measures the beam intensity profile. The data may be displayed on the terminal, either as a profile with intensity contour lines or as a single number representing the overall (integrated) beam intensity. This information is used to determine whether the mirrors should be cleaned and aligned, whether the laser should be serviced, and what parameter values will yield vectors of the desired thickness and width.

Figure 10:
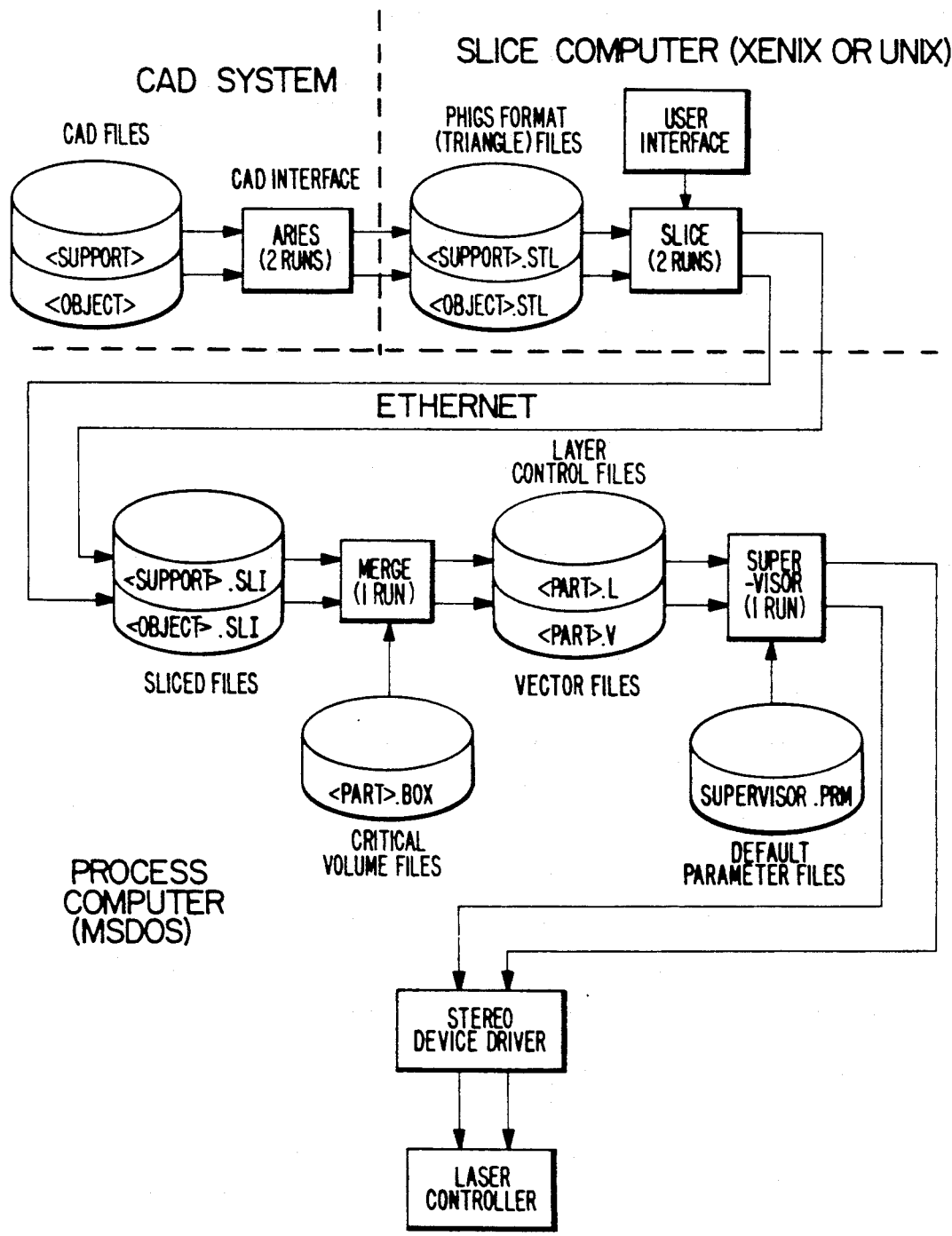
FIG. 10 is an overall block diagram of the software in a suitable stereolithography system.

A software diagram of the SLA is shown in FIG. 10. There are three computers needed to control the stereolithographic apparatus, a CAD system, a slice computer, and a process computer. Any CAD system can be used to design a part in three-dimensional space. This is identified as the object file. In order to generate the part, supports must be added to prevent distortion. This is accomplished by adding the necessary supports to the CAD part design and creating a CAD support file. The resultant two or more CAD generated files are then physically inserted into the slice computer through Ethernet.

The stereolithography apparatus builds the part one layer at a time starting with the bottom layer. The slice computer breaks down the CAD part into individual horizontal slices. The slice computer also calculates where hatch vectors will be created. This is done to achieve maximum strength as each layer is constructed. The slice computer may be a separate computer with its own keyboard and monitor. However, the slice computer may share a common keyboard and monitor with the process computer. The operator can vary the thickness of each slice and change other parameters of each slice with the User Interface program. The slice computer may use the XENIX or UNIX machine language and is connected to the SLA process computer by an Ethernet network data bus or the like.

The sliced files are then transferred to the process computer through Ethernet. The process computer merges the sliced object and support files into a layer control file and a vector file. The operator then inserts the necessary controls needed to drive the stereolithography apparatus in the layer and parameter file. (The vector file is not usually edited.) The operator can strengthen a particular volume of the part by inserting rivets. This is accomplished by inserting the necessary parameters to the critical volume file prior to merging of the sliced files. The merge program integrates the object, support, and critical volume files and inserts the resultant data in the layer control file. The operator can edit the layer control file and change the default parameter file. The default parameter file contains the controls needed to operate the stereolithography apparatus to build the part. The process computer uses the MSDOS machine language and is directly connected to the stereolithography apparatus.

The stereolithographic process is broadly illustrated by the symbolic flowcharts of FIGS. 11a–11h, and 12a–12g.

Stereolithography is a three-dimensional printing process which uses a moving laser beam to build parts by solidifying successive layers of liquid plastic. This method enables a designer to create a design on a CAD system and build an accurate plastic model in a few hours. In a presently preferred embodiment, by way of example and not necessarily by way of limitation, the stereolithographic process may comprise the following steps.

First, the solid model is designed in the normal way on the CAD system, without specific reference to the stereolithographic process.

Model preparation for stereolithography involves selecting the optimum orientation, adding supports, and selecting the operating parameters of the stereolithography system. The optimum orientation will (1) enable the object to drain, (2) have the least number of unsupported surfaces, (3) optimize important surfaces, and (4) enable the object to fit in the resin vat. Supports must be added to secure unattached sections and for other purposes; a CAD library of supports can be prepared for this purpose. The stereolithography operating parameters include selection of the model scale and layer (slice) thickness.

The surface of the solid model is then divided into triangles, typically "PHIGS". A triangle is the least complex polygon for vector calculations. The more triangles formed, the better the surface resolution and hence the more accurate the formed object with respect to the CAD design.

Data points representing the triangle coordinates are then transmitted to the stereolithographic system via appropriate network communications. The software of the stereolithographic system then slices the triangular sections horizontally (X-Y plane) at the selected layer thickness.

The stereolithographic unit (SLA) next calculates the section boundary, hatch, and horizontal surface (skin) vectors. Hatch vectors consist of cross-hatching between the boundary vectors. Several slicing styles are available. Skin vectors, which are traced at high speed and with a large overlap, form the outside horizontal surfaces of the object. Interior horizontal areas, those within top and bottom skins, are not filled in other than by cross-hatch vectors.

The SLA then forms the object one horizontal layer at a time by moving the ultraviolet beam of a helium-cadmium laser across the surface of a photocurable resin and solidifying the liquid where it strikes. Absorption in the resin prevents the laser light from penetrating deeply and allows a thin layer to be formed. Each layer is comprised of vectors which are drawn in he following order: border, hatch, and surface.

The first layer that is drawn by the SLA adheres to a horizontal platform located just below the liquid surface. This platform is attached to an elevator which then lowers it vertically under computer control. After drawing a layer, the platform dips several millimeters into the liquid to coat the previous cured layer with fresh liquid, then rises up a smaller distance leaving a thin film of liquid from which the second layer will be formed. After a pause to allow the liquid surface to flatten out, the next layer is drawn. Since the resin has adhesive properties, the second layer becomes firmly attached to the first. This process is repeated until all the layers have been drawn and the entire three-dimensional object is formed. Normally, the bottom 0.25 inch or so of the object is a support structure on which the desired part is built. Resin that has not been exposed to light remains in the vat to be used for the next part. There is very little waste of material.

Post processing involves draining the formed object to remove excess resin, ultraviolet or heat curing to complete polymerization, and removing supports. Additional processing, including sanding and assembly into working models, may also be performed.

The stereolithographic method and apparatus has many advantages over currently used methods for producing plastic objects. The method avoids the need of producing design layouts and drawings, and of producing tooling drawings and tooling. The designer can work directly with the computer and a stereolithographic device, and when he is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

Figure 14:
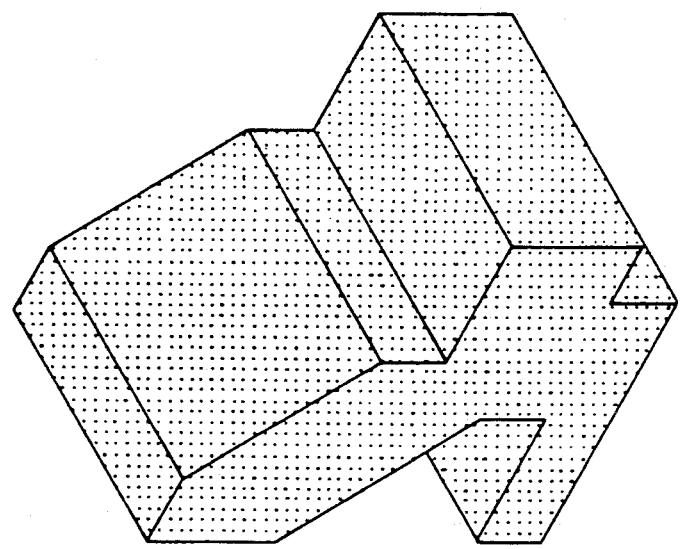
FIGS. 13 and 14 illustrate a sample CAD designed object.
Figure 13:
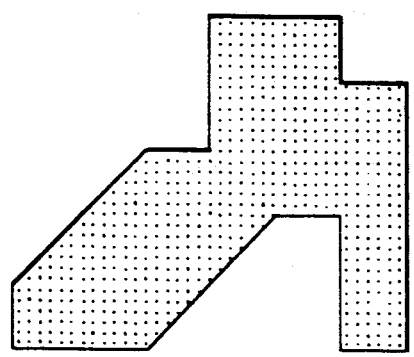
Figure 18:
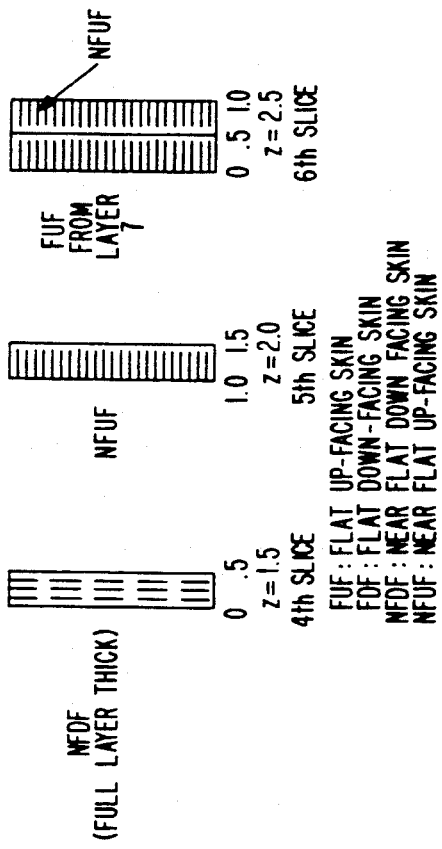
Figure 17:
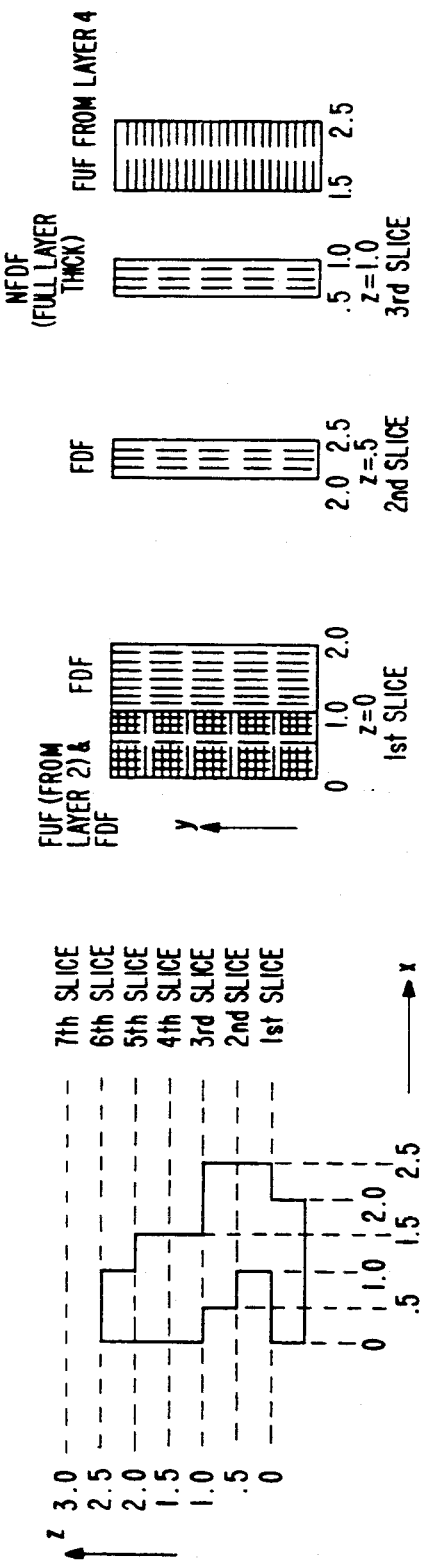

Stereolithography embodies the concept of taking three-dimensional computer data describing an object and creating a three-dimensional plastic replica of the object. Construction of an object is based on converting the three-dimensional computer data into two-dimensional data representing horizontal layers and building the object layer by layer. The software that takes us from the three-dimensional data defining the object to vector data is called "SLICE". FIGS. 13 and 14 illustrate a sample CAD designed object. FIG. 15 shows typical slicing of CAD object. FIGS. 16, 17 and 18 show slice (layer) data forming the object.

CAD data files are referred to as STL files. These STL files divide the surface area of an object into triangular facets. The simpler the object the fewer the triangles needed to describe it, and the more complex the object or the more accuracy used to represent its curvatures the more triangles required to describe it. These triangles encompass both inner and outer surfaces.

In this representation all triangles are required to have their vertices intersect the vertices of other triangles; therefore, no triangle may have a vertex coincide with the edge (between vertices) of another. This insures that when triangle vertices are rounded (at a later stage) that no holes in the surface (represented by the triangles) are inadvertently created.

Figure 33:
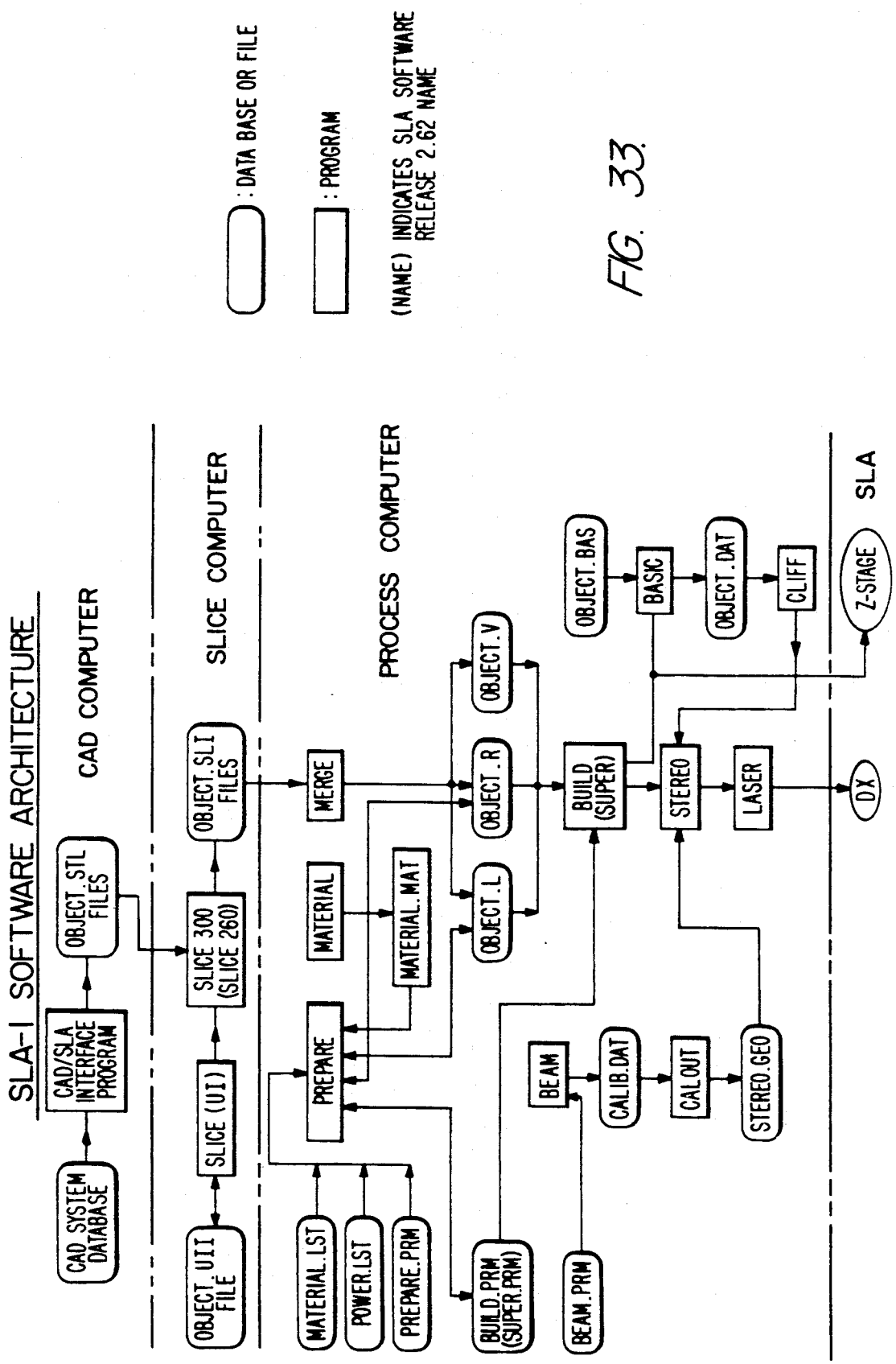
FIG. 33 is a software architecture flowchart depicting in greater detail the overall data flow, data manipulation and data management in a stereolithography system incorporating the features of the invention.

FIG. 33 is a software architecture flowchart depicting in greater detail the overall data flow, data manipulation and data management in a stereolithography system incorporating the features of the invention.

In the CAD data file, triangles are represented by four sets of three numbers each. Each of the first three sets of numbers represents a vertex of the triangle in three-dimensional space. The fourth set represents the coordinates of the normal vector perpendicular to the plane of the triangle. This normal is considered to start at the origin and point to the coordinates specified in the STL file. By convention this normal vector is also of unit length (i.e., one CAD unit). The normal vector can point in either of two directions, but by convention, the direction we have chosen points from solid to hollow (away from the solid interior of the object that the triangle is bounding). Also associated with each triangle is an attribute designation.

Figure 19C:
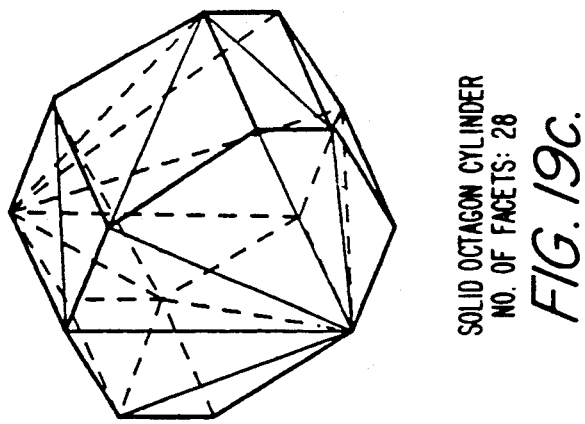
FIG. 19c shows a faceted sketch of a solid octagon shaped cylinder.
Figure 19B:
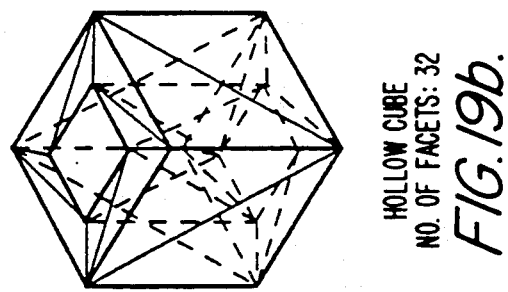
FIG. 19b shows a faceted sketch of a hollow cube.
Figure 19A:
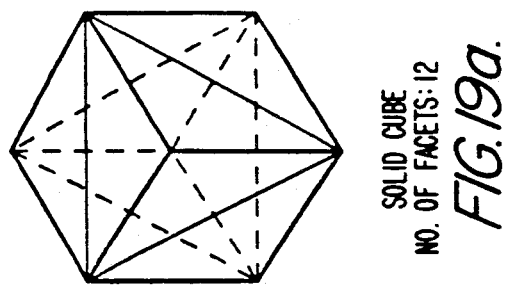
FIG. 19a shows a faceted sketch of a solid cube.

FIG. 19a shows a faceted sketch of a solid cube. FIG. 19b shows a faceted sketch of a hollow cube. FIG. 19c shows a faceted sketch of a solid octagon shaped cylinder.

Scaling of an STL file involves a slicing program that converts the three-dimensional data into two-dimensional vectors and is based on processing integers. The CAD units in which an object is dimensioned, and therefore the STL file, are arbitrary. A scale factor is used to divide the CAD units into bits, so that slicing can be done based on bits instead of on the units of design. This gives us the ability to maximize the resolution with which an object will be built regardless of what the original design units were. For example, a part designed in inches has the maximum resolution of one inch but if we multiply it by a scale factor of 1000 or maybe 10000 we increase our resolution to 0.001 inches (mils) or to 0.0001 inches (1/10th of a mil).

All vertices of triangles are rounded to the nearest bit in all three dimensions; therefore, the object's dimensions are quantized. This means a part designed in inches with a scale factor of 1000 will have its triangle vertices rounded to the nearest mil.

If there are triangles surfacing the object that collapse to a single point or a line because their dimensions and orientation are such that the vertices are not resolved as individual bits, they are ignored in subsequent processing. Collapsed triangles can not produce discontinuities (i.e. holes) in the triangle faceted surface of the object, and they do not cause overlapping of any triangles that are distorted when filling in the area of a collapsed triangle. Rounding of triangle vertices which does not produce collapsed triangles cannot produce discontinuities (holes) in the surface of the object, but can cause overlapping of sections of triangles and can cause triangle normals to change their directions to new quadrants (up to 180 degree changes in direction). This does not necessarily cause a problem, but does need to be considered in later processing, in particular when creating boundary and cross-hatch vectors. Overlapping of triangles can also occur if wall thickness or hollows are thinner than 1 bit. These problems can be prevented by either using an arbitrarily small bit size or by requiring that all triangles exceed certain minimum dimensions.

Figure 20A:
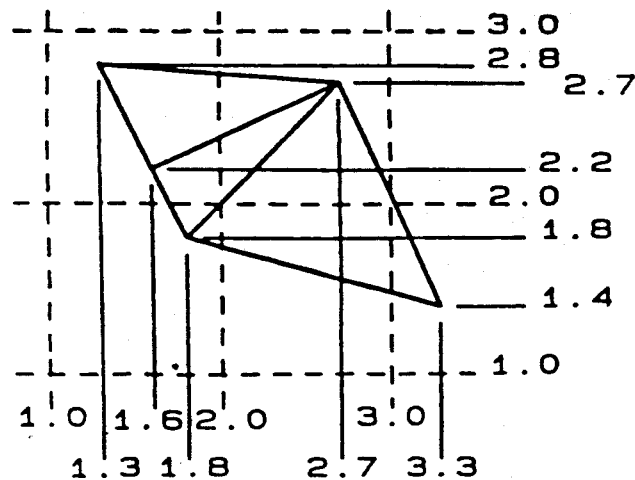
FIG. 20a shows a faceted CAD designed object in gridded space.
Figure 20B:
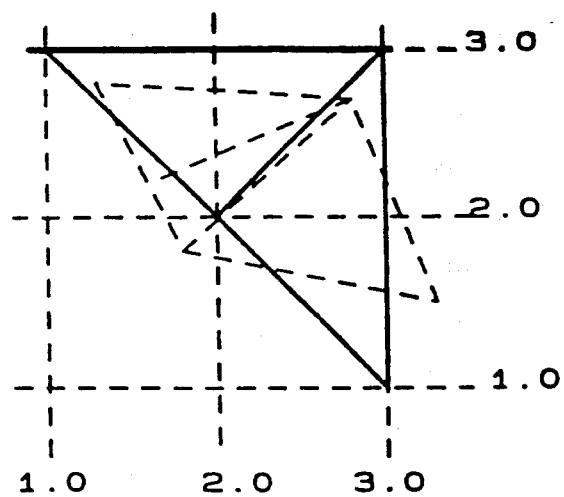
FIG. 20b shows a faceted CAD designed object after rounding of triangles —Scale 2—Scale 4—Scale 10.
Figure 20C:
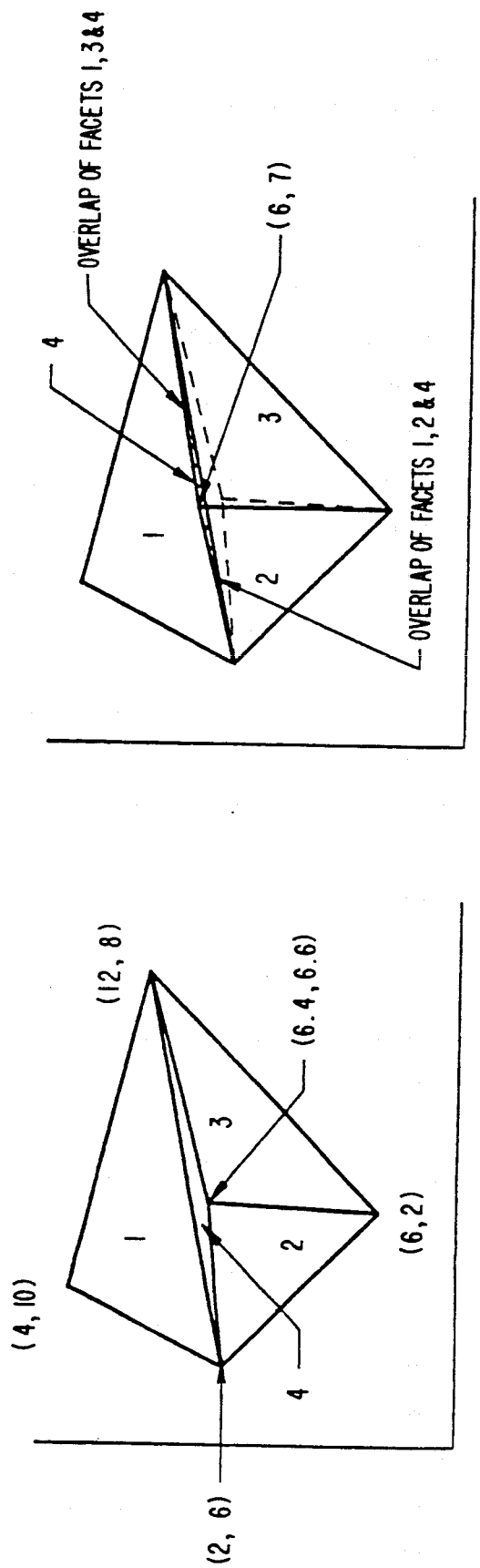
FIG. 20c shows a faceted CAD designed object after rounding of triangles in which triangle overlap occurs.

FIG. 20a shows a faceted CAD designed object in gridded space (two-dimensional okay). FIG. 20b shows a faceted CAD designed object after rounding of triangles—Scale 2—Scale 4—Scale 10. FIG. 20c shows a faceted CAD designed object after rounding of triangles in which triangle overlap occurs.

There is a second rounding of triangle vertices which occurs, involving rounding the triangle vertices in the vertical direction to the nearest slicing layer. This rounding process causes a vertical distortion in the part and may cause the collapse or expansion of small features. This may not necessarily be serious since the maximum resolution in the vertical dimensions is one layer thickness. Regions containing critical features can be sliced into thinner layers to minimize distortion.

Rounding of triangle vertices provides several advantages over allowing them to remain at the locations that they were originally at in the STL file. If vertices are rounded then all horizontal triangles are moved to slicing layers. Thus, when flat skin is created (derived from horizontal triangles) the skin will have excellent fit within the boundaries at a particular layer. In addition, the cross-hatching between the walls of objects will have more accurate placement. Our hatching is based on hatch paths intersecting boundaries and then determining whether to turn hatching on and off. If a hatch path should strike a vertex point it would be difficult to make an accurate decision whether to turn hatch on or off. By rounding of vertices we know exactly where they are (in the vertical dimension) and we therefore can avoid them when we create boundaries (which are used in the process of generating hatch).

Rounding of vertices to slicing is more likely to cause overlap of triangles than is rounding to the nearest scale bit. In addition, styles require 1 bit off so that the part comes out with the best vertical dimension. Unlike the rounding due to slicing scale, the problems associated with rounding of vertices to slicing layers cannot be solved by using arbitrarily small slicing layers or by limiting the minimum size of triangles. One possible way of minimizing the problem is to put a limit on the maximum dimension of triangles to slightly over one layer thickness. This could be used to reduce the number of overlapping surfaces. Some proposed hatching algorithm will enable us to handle regions of overlapping triangles in a consistent and reliable manner.

FIG. 21a illustrates a faceted CAD designed object after rounding of triangles based on scale factor. FIG. 21b shows a faceted CAD designed object after rounding of triangles in the vertical to slicing layers—layer thickness 20 mils. FIG. 21c shows a faceted CAD designed object after rounding of triangles in the vertical to slicing layers—layer thickness 5 mils. FIG. 21d illustrates a faceted CAD designed object after rounding of triangle vertices to slice layers in which overlap will occur.

When an object is sliced into layers the vertical distance between layers can be varied depending on the vertical resolution needed in different areas. The selection of layer thickness is based on three distinct considerations: 1) desired resolution, 2) structural strength required of the layer, and 3) time allowed for building the object. Each of these factors is affected by layer thickness.

Item 1, resolution, is the most obvious item that is affected. The resolution of vertical features is inversely proportional to layer thickness. Item 2, structural strength, is proportional to cure thickness, and cure thickness is generally based on layer thickness plus a constant or a percentage of layer thickness.

As layers get thinner a problem with structural strength of layers may develop even though layer-to-layer adhesion is satisfactory. An approach to solving this strength problem is based on giving layers more cure depth than required for good adhesion; this works well in many cases but a few cases still exist where these thicker cure depths may cause undesired structural differences between the part as designed and the part as actually built.

Another way of minimizing problem 2 is to design parts as separate objects that can be sliced separately using different layer thicknesses. So item 2 is sometimes a problem with regard to decreasing layer thickness but not necessarily.

Item 3 may or may not represent a problem when layer thickness is decreased. The time required to build a given part is based on three tasks: laser scanning time, liquid settling time, and number of layers per given thickness. As the layer thickness decreases the liquid settling time increases, number of layers per unit thickness increases, and the drawing time decreases. On the other hand, with increasing layer thickness the settling time decreases, number of layers per unit thickness decreases and the drawing time increases.

These three tasks balance each other to give long part building times for thick layers, long part building times for thin layers, and shorter part building time for intermediate layer thickness.

FIG. 22a shows a faceted CAD designed object to be sliced. FIG. 22b shows a faceted CAD designed object sliced at 20 mil layers. FIG. 22c illustrates a faceted CAD designed object sliced at variable layer thicknesses of 5 mil and 20 mil.

There are several types of boundaries that can be used to form the edges of layers and features when building parts. These boundaries include the layer boundary, down facing flat skin boundary, up facing flat skin boundary, down facing near-flat skin boundary, and up facing near-flat skin boundary. At this point in the description of the invention, we will concern ourselves with only the creation of layer boundaries, leaving the other boundary types for subsequent discussion.

Triangles are categorized into three main groups after they are rounded to both scale bits and to layers: scan triangles, near-flat triangles, and flat triangles. Flat triangles are those which have all three vertices all lying on the same layer. Near-flat triangles are those having normal vectors within some minimum angle from the vertical. All remaining triangles are scan triangles, i.e., those having normals outside the minimum angle from the vertical.

Layer boundaries are created at the line of intersection of scan and near-flat triangles with a horizontal plane intersecting the object at a vertical level slightly offset from the slicing layer. Each scan and near-flat triangle that is present at this slight vertical offset from a given layer will be used to create one vector that will form part of the layer boundary. Each triangle will have two points that cross a given layer and one of these points will be used as a starting point for a vector and the other point will be used as the ending point of the vector. Since triangles form complete surfaces around the object to be formed, both inside and outside, there will be vectors formed that will make a complete boundary around the layer.

After creation of layer boundary vectors, all degenerate vectors should be removed. These point vectors were not created from intersecting triangle vertices, since vertices are right on the slicing layer. But these point vectors can be created from triangles that are relatively narrow at the vertical level at which the vectors were derived, so narrow that the beginning and end points of the vector rounded to the same point. It should be noted that in some circumstances, vectors can overlap at more than their end points. This may present problems in later processing if not handled properly.

Figure 23A:
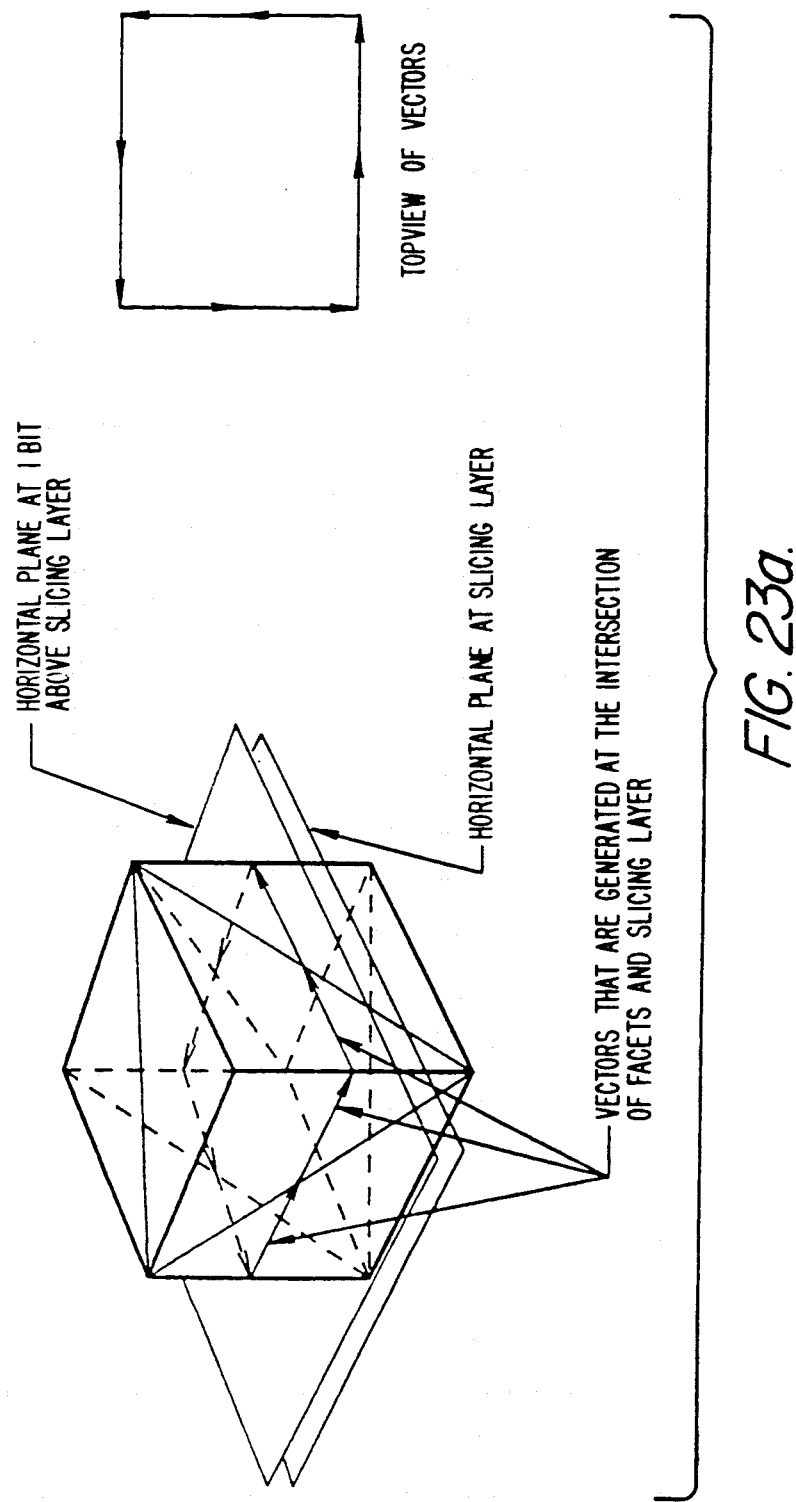
FIG. 23a shows a side view of intersection of triangles with a layer and vectors that are created at this intersection.

FIG. 23a shows a side view of an intersection of triangles with a layer, and vectors that are created at this intersection. FIG. 23b shows a side view of a faceted section of an object, the slicing layer, the offset, and the vectors created including a point vector.

It may seem that boundary vectors should be created right at the intersection of the triangles with the slicing layer but this creates several problems that can be readily solved by creating the boundary vectors from the intersection of triangles with a horizontal plane that is just slightly above or below the slicing layer. This concept of creating boundary vectors which are slightly offset from the slicing layer introduces some minor problems but they can be made negligible by making the offset arbitrarily small. This offset that we have chosen is one scale bit off the actual layer level. For discussion's sake we will consider an offset one bit above the slicing layer (Style 1). The table below is illustrative.

Part design units: inches
Slice scale factor: 1000
Layer spacing: 20
Vertical location of part in CAD space: 1.000 to 1.100 inches
Location of in scaled units: 1000, 1020, 1040, 1060, 1080, 1100
Locations of intersecting plane for determining boundary vectors in scaled units: 1001, 1021, 1041, 1061, 1081, 1101
Layer designations associated with boundary vectors: 1000, 1020, 1040 1060, 1080.
Note: The original object was 100 mils tall; if we would have obtained boundary vectors right at the slicing layer we would have had six layers (to be built at 20 mils each) forming a 120 mil object, but since we sliced 1 bit above the slicing layer we end up with only five layers (to be built at 20 mils each) forming a 100 mil object.

The vertical offset for obtaining boundary vectors creates one potential problem: If the part has a near horizontal boundary at a particular layer then if we obtain the boundary vectors from one bit above the layer they may be considerably different from the vectors that would have been formed if the boundaries were obtained from the exact slicing level. This problem can be minimized by making the one bit offset extremely small compared to the part dimensions.

The offset described above avoids several potential difficulties: The first is that the object's vertical dimensions would be otherwise distorted. These distortions can take several forms: the overall height of the part would be one layer too tall, the bottom of all vertical openings would be placed one layer too high relative to the bottom of the part, and all these openings would be one layer shorter than desired. All of these distortions can be summarized by stating that all up facing features will be one layer too high relative to all down facing features.

The second problem deals with misplaced cross-hatch vectors (while using one of our hatching algorithms). This is manifested in two ways, one is lack of consistency in generating cross-hatch for supporting up facing flat skin, the second way is the drawing of stray cross-hatch vectors running through hollow places within the object and/or cross-hatching missing from within the walls of the object.

Figure 23C:
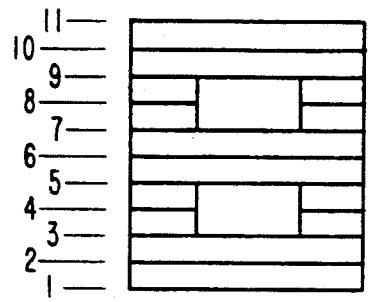
FIG. 23c illustrates a side view of a CAD designed object with internal features (windows) after rounding has occurred.
Figure 23D:
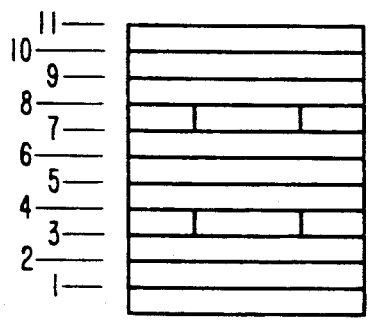
FIG. 23d shows a side view of the same object after being built from obtaining boundary vectors at the slicing layer.
Figure 23E:
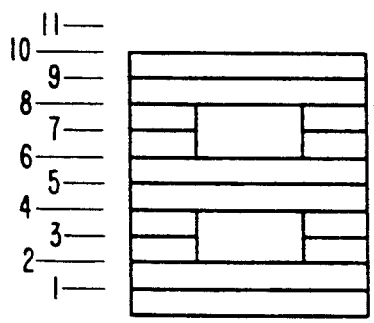
FIG. 23e is a side view of the same object after being built from obtaining boundary vectors at one bit above the slicing layer.

FIG. 23c illustrates a side view of a CAD designed object with internal features (windows) after rounding has occurred. FIG. 23d shows a side view of the same object after being built from obtaining boundary vectors at the slicing layer. FIG. 23e is a side view of the same object after being built from obtaining boundary vectors at one bit above the slicing layer.

Two data manipulation process algorithms for generation of cross-hatch have proven particularly useful in the practice of the present invention. The first algorithm is based on an on-off switching of cross-hatch as layer border vectors are encountered. The second algorithm is based on knowing where the solid portion of the object is and, therefore, where cross-hatching should be placed based on the direction that normal vectors point.

At this point, we define three types of cross-hatch along with two options of implementing them. The types of hatch are 1) hatch that runs parallel to the X-axis, 2) hatch that runs parallel to the Y-axis, and 3) hatch that runs at 60 degrees and 120 degrees to the X-axis.

Given a slice scale factor the spacing between the hatch vectors is based on the number of bits specified in the slice command line for the parameters −Hx, −Hy, −Ha defined below.

---

Spacing between hatch vectors that run parallel to the "X" axis - option = −Hx (number).
Spacing between hatch vectors that run parallel to the "Y" axis - option = −Hy (number).
Spacing between hatch vetors that run parallel to lines 60 degrees to the "X" axis, and vectors that run parallel to lines 120 degrees to the "X" axis - option = −Ha (number).
Allowed minimum intersect angle between cross-hatch and any boundary vectors that it would contact - option = −MIA (number).

The methods of implementing the hatch vectors are 1) implement all generated hatch or 2) implement only those hatch vectors that intersect both boundaries at angles greater than that specified with the slice command —MIA. Using the MIA option allows one to generate near-radial (nearly perpendicular to the boundaries) cross-hatch which can be an advantage in the case of objects that are prone to curl.

The locations of hatch paths are fixed in scaled CAD space. For this to be true, one hatch path for each orientation must be fixed with the other hatch paths being separated from each other by the number of bits specified in the "H" options. These fixed hatch paths are the paths parallel to the hatch directions that go through the origin. This implies that all hatch vectors lay over hatch paths from previous layers; therefore, it does not matter where a part is designed in CAD space, hatch will be built about hatch. This is especially important for near-radial cross-hatch. By definition, near-radial cross-hatch is lacking a considerable amount of perpendicular hatch that could otherwise be used as support for hatch on upper layers.

The aforedescribed process works well, but may encounter difficulty in deciding where to put hatching when the hatch path intersects a boundary at the junction of two vectors. This problem manifests itself by sometimes not hatching in areas where it should (causing weakening of the part) and by sometimes hatching in areas of hollow where there should be none (known as stray vectors). In order to minimize the misplacement of hatch a possible feature to add to the algorithm would allow only the drawing of hatch when an even number of boundary intersection points are encountered on a hatching path: whereas now, the algorithm just ignores the last intersection point if it is odd (hatch will not turn on and run until it runs out of space). Another feature added to the algorithm to minimize misplacement or non-placement of hatch vectors involves a determination of the slope (in the XY plane) of each of the boundary vectors that was used in the determination of an intersection point. If an intersection point is listed more than once the slopes associated with it are used to determine how to interpret the point. If a point is derived from two vectors with the same sign (+ or −) of slope the point is considered a boundary. If the slopes have the opposite sign the point is ignored.

The second process is based on using the normal vectors supplied with each triangle in the STL file. When layer borders are created each vector created is derived from a triangle that intersects a horizontal plane one bit above the slicing layer.

Each boundary vector is stored as a beginning point (x,y) and an ending point (x,y) and associated with each vector are six attributes. These attributes describe the orientation of the normal vector that is associated with the triangle from which the vector was obtained. These six attributes are 1) did the normal point along the positive x axis? (true or false), 2) did the normal point along the −x axis?, 3) did the normal vector point along the +y axis?, 4) did the normal vector point along the −y axis?, 5) did the normal vector point along the +z axis?, 6) did the normal vector point along the −z axis. When we determine where to place hatch vectors we still use intersections of a hatch path with boundary vectors to trigger our need to make a decision, but now we base whether or not we turn on or off the hatching based on whether the normals indicate we are going into or out of solid. What actually happens is that we determine the point that each boundary vector intersects the hatching line and we put this point in a list along with its normal information. This is done with each boundary vector for each hatch path. Each point is evaluated as to whether it indicates that hatch should be turned on or off or continued in the same state. The present utilization of this algorithm is based on original normals supplied by the STL file and not on normals recalculated after rounding of triangles to scale bits and slicing layers has occurred.

Of course, during rounding, some triangle normals may change quadrants even to the extreme of flipping 180 degrees. Therefore, an improved algorithm will involve a recalculation of normals after rounding. Actually, cross-hatch uses only the X and Y components of the normal, so for the sake of proper placement of cross-hatch we need only recalculate the horizontal components, and not the vertical components of the normal vectors. Recalculation of the vertical components must be based on how the recalculation will affect the vector types that use it. Also the present algorithm involves turning on the hatch if a boundary is intersected that contains a normal indicating that the hatching line is intersecting solid, whether or not other normals at the same point indicate that one is entering hollow. After hatching is on, it stays on until a boundary point is intersected that contains only normals that indicate the entering of hollow. So the present algorithm favors hatch staying on when a boundary that contains conflicting information is intersected. This algorithm can be improved by the recalculation of normal vectors after rounding, as mentioned earlier, and by taking the algebraic sum of the signs of the directions indicated by the normals when a point is listed more than once. If the sum is less than zero the hatching turns on or continues on, if the sum is greater than zero the hatching turns off or continues off, and if the sum is zero the hatching continues on the same state whether on or off. It must be remembered that evaluation of points for hatching occurs starting with the smallest point and working toward the larger points along a given hatch path.

The second algorithm, as well as its proposed alternative, can cause the misplacement or non-placement of hatch vectors if separate objects that overlap in space are STL'd together. Since these situations represent physically impossible objects, the CAD designer should be able to avoid them when creating STL files. If, for design convenience, an overlapping of objects would be convenient, the objects should be STL'd into separate files and sliced separately. The present as well as the proposed algorithm can cause the misplacement of vectors if dimensions of features or hollows in CAD space cause them to collapse in some manner (due to chosen scale or layer thickness), thereby forming a double skin in some regions of an object. The formation of misplaced hatch vectors has a different source for these two algorithms.

The present algorithm can misplace hatch the entire distance along the collapsed region except at the starting and ending points of boundary vectors, at these points it will make the right decision some of the time. However, the alternative algorithm will make the proper decision at every point along the collapsed region except at the starting and ending points of boundary vectors, at these points it will make the right decision a portion of the time. Therefore, it is not advisable to design parts that have regions where collapse can occur, but if this is not possible the alternative algorithm will at least reduce the likelihood of stray vectors (from the abovementioned source). The present algorithm can misplace hatch vectors when a hatch line intersects a boundary at a junction point where two or more boundary vectors meet. However, the improved algorithm will not misplace vectors in this situation.

All three algorithms implement cross-hatch along the X-axis only. To derive hatch parallel to the Y-axis the part is rotated 90°, hatched along the new X-axis and then rotated back. To derive 60° and 120° hatch the object is rotated 60° and 120°, respectively, hatched along the new X-axis, then rotated back into place.

Figure 24:
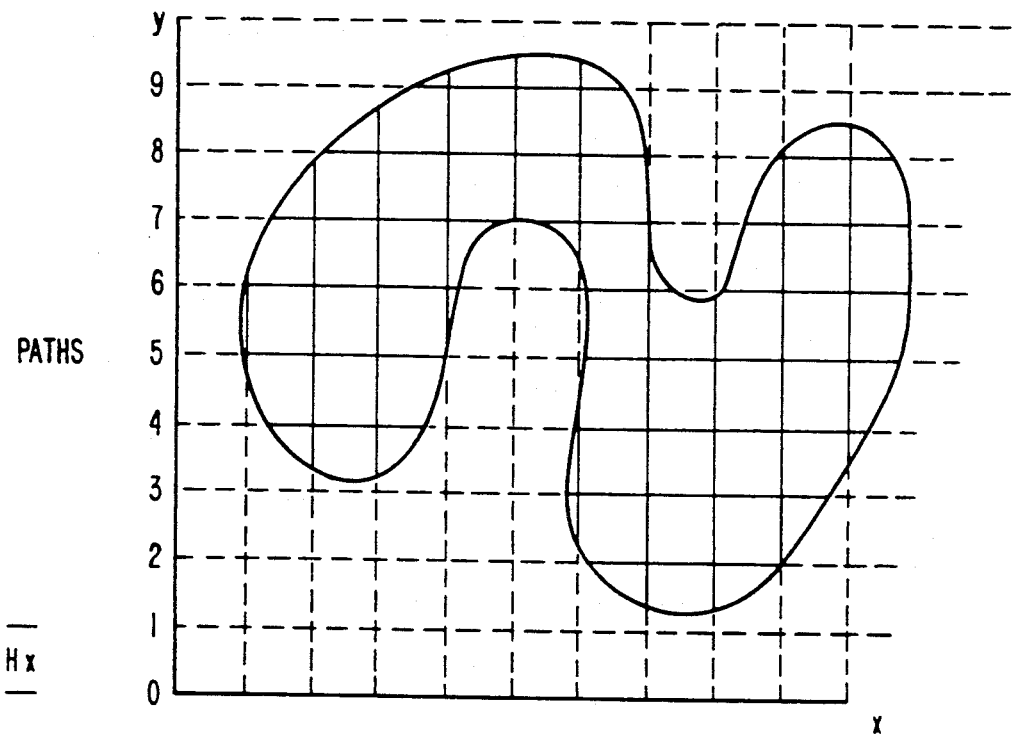
FIG. 24 is a top view of a cross-section of an object showing how hatch paths are determined.
Figure 24A:
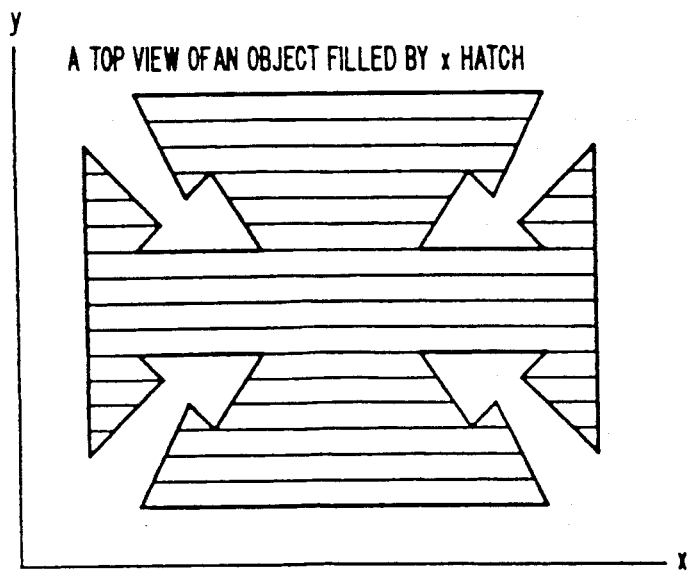
FIG. 24a is a top view of an object filled by X hatch.
Figure 24B:
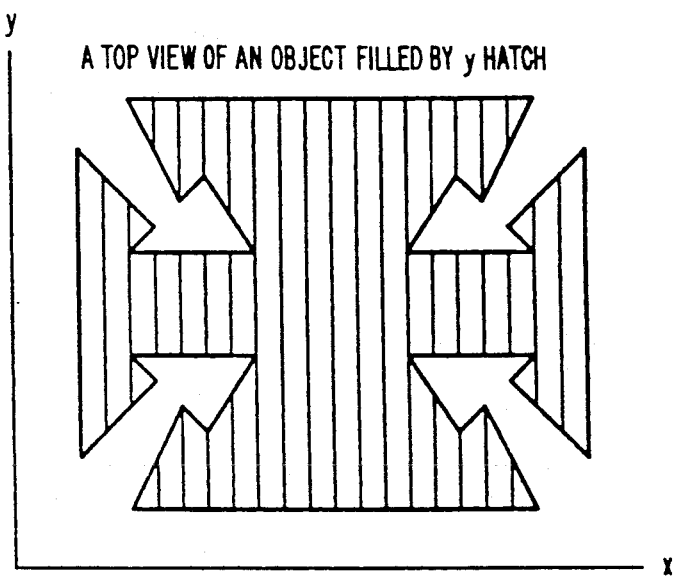
FIG. 24b is a top view of an object filled by Y hatch.
Figure 24C:
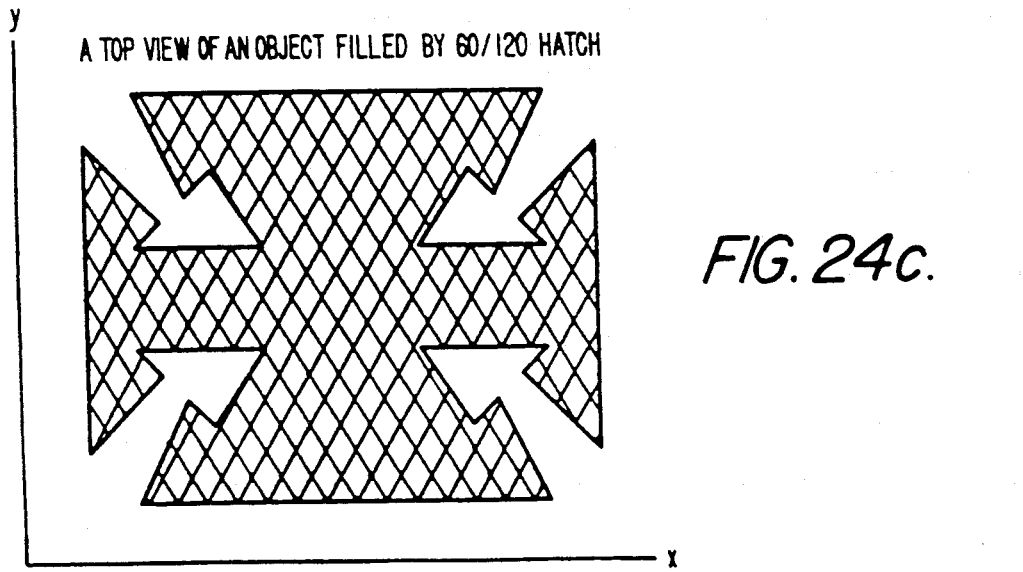
FIG. 24c is a top view of an object filled by 60/120 hatch.
Figure 24F:
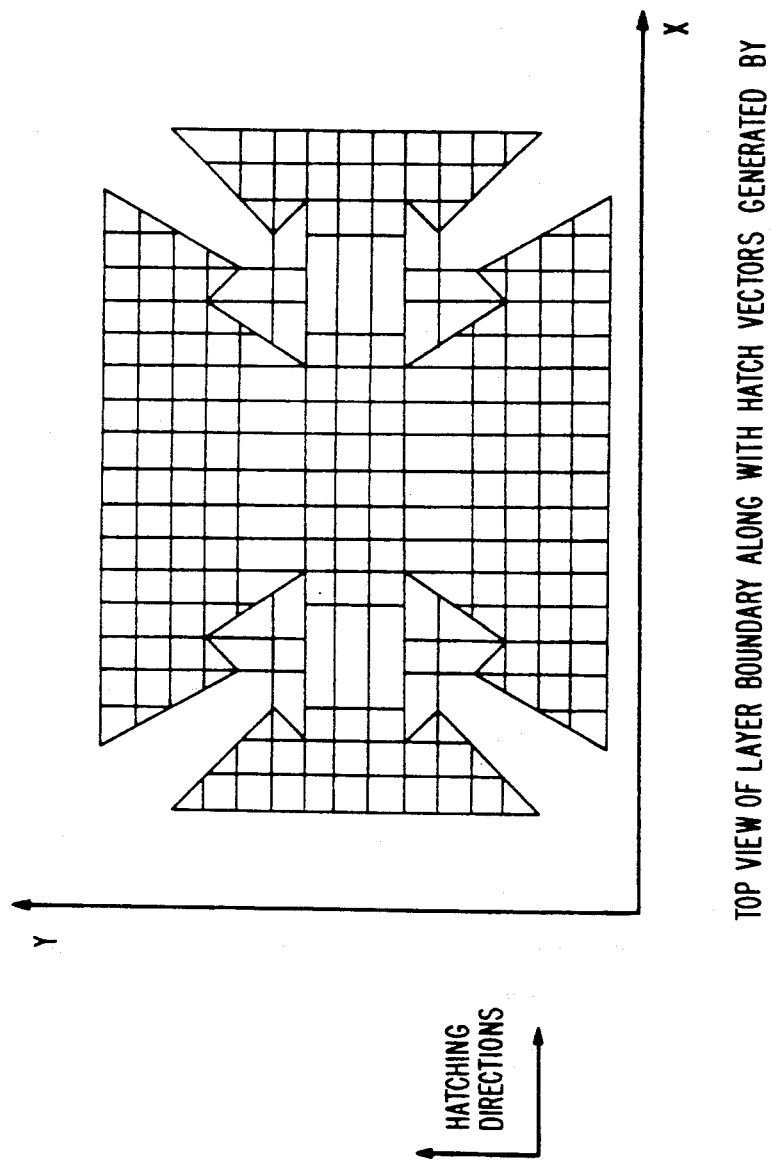
FIG. 24f is a top view of a layer of boundary vectors along with hatch vectors generated by a first algorithm (X and Y)
Figure 24G:
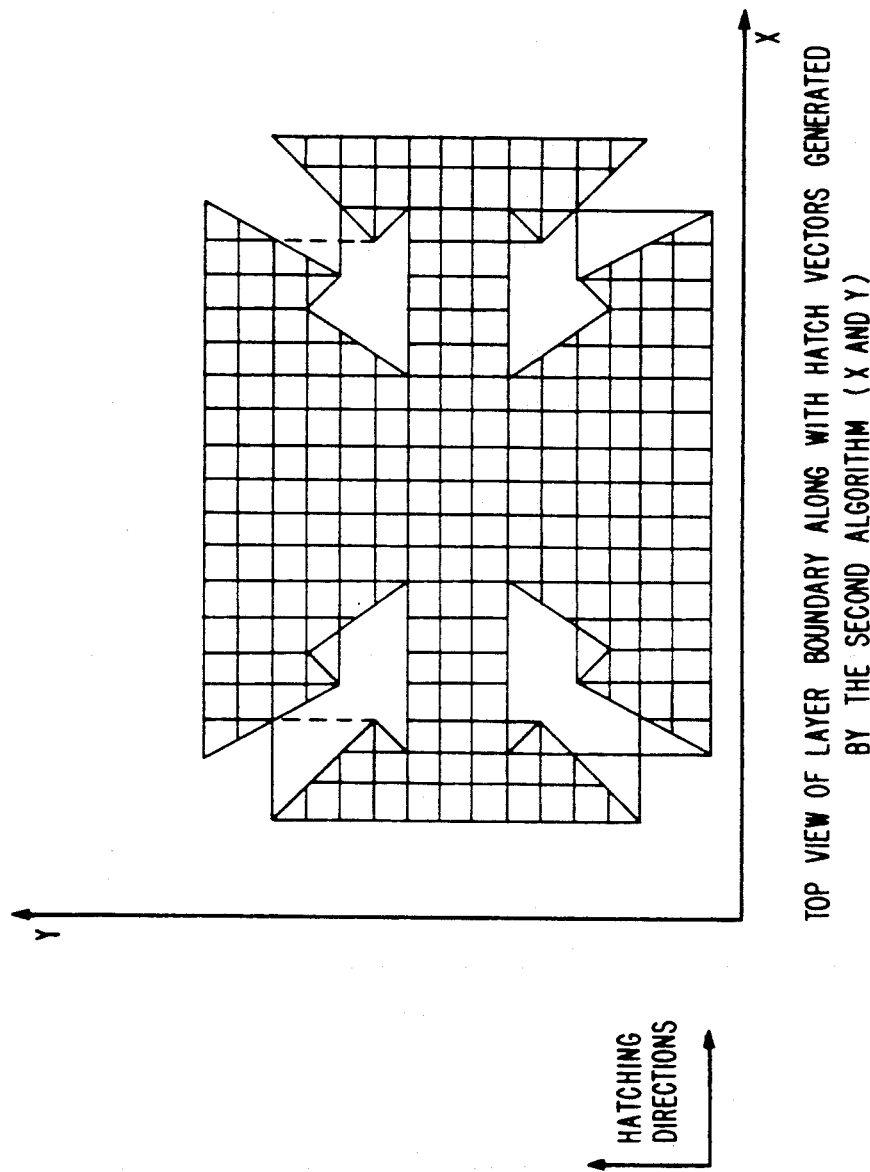
FIG. 24g is a top view of boundary vectors along with hatch vectors generated by a second algorithm (X and Y)
Figure 24H:
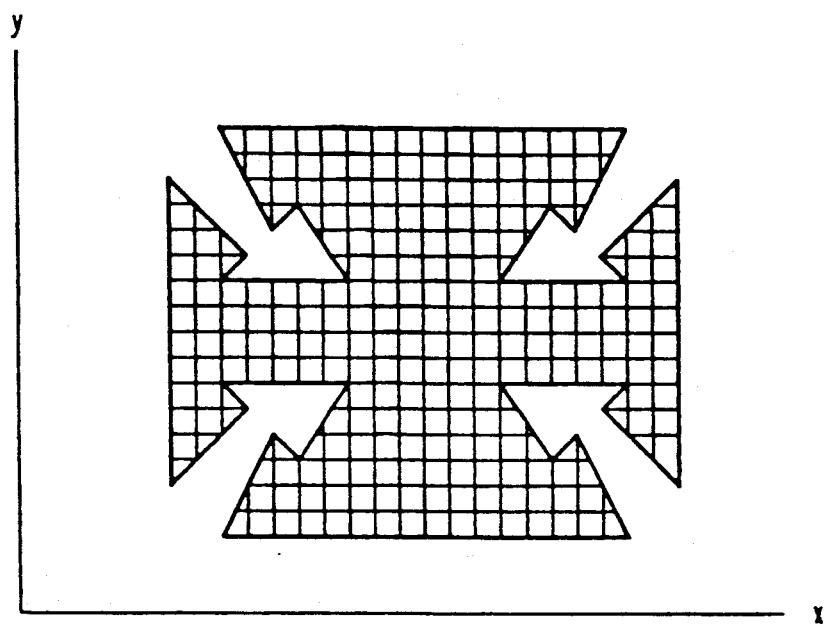
FIG. 24h is a top view of a layer of boundary vectors along with hatch vectors generated by still another algorithm (X and Y)
Figure 24I:
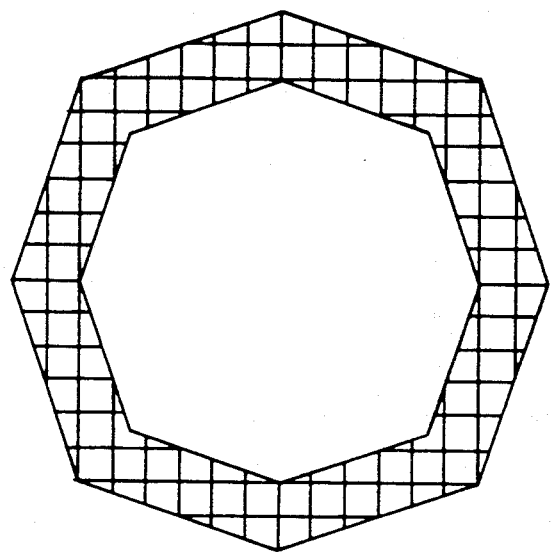
FIGS. 24i and 24j are top views of cross-sections of an object hatched using various MIAs.
Figure 24J:
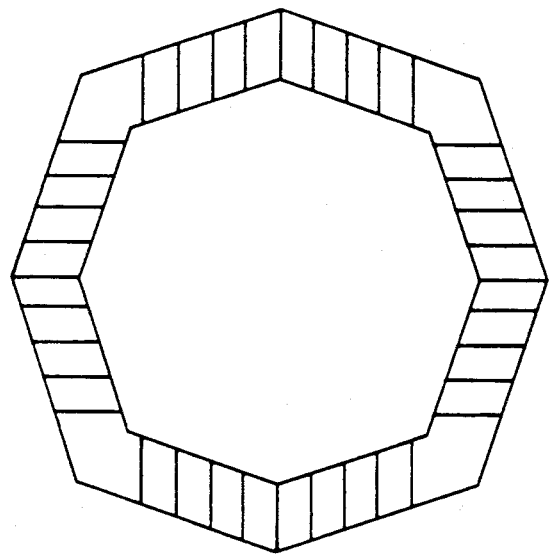
Figure 24K:
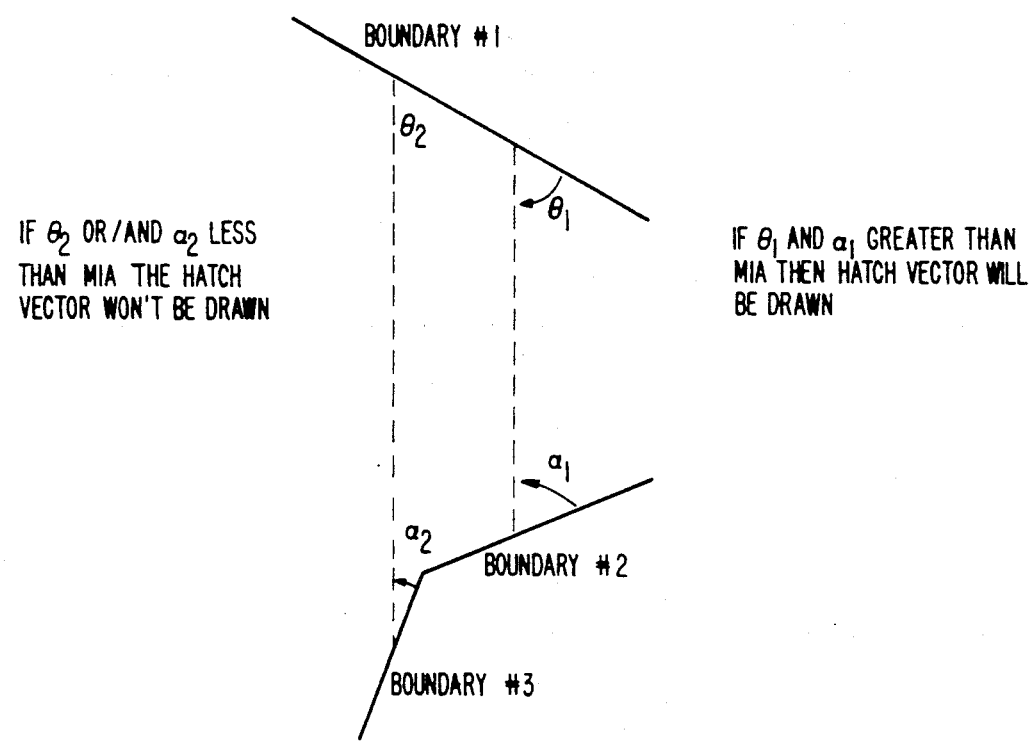
FIG. 24k is a schematic boundary diagram.

FIG. 24 is a top view of a cross-section of an object showing how hatch paths are determined. FIG. 24a is a top view of an object filled by X hatch. FIG. 24b is a top view of an object filled by Y hatch. FIG. 24c is a top view of an object filled by 60/120 hatch. FIG. 24d is a top view of a layer of an object completely filled in its solid regions. FIG. 24e is a top view of a layer of an object properly filled in by cross-hatch (X and Y). FIG. 24f is a top view of a layer of boundary vectors along with hatch vectors generated by the first algorithm (X and Y). FIG. 24g is a top view of boundary vectors along with hatch vectors generated by the second algorithm (X and Y). FIG. 24h is a top view of a layer of boundary vectors along with hatch vectors generated by the proposed algorithm (X and Y). FIGS. 24i and 24j are top views of cross-sections of an object hatched using various MIAs. FIGS. 24k is a schematic boundary diagram.

There has been some consideration of using a special normal vector to indicate that a boundary should not be considered when determining cross-hatch. This might be a normal vector of zero length (0,0,0). This normal would indicate that a particular triangle has no preferred orientation with regard to one side bounding solid and the other bounding empty space. This could be useful in building many objects, but we must spend a little time considering how to and when to implement it. Problems to be considered include: 1) how to specify in CAD or otherwise which triangles are regular and which are not, 2) how to insure triangles that form closed loops are of one type only, 3) how would tangent following be implemented (vector offsetting to account for line width), 4) would hatch associated with near-flat and flat boundaries still be used, etc.

Flat skin is generated from completely horizontal triangles. A horizontal triangle is one which has all three vertices at the same layer. Rounding of triangle vertices may produce flat triangles from triangles that were not originally horizontal. The first step in forming flat skins is to separate them into two groups, one consisting of up-facing triangles (up-pointing normals) and the other consisting of down-facing triangles. The triangles in each group are then ordered according to the layers which they belong to. Next, the edges of each triangle which belong to a particular layer are interpreted as boundary vectors for flat up or downfacing skin. These boundary vectors continue to tessellate an area of skin into a group of triangles. We next remove all pairs of duplicate boundary vectors. This leaves us with flat skin boundaries that form a closed loop around an area of skin. These boundary vectors are then filled with very finely spaced cross-hatch (fill) vectors being separated perpendicularly by the number of bits specified by the −hfx or −hfy options of slice. This procedure of creating boundaries and fill for flat skins is repeated for both up-facing and down-facing horizontal triangles for each layer of the object.

The filling of the flat skin boundaries is based on the same algorithms as mentioned for cross-hatching above. Therefore, the intersection of a fill line with a boundary triggers the need for a decision to be made as to whether to turn on fill, turn off fill, or continue as is. The decision on what to do is again based on either an odd-even turn on/turn off condition or on the consideration of the direction normal vectors associated with each boundary segment (vector). For layer hatching the normal associated with each vector is derived from the triangle it was obtained from, whereas the normal associated with each flat triangle points only in the vertical direction and therefore cannot be used to determine any characteristics designating the inside or outside of the triangle. The technique used to determine the segment 2-D normals for a flat skin boundary is based on the analysis of the three vectors that make up the boundary of a triangle as a group. The technique is to compare the coordinates of the vertices making up a vector to those of the third point of the triangle to determine which way is outside the triangle (relative to the vector). This information along with the slope of the boundary vector is sufficient to determine the proper 2-D normal direction. This same procedure is done for each of the segments that form the boundaries of a triangle. The normal is then reduced to designate which quadrant it points in and that information is saved with the boundary segment data (beginning and end points). This procedure is repeated for all flat triangles. Then all pairs of duplicate boundary vectors are removed for a given skin type on a given layer. The fill vectors can then be calculated using the same algorithm previously described for hatch vectors.

Skin fill always runs parallel to the X or Y axis so it sufficient to know what quadrant a normal points to determine whether it indicates the entering of hollow or solid. This argument is true for hatch as well, since the algorithms are the same. But when we consider 60/120 hatch knowing the quadrant in which a normal points is not sufficient to determine accurately whether one is entering or leaving solid. When hatching is done along the 60° or 120° line, we can consider the part to be rotated counterclockwise 60 to 120 degrees we can consider the axis to be rotated clockwise 60 or 120 degrees so that we can still use X and Y normal indicators to determine whether or not solid or hollow is being entered. But, in doing this rotation, we must not forget to recalculate the new quadrants in which the normals point.

Just as fill is determined for flat-skin we could determine cross-hatch if needed.

Figure 25B:
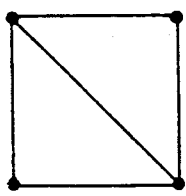
FIG. 25b shows a flat boundary derived from flat triangles.
Figure 25A:
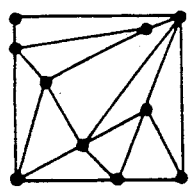
FIG. 25a illustrates vertices of flat triangles.
Figure 25C:
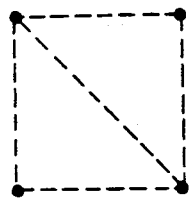
FIG. 25c illustrates flat boundaries with pairs of duplicate vectors removed.
Figure 25D:
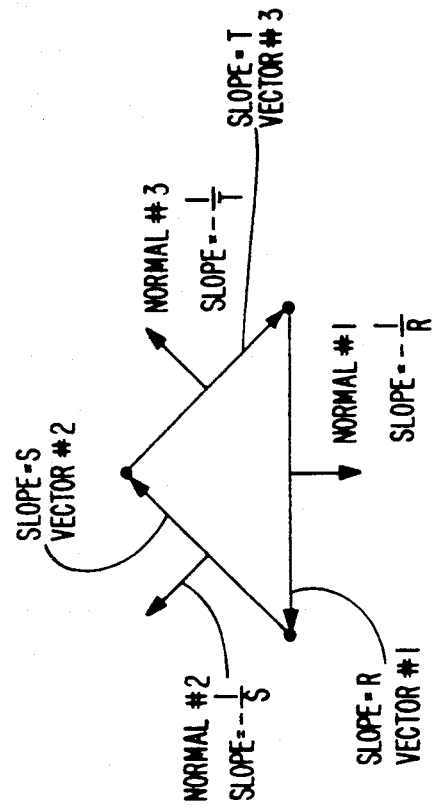
FIG. 25d shows a flat triangle with boundary vectors and two-dimensional normals.
Figure 25E:
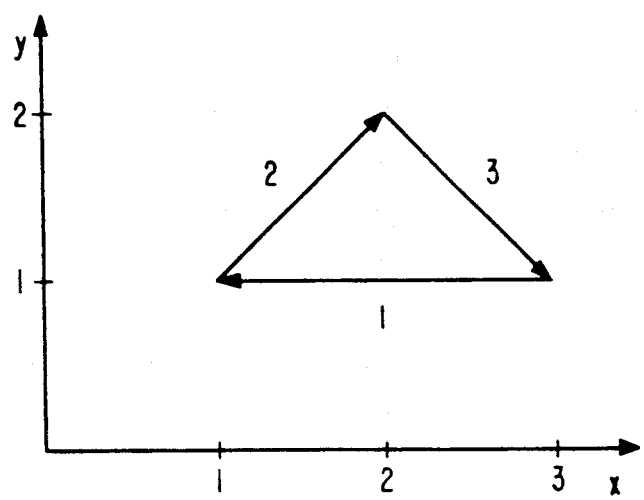
FIG. 25e shows a flat triangle with vector list.

FIG. 25a is vertices of a flat triangles. FIG. 25b is a flat boundary derived from flat triangles. FIG. 25c is a flat boundaries with pairs of duplicate vectors removed. FIG. 25d is a flat triangle with boundary vectors and two-dimensional normals. FIG. 25e is a flat triangle with vector list.

A further improved technique of generating skins is based on the original direction of the vertical component of the triangle normals as supplied in the STL file. Problems may occur when flat triangles on the edge of a flat surface flip over after rounding to vertices. These problems might occur because the segment normals associated with skin boundary vectors (from flipped triangles) may end up pointing toward the area requiring skin instead of away from it. This, in turn, can cause the misplacement of hatch or fill vectors.

Figure 25F:
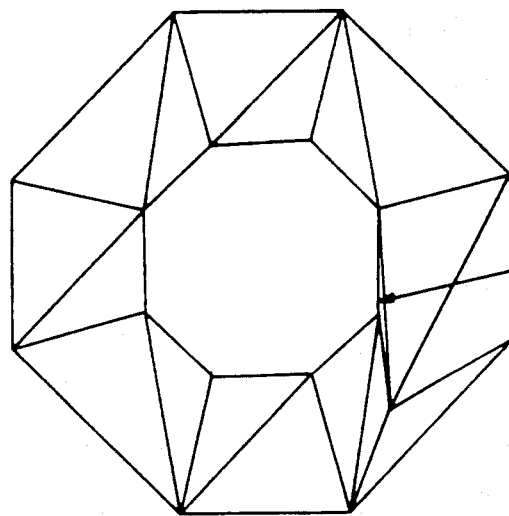
FIG. 25f is a top view of a flat skin surface and the triangles forming the surface.
Figure 25G:
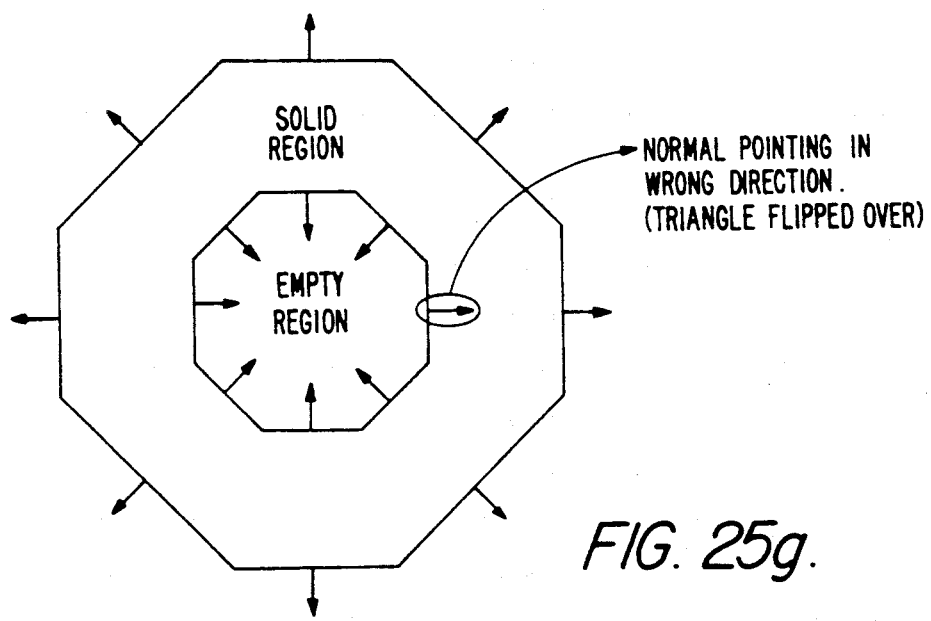
FIG. 25g is a top view of the flat skin surface with duplicate pairs of vectors removed, along with one edge triangle flipping over, and how its normal points in the opposite direction to the other segment normals forming the boundary.

FIG. 25f is a top view of a flat skin surface and the triangles forming the surface. FIG. 25g is a top view of the flat skin surface with duplicate pairs of vectors removed, along with one edge triangle flipping over, and how its normal points in the opposite direction to the other segment normals forming the boundary.

Two known possible solutions to this problem exist. The first solution is based on considerations similar to those used to develop the normal-sign summation hatching process. Six situations can develop when flat triangles flip over: 1) the flipped triangle forms a single flat surface, 2) the flipped triangle forms a single and a double flat surface, 3) the flipped triangle forms a double surface only, 4) the flipped triangle forms a double and a triple surface, 5) the flipped triangle forms a triple surface only, and 6) other situations that can develop between flat triangles involve features collapsing to single layers, yielding flat up and down-facing triangles covering the same area on a single layer. These situations are very similar to those used to develop the normal-sign summation hatching process. The only difference is that overlapping boundaries are one dimensional whereas the areas covered by overlapping triangles are two dimensional. In essence, the summation technique used for layer hatching computes the net boundary at the intersection of boundaries with hatch paths, whereas the technique for skinning is based on determining net normals for areas based on addition of areas with like normals and subtraction of areas with opposite normals (up-facing, and down-facing). Then the determination as to whether an area receives up-facing skin, down-facing skin, or no skin is based on whether the net normal of the areas points up, down, or does not exist. For this to work, the directions of the normals must be determined after distortion of the triangles.

This process yields skin boundaries and fill perfectly matched to features (distorted) requiring particular types of skin (up or down). This process is based on the assumption that no area on a single layer (layer of creation not layer of drawing) can require both up and down skin. This implies that a feature that is originally less than one layer in thickness might be lost.

The second solution process is based on computing segment normals a second time after duplicate pairs of boundary vectors are removed. This recomputation would be based on the consideration that the majority of the segment normals on any closed boundary loop were correct the first time they were created (from their triangles) but that a minority of them are wrong. Or better yet, on the assumption that the segment normal from a non-flipped triangle is correct and all other segment normals can be made to match it. This method of recomputation is based on the vector ordering procedure described subsequently herein in greater detail. Once the vectors are ordered, the cross product of all boundary vectors (forming a given loop) with their segment normals should be consistently up or down for a given closed loop. With this knowledge, a comparison between cross products is made, and then any unusual segment normals reversed.

Some of the above assumptions might be inapplicable if boundaries are not closed, or two closed boundaries join. A list of possible skin configurations is shown below with a statement as to how this algorithm will form that skin: double surface—area properly skinned, single surface—area skinned properly, single/double—possibly one or both areas improperly skinned along with the possibility of miss-skinning other areas also, triple surface—area skinned properly, and double/triple—area skinned properly. Therefore, this second technique has only one problem: single/double surfaces. The possibility of forming a single/double surface is very small, because the formation of a double/single surface implies that only two triangles are involved in the situation and that the one that did not flip is narrower than the one that did.

There is an algorithmic process for reducing the remaining problem further. The problem with single/double surfaces is that after elimination of duplicates we have only two crossed triangular shaped single surfaces left, but those single surfaces share two vectors and two vectors need one normal for one triangle and the opposite normal for the other. Whenever boundary vectors cross we need one segment normal on one side of the cross and the opposite normal on the other side. The solution is based on the detection of crossing boundaries, then dividing the vectors that cross into vectors that end at the intersection point, and then reordering the new vectors. In this reordering special care must be taken in order to insure that boundary lines are not crossed and therefore insuring that the new loops are traversed properly. This is also true for two boundary loops that touch at a vertex point. Intersection and touching can be determined by the same algorithmic process. Then loops can be formed by requiring that at the intersection point the loop not be formed by crossing boundaries but by proceeding to the boundary vector that forms the smallest angle with a last vector, and breaking off loops when they are completed. FIG. 25h'-25h'''' is a top view of flat triangles forming single/double surface before flipping, after flipping, with segment normals, after cancellation of duplicate pairs, after splitting of vectors, and after loop determination (two).

In building objects we generally consider the objects to have solid portions and hollow portions. Walls wider than two cure widths are created by boundary vectors forming side surfaces and filling in between the boundaries with cross-hatch. If the vertical slope of a wall is over one cure width wide for each layer thickness then a gap will be formed between the boundary vectors on the two layers. This gap can cause the drainage of liquid from between wall surfaces. The problems of gaps between boundaries is solved by the concept of near-flat skin. Near-flat skin also solves the problem of making the transition from vertical to horizontal features.

This method of filling in the area between the boundaries of consecutive layers can be implemented in several ways. One of the simpler ways of generating fill vectors is based on the realization that areas that require near horizontal skin will be represented by triangles whose normals are within a certain angle of the vertical. This angle (MSA—minimum surface angle) is presently defined by the operator and is based on the angle at which two boundary vectors drawn on consecutive layers would no longer overlap. This is further based on the cure width of the segments forming the boundaries and the layer thickness.

Figure 26B:
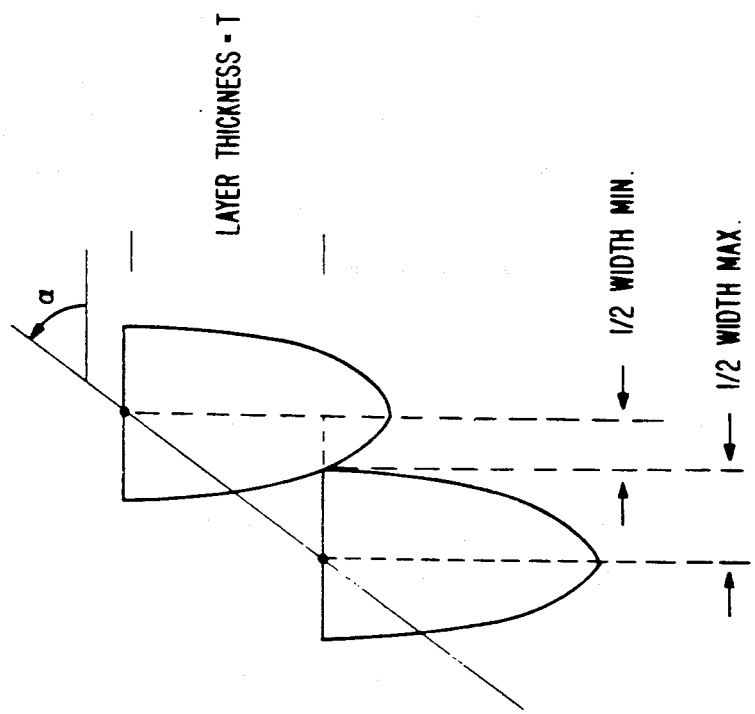
Figure 26C:
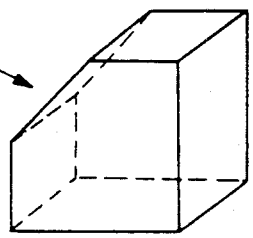
FIG. 26c shows a part requiring near-flat skin.

FIGS. 26a and 26b are side views of boundaries on two consecutive layers and the associated variables for determination of the MSA. FIG. 26c is a part requiring near-flat skin (the test box).

Since individual triangles can be analyzed to determine the need for near-flat skin we can process these specific triangles to yield boundary vectors for this skin. It would be difficult to base the development of near-flat skin on differences between layer boarders from one layer to the next. Also, to consistently determine the proper near-flat fill, this fill must be generated from the intersection of near-flat triangles right at the slicing layers not one bit up or down. As with all fill and hatch vectors we must first determine the boundaries between which we want to fill. Once these boundaries are determined, the fill will be based on the same algorithms on which layer hatch and flat skin fill are based.

By having the triangle vertices land on slicing layers, we are insured that if a triangle affects the fill between two layers it will have components that either land on each layer or at least intersect each layer. A situation cannot develop in which a triangle will affect the region between two layers and only cross one of them. Since a triangle crosses both layers, we can generate two vectors from the intersection of the triangle with the two layers. These two vectors form two opposing sides of a trapezoid, or of a degenerate trapezoid (triangle).

Figure 26D:
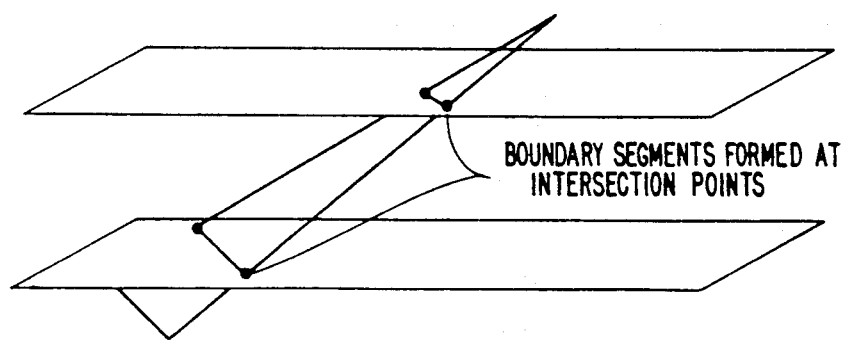
FIG. 26d shows near-flat triangles intersecting two layers and; the first two boundary vectors being formed (three cases)

FIG. 26d is a near-flat triangle intersecting two layers and first two boundary vectors being formed (three cases).

The remaining two sides of the trapezoid are formed by producing straight non-intersecting lines from the endpoints of the first segment to the end points of the second segment. Now we have formed a two-dimensional boundary (in a plane) from a particular near-flat triangle that can be filled with skin and/or hatch. The next step is to determine the segment normal vectors associated with each of these boundary vectors to clarify what is inside and what is outside of the trapezoid. This determination is very similar to that which was done for flat skin boundaries.

First, the vertical component of the normal of the near-flat triangle, which generated the trapezoid, is used to determine whether the trapezoid belongs to up-facing or down-facing near-flat skin. The segment normals for each trapezoid boundary are calculated by noting that the slope of the segment normal vector is the negative reciprocal of the segment slope and its direction is away from the remaining two points of the trapezoid. Remember that the information for the segment normal is only stored (after calculation) 6 bits indicating whether it has components along the positive or negative directions of the three axes. Normals are determined for each of the sides of the trapezoid. This procedure is then repeated for each of the layers that each near-flat triangle intersects.

At this time all degenerate boundary vectors (the point vectors that turned some trapezoids into triangles) are removed. Following this, all pairs of duplicate boundary vectors of each type of each layer are removed. After removal of duplicate vectors we are left with complete boundaries of near-flat skin with associated segment normals indicating inside and outside of the boundaries. These boundaries can now be filled using either of the hatching algorithms. Near-flat hatch vectors generated will have the same characteristics as those of layer hatch and the near-flat skin fill vectors will have the same characteristics of flat skin fill. The concept of where to place near-flat skin after it has been created will be discussed in the next section.

Figure 26F:
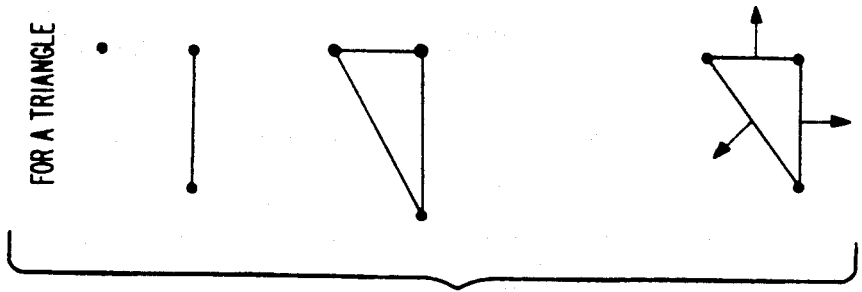
FIG. 26f is a top view of a trapezoid showing relationships between segment normals, boundaries, and inner and outer portions of the trapezoid.
Figure 26E:
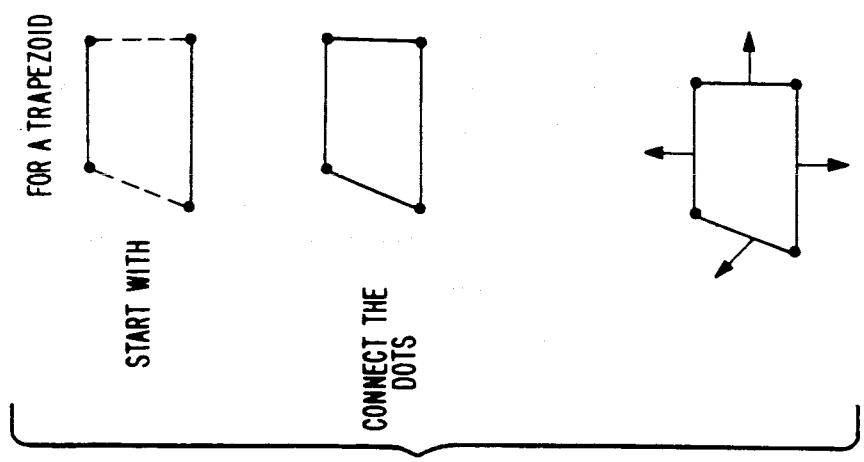
FIG. 26e is a top view of near-flat boundary vectors for a trapezoid and a triangle being completed.
Figure 26G:
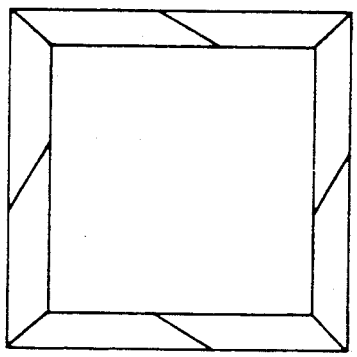
FIG. 26g is a top view of near-flat skin triangle boundaries before removal of pairs of duplicate vectors.
Figure 26H:
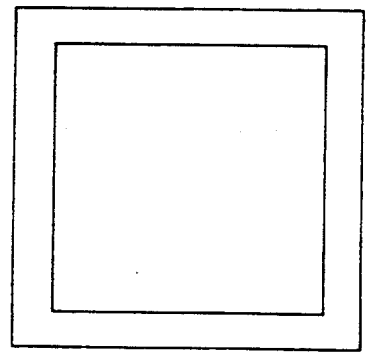
FIG. 26h is a top view of a near-flat skin boundary after removal of duplicate vectors.

FIG. 26e is a top view of near-flat boundary vectors for a trapezoid and a triangle being completed. FIG. 26f is a top view of a trapezoid showing relationships between segment normals, boundaries, and inner and outer portions of the trapezoid. FIG. 26g is a top view of near-flat skin triangle boundaries before removal of pairs of duplicate vectors. FIG. 26h is a top view of near-flat skin boundary after removal of duplicate vectors.

The same comments made regarding recalculating flat-skin boundary segment normals applies to near-flat boundary segment normals as well.

However, as with flat skin, there are situations in which near-flat skin fill and hatch can be misplaced. These situations come about from the same circumstances described in the comments relating to flat skin previously described. The solutions described in connection with flat skin also can be applied here. However, it should be noted that near-flat skin is much less likely to have problems than flat skin because it is much less likely to have flipped over triangles overlapping other triangles.

Boundary vectors are created from processing triangles that intersect a given layer. This processing of triangles can occur in any order and can therefore produce boundary vectors in any order. When objects are built, the movement of the laser across the liquid surface takes a finite time. During this finite time two things happen: 1) slight curing of the liquid occurs even if it does not produce measurable solid material, and 2) by the time the laser beam has reached a point which it is supposed to cure it may have already received commands to move to a new point, or at minimum it will not sit at this first point for the proper length of time to give it proper cure. Taking these two points into consideration we do not want the laser beam to be jumping any more than it has to. When jumping cannot be avoided it is better to jump over a region of solid than a region of hollow.

It must be remembered that the boundaries form closed loops of vectors; therefore, the location of the head of one vector will always correspond to the tail of another. If we consider boundary vectors to be drawn from tail to head, we can minimize the jumps when drawing boundaries by ordering the vectors so that the first vector is followed by a second vector whose tail is at the same point as the head of the first, and the tail of the third vector is at the same point as the head of the second. This is continued for a given closed loop. The only time the beam needs to jump is when it begins drawing the boundary, when it starts drawing a new loop, and when it finishes the boundary. These statements apply to the ordering used for all types of boundaries.

Figure 27A:
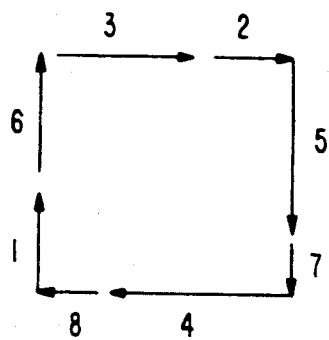
FIG. 27a is a top view of one order for drawing boundary vectors when they are not ordered.
Figure 27B:
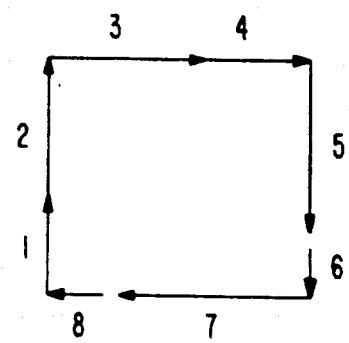
FIG. 27b is a top view of an order of drawing boundary vectors after they have been ordered.

FIG. 27a is a top view of possible order to drawing boundary vectors when they are not ordered. FIG. 27b is a top view of order of drawing boundary vectors after they have been ordered.

Hatch and fill vectors are created from making decisions at the intersection points of hatch and fill paths with boundaries. After creation of hatch or fill vectors, they need to be ordered in a way to give optimum part building conditions (as with boundary vectors). When drawing hatch vectors the number and lengths of the jumps of the laser beam should be minimized. Jumps over hollow areas need to be minimized, whereas jumps over solid areas can be considered less critical. Also hatch types (X, Y, 60/120) should be drawn as groups to insure that stresses on a layer are developed in such a manner to minimize them on the layer as a whole, and to spread them uniformly over all areas so that there are no local area build ups. We need to consider ways of drawing blocks of hatch and fill vectors to minimize jumping. One method is based on a technique of minimizing jumping distance regardless of whether that distance is over solid or hollow. The steps for this method are as follows:

1) Start with any one hatch vector and define its tail head and define it to be drawn from tail to head.
2) Search the remaining hatch vectors for the one that point closest to the head of the first vector.
3) Define this closest point as the tail of vector 2 (vector 2 to be drawn tail to head).
4) Search the remaining vectors for the one that has a point closest to the head of vector 2.
5) Define this closest point as the tail of vector 3.
6) Continue this process until all vectors are ordered.

This procedure will minimize the jumping distance (number of jumps is constant).

This is a reasonable method to minimize the jumping distance but is probably a relatively slow way of ordering the vectors. This algorithmic process does not distinguish between jumping over solid or hollow areas and will only minimize the jumps over hollow areas when the gap of the hollow is greater than the distance from the endpoint of one vector to the starting point of its neighboring vector (see Figure below).

Figure 27C:
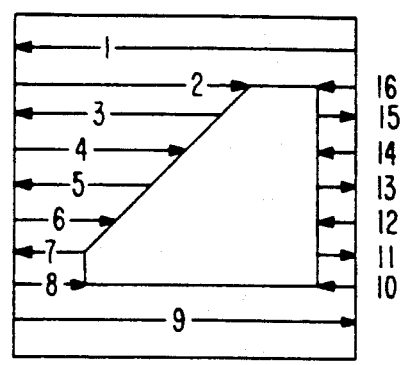
FIG. 27c is a top view of boundaries and hatch show spacing so that the endpoint of one vector is closest to the beginning point of its neighboring vector.
Figure 27D:
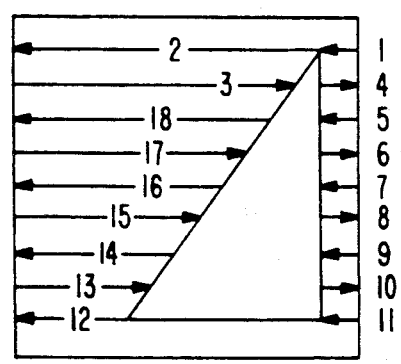
FIG. 27d is a top view of boundaries and hatch showing an endpoint of a vector closer to a beginning point on a vector across a hollow instead of to its neighbor.

FIG. 27c is a top view of boundaries and hatch showing spacing so that the endpoint of 1 vector is closest to the beginning point of its neighboring vector. FIG. 27d is a top view of boundaries and hatch showing that an endpoint of a vector is closer to a beginning point on a vector across a hollow instead of to its neighbor.

The way hatch and fill vectors are ordered in slice is based on a completely different algorithm than the one described. Our present algorithm is based on drawing the first vector derived from the first hatch or fill path followed by the first vector derived from the second hatch or fill path. This process continues until all the paths are covered then the algorithm is repeated this time looking for the second vector on each path, and then the third, until all vectors have been covered. Every other vector is drawn in reverse order so as to minimize the jumping distance. This algorithm keeps the jumps to a minimum and the jumps that do occur are generally over solid as opposed to hollow areas.

Figure 27E:
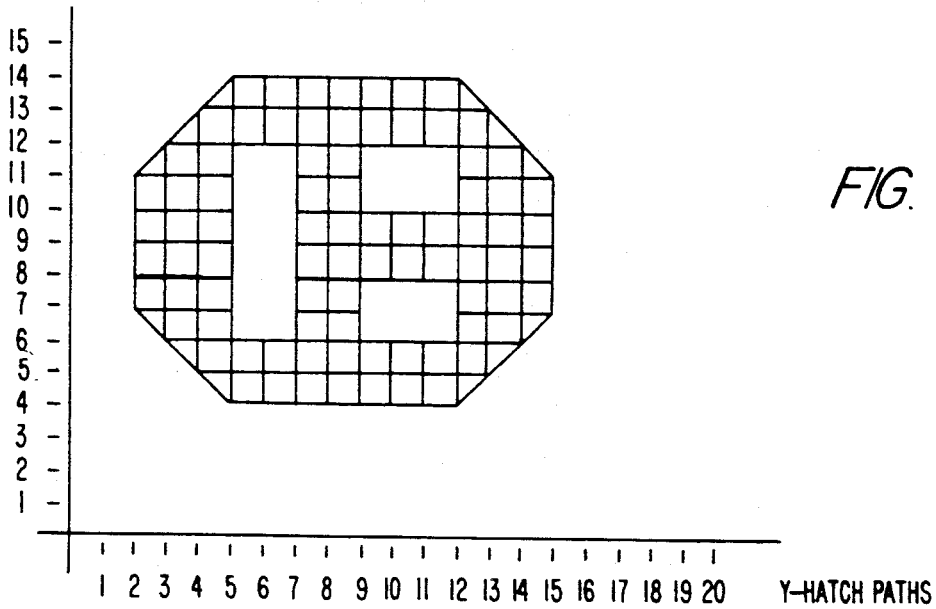
FIGS. 27e-27e' is a top view of boundary and hatch showing an order of drawing of hatch.
Figure 27E:
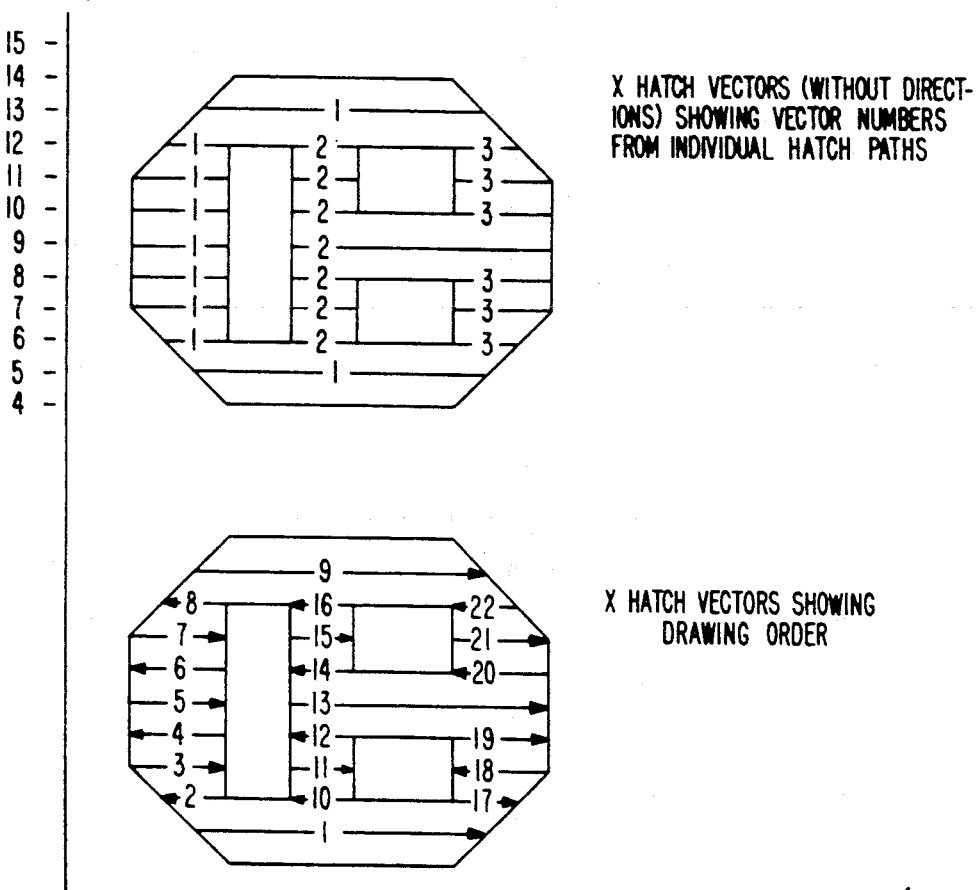

FIGS. 27e–27e' is a top view of boundary and hatch showing order of drawing of hatch.

There are several other algorithms that could be used to order the hatch and fill, but I will only comment on one more. This last algorithm is very similar to the first, but it has one difference. It uses a very small hatch spacing for calculating the drawing order but actually only outputs a portion of the vectors. This portion would be based on the desired spacing and on skipping an even number of dummy vectors so that the drawing order will be proper.

We have analyzed four methods regarding placement of skins. These methods have been designated as Styles 1 though 4. The first two styles (Style 1 and 2) have characteristics that allow the building of any general part; therefore, they have the characteristics of always having solid material on a previous layer that is available to attach to the solid material which is available to attach to the solid material which is being formed on the following layer. Styles 3 and 4, on the other hand, cannot be used to build general parts due to inconsistency in the availability of solid material from the previous layer on which to attach solid material from the present layer. This inconsistency disappears for parts that fit specific requirements, so Styles 3 and 4 can be useful for some classes of parts.

Styles 1 and 2 build parts whose solid areas are slightly oversized in the X and Y dimensions and whose hollow areas are slightly undersized in the X and Y dimensions. The amount to which these solid features are oversized is based on the vertical angles of the normals of the triangles that form the features. If a triangle's normal makes a large angle with the vertical it will cause the features to be only slightly oversized; whereas if a triangle's normal makes a small angle with the vertical it will produce a larger amount of oversizing.

Styles 3 and 4 on the other hand, build parts whose solid features are slightly undersized in the X and Y dimensions and whose hollow features are slightly oversized in the X and Y dimensions. The amount to which these solid features are undersized is based on the vertical angles of the normals of the triangles that form the features. If a triangle's normal makes a large angle with the vertical it will cause the features to be only slightly undersized; whereas if a triangle's normal makes a small angle with the vertical the features will be undersized by a larger amount. The amount of undersizing along with the horizontal separation of features will determine under what conditions Styles 3 and 4 can no longer build real parts and therefore, under what CAD design criteria Styles 3 and 4 can effectively be used.

FIG. 28a is a side view of a CAD designed object. FIG. 28b is a side view of the same CAD designed object built using Style 1 or 2, with the perimeter of a CAD object drawn around it. FIG. 28c is a side view of the same CAD designed object built using Style 3 or 4, with the perimeter of a CAD object drawn around it.

Layer boundary vectors are obtained from the intersection of scan and near-flat triangles with a horizontal plane 1 scale bit above the slice layer. Normals for these vectors are obtained from the triangles they are derived from, if appropriate for later hatching between boundaries. This 1 bit up obtainment of vectors gives the right vertical displacement between down facing and up facing features. This also gives the ability to consistently deal with flat up-facing, flat down-facing, near-flat up-facing, and near-flat down-facing skin based solely on the type of skin not on geometrical relations of features.

Figure 29A:
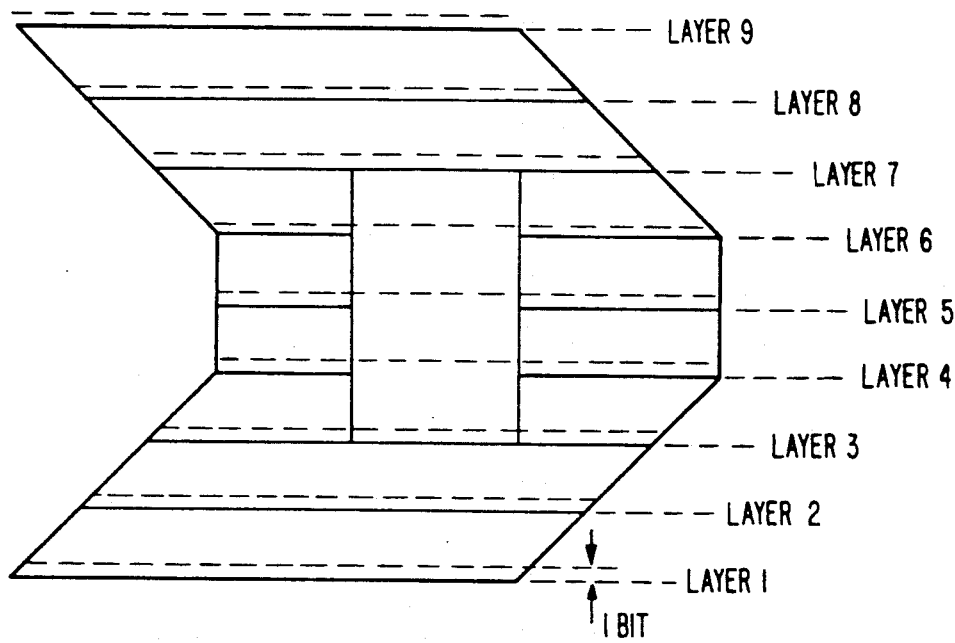
FIG. 29a is a side view of a CAD designed object showing slice layers and planes one bit above the layers where boundary vectors will be obtained.
Figure 29B:
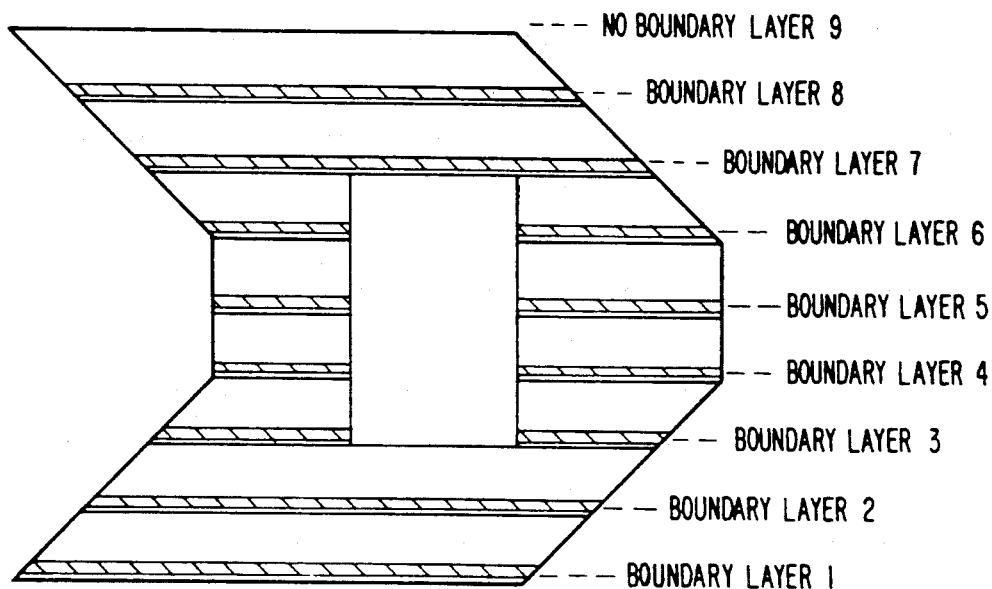
FIG. 29b is a side view of a CAD designed object showing boundary vectors.
Figure 29C:
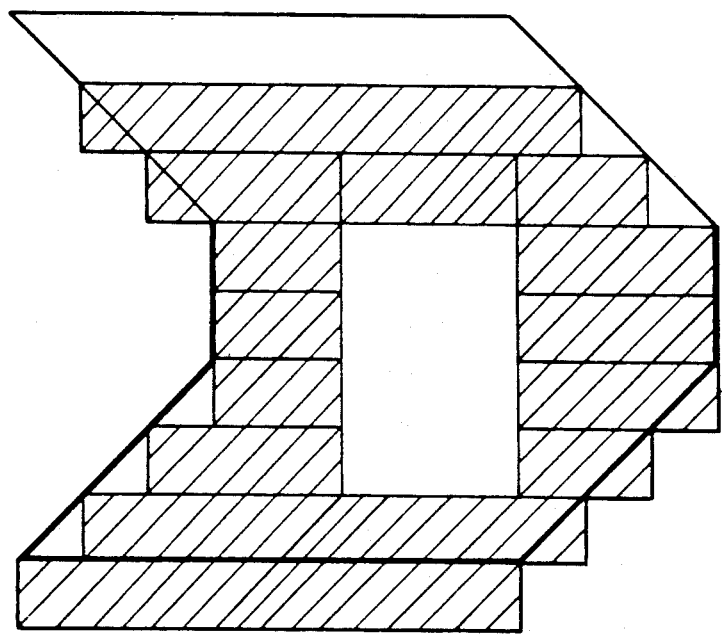
FIG. 29c is a side view of a CAD designed object showing boundary vectors after they have been given a full cure.

FIG. 29a is a slide view of a CAD designed object showing slice layers and planes one bit above the layers where boundary vector will be obtained. FIG. 29b is a side view of a CAD designed object showing boundary vectors. FIG. 29c is a side view of a CAD designed object showing boundary vectors after they have been given a full cure.

Layer hatch vectors are obtained from hatch lines intersecting layer boundaries.

Flat skin boundary vectors are separated into two categories: 1) up-facing, and 2) down-facing. Flat skin boundaries are obtained from the edges of horizontal triangles. Normal vectors to these boundary vectors are obtained by considering inside and outside areas of the triangles if appropriate to later filling or hatching. Duplicate boundary vectors are removed; therefore, boundaries are converted from triangle boundaries to boundaries enclosing skin fill areas.

Figure 29D:
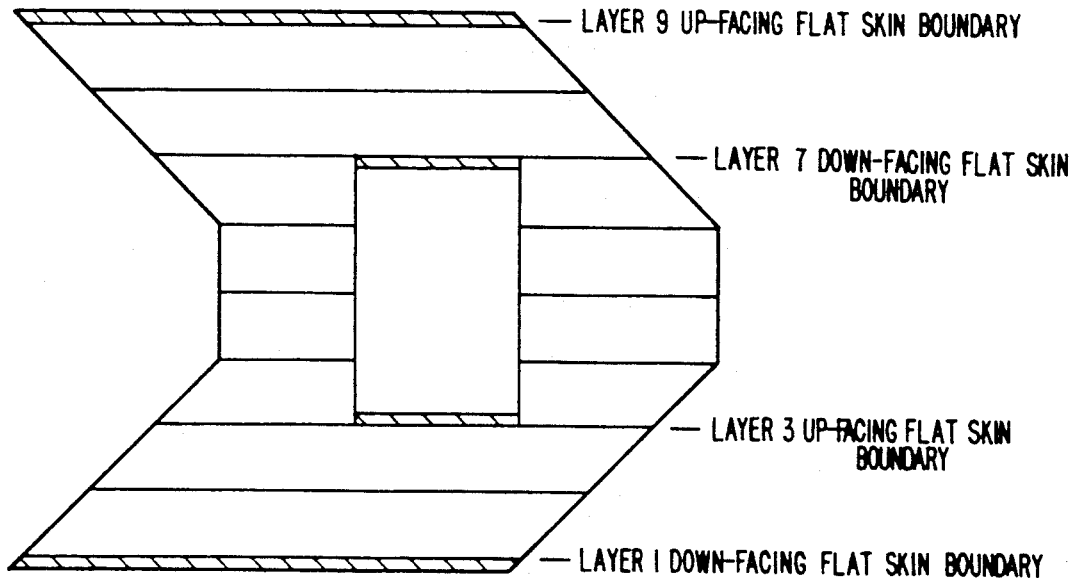
FIG. 29d is a side view of a CAD designed object depict flat skin boundaries at the layers on which they were found.

FIG. 29d is a side view of a CAD designed object depicting flat skin boundaries at the layers on which they were found.

Flat skin hatch vectors are obtained from hatch lines intersecting flat skin boundaries. Flat skin hatch is not currently being used because we find it basically redundant to layer hatch, after skins are put on the right layer, but it is available if we need it.

Flat skin fill vectors are obtained from fill lines intersecting flat skin boundaries.

Vectors associated with flat up-facing skin are moved down 1 layer from the layer on which they were derived. This is due to the layer boundary and hatch being obtained from one bit above the slicing layer causing there to be no layer boundary or hatch under these skins. Actually, this movement of skin is not due to the location of boundaries, but this movement of the skin is required for building parts with the right vertical dimensions, so we have picked the location at which to derive layer boundaries that would allow us to make this movement of skin in a consistent manner.

FIG. 29d is a side view of a CAD designed object depicting flat skin boundaries after they have been moved to the layers on which they will be built.

Near-flat skin boundaries are created from the intersection of near-flat triangles with horizontal planes at the slice layers. Near-flat triangles are those defined by their normals being at smaller angles to the vertical than some specified angle. This angle is based on the point at which boundaries generated from this triangle on consecutive layers would no longer overlap given a particular cure width of the boundary and a particular thickness between the layers. Because triangle vertices are rounded we are assured that if there is a requirement for near-flat skin between two layers that each triangle surfacing the object in that region will intersect a horizontal plane at each layer. These intersections are used to create boundary vector segments for near-flat skins. The additional two segments required are obtained by connecting the ends of these first two. Normals to each segment are generated if appropriate for later filling or hatching. These boundaries are divided into two types: 1) up facing, and 2) down facing. Duplicate near-flat boundary vectors are then removed along with point vectors.

Near-flat skin hatch vectors are obtained from hatch lines intersecting near-flat skin boundaries. Near-flat skin hatch is currently being used for down facing skin but not for up facing skin. We find up facing skin hatch basically redundant to layer hatch, while down facing skin hatch isn't redundant because it is used to create full layer thickness sections of an object.

Figure 29E:
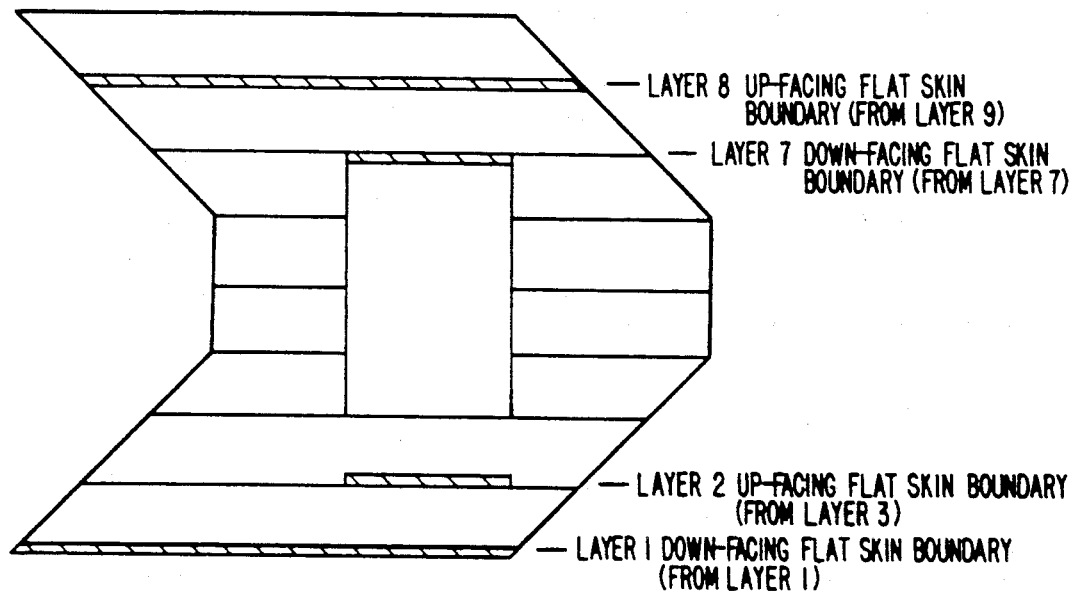
FIG. 29e is a side view of a CAD designed object showing near flat skin frames at the locations where they were created.

FIG. 29e is a side view of a CAD designed object showing near flat skin frames at the locations where they were created.

Near-flat skin fill vectors are obtained from fill paths intersecting near-flat skin boundaries.

When creating near-flat skin for a layer whether it be up-facing or down-facing we compare the current layer to the layer above. This means that near-flat, up-facing skin will always have hatch vectors and partial boundary vectors on which to be built, from layer boundary and hatch. But down-facing, near-flat skin will having nothing to build on so full down-facing, near-flat boundaries and hatch will be required to support the skin. Also more important, giving near-flat, down-facing skin boundaries and hatch a full layer cure will give the part a consistent, slightly oversize X and Y dimension (perfect for smoothing by sanding to yield the right sized part).

Figure 29F:
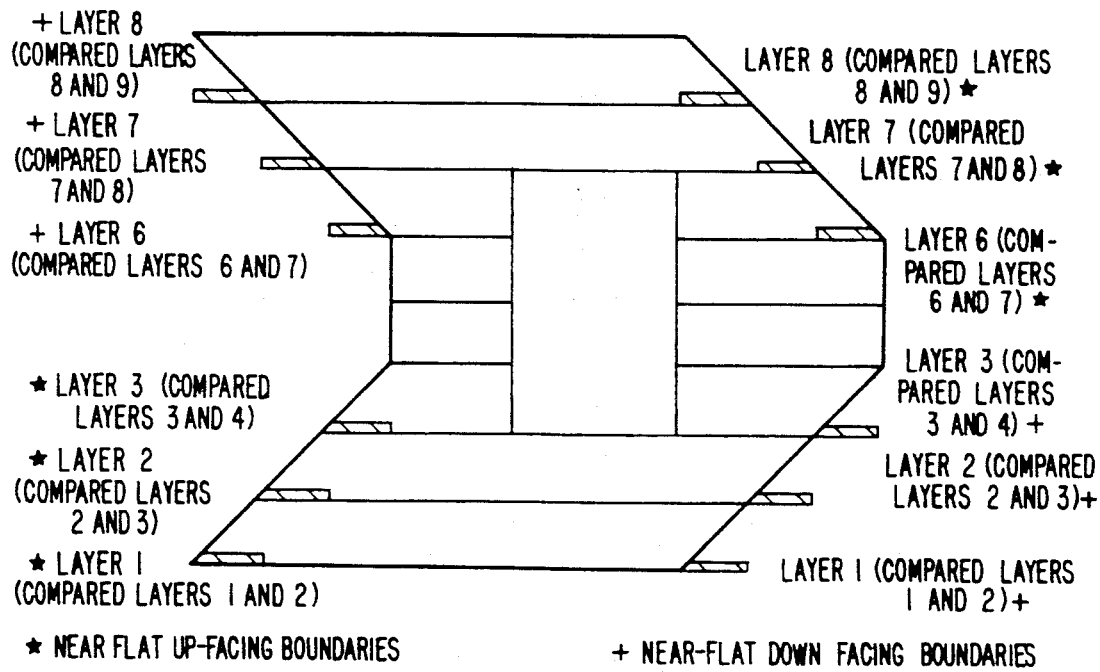
FIG. 29f is a side view of a CAD designed object showing near flat skin boundaries after they have been given full cure.
Figure 29G:
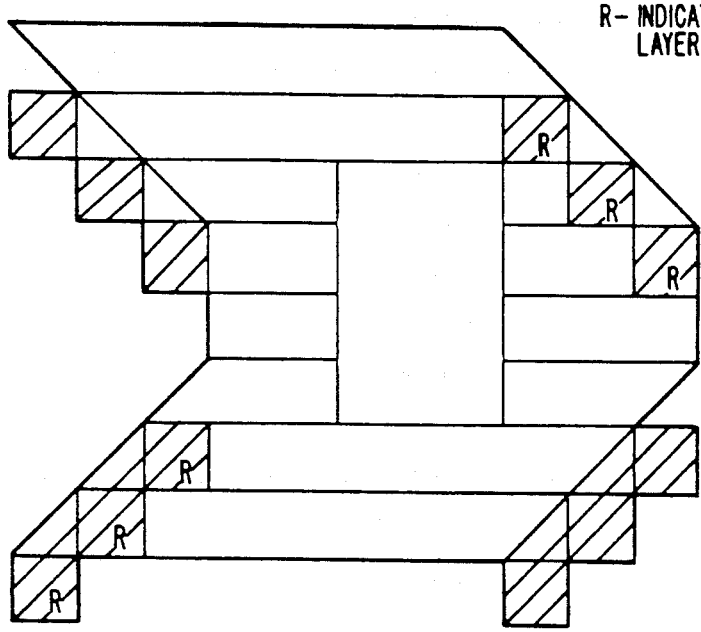
FIG. 29g is a side view of a CAD designed object showing superposition of layer boundaries and near-flat boundaries after being cured.

FIG. 29f is a side view of a CAD designed object showing near flat skin boundaries after they have been given full cure. FIG. 29g is a side view of a CAD designed object showing superposition of layer boundaries and near-flat boundaries after being cured.

The technique we are using for generation and placement of near-flat skins gives us a means of making a gradual transition from vertical to horizontal structures while always insuring that we will have solid material on previous 1 layers to attach our current layer to.

Both down-facing flat and near-flat skin fill are to be drawn as relatively thin films at the top of their layers but eventually before drawing of down-facing skin fills there will probably be an up dip of the part in the liquid to allow the drawing of the fill to be at the bottom of the layer, instead of the top, thereby minimizing ripple between fill and hatch on down-facing features.

Figure 29H:
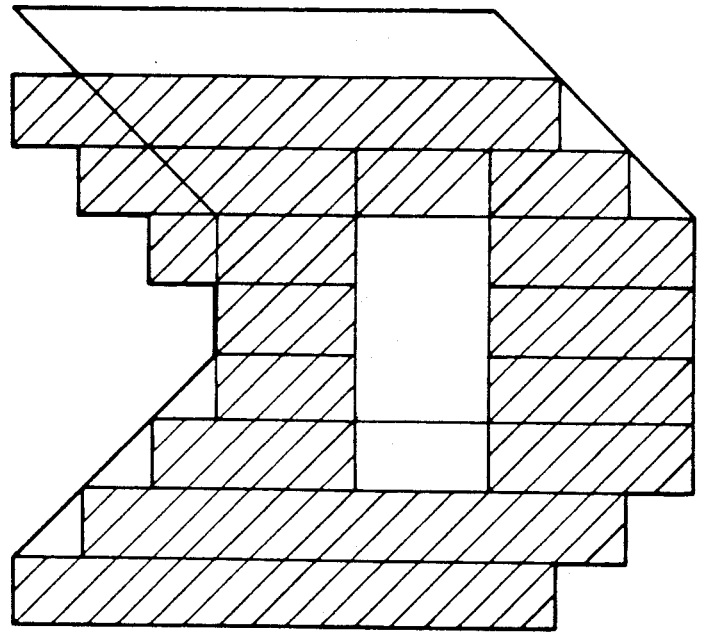
FIGS. 29h and 29i are side views of a CAD designed object along with superposition of all vectors.
Figure 29I:
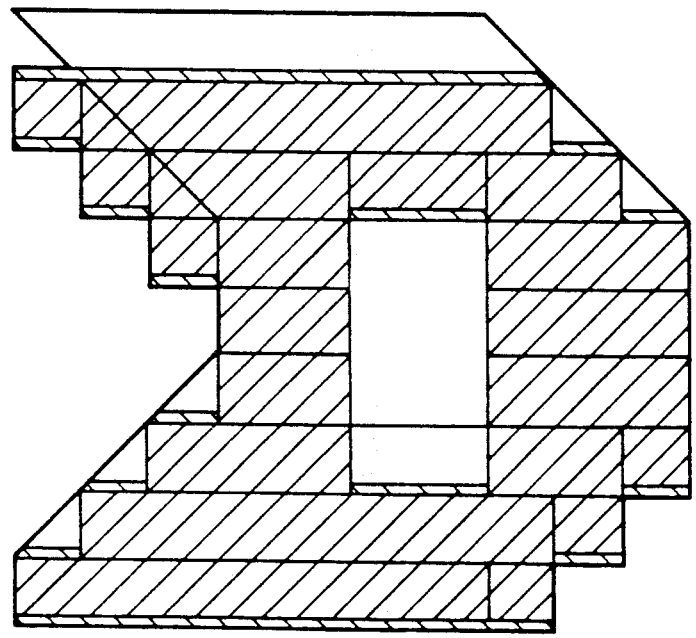

FIGS. 29h and 29i are side views of a CAD designed object showing with superposition of all vectors.

Style 2 achieves the same end result as Style 1. The part is slightly oversized on its X and Y dimensions, while maintaining a placement of vertical features (Z dimension) which yields the best duplication of the CAD designed object possible, while building it with finite layer thickness. The approach of Style 2 starts opposite to that of Style 1. This causes differences in how vectors are being and implemented to build the correct sized part.

Layer boundary vectors are obtained from the intersection of scan and near-flat triangles with a horizontal plane 1 scale bit below the slice layer. This implies that down-facing features (skin) will have no layer boundary or layer hatch to land on, while up-facing features (skin) will have both layer hatch and boundaries available to build upon. Normals for these boundary vectors are obtained from the triangles that give rise to the vectors, if appropriate for later hatching between the boundaries. Obtainment of boundaries 1 bit below the slice layers allows the correct vertical displacement between down-facing and up-facing features. It also permits us to deal with all 4 skin types in a consistent manner, based solely on type of skin not on geometrical relations of features.

Layer hatch vectors are obtained from hatch lines intersecting layer boundaries.

Flat skin boundary vectors are separated into two categories: 1) up-facing, and 2) down-facing. Flat skin boundaries are obtained from the edges of horizontal triangles. Normal vectors to the created boundary vectors are obtained by considering inside and outside areas of the triangles, if appropriate to later filling or hatching. Duplicate pairs of boundary vectors are removed, therefore converting from triangle boundaries to boundaries enclosing skin fill areas.

Flat skin hatch vectors are obtained from hatch lines intersecting flat skin boundaries. Flat skin hatch is currently considered unnecessary because it duplicates layer hatch which is available once skins are moved to the layers on which we want to build them, but it is available if needed.

Flat skin fill vectors are obtained from fill paths intersecting flat skin boundaries.

Vectors associated with flat, down-facing skin are moved up from the layer on which they were derived. This movement is due to the requirement of maintaining the best vertical duplication of the CAD designed object. Associated with this movement was the reason for obtaining layer boundaries 1 bit below the slice layer. In other words, by obtaining layer boundaries one bit below the slice layer we are insured that flat down-facing skins won't have any hatch under them, and therefore they could be moved up. This also insured us that up-facing, flat skins would always have hatch available to build on.

Near-flat skin boundaries are created in exactly the same way they are created for Style 1.

Near-flat skin hatch vectors are obtained from hatch lines intersecting near-flat skin boundaries. Near-flat skin hatch is required for up-facing skin, but not for down-facing skin. Down-facing hatch appears to duplicate layer hatch whereas up-facing hatch doesn't because it is used to create a full layer thickness of solid in a new area.

Figure 30A:
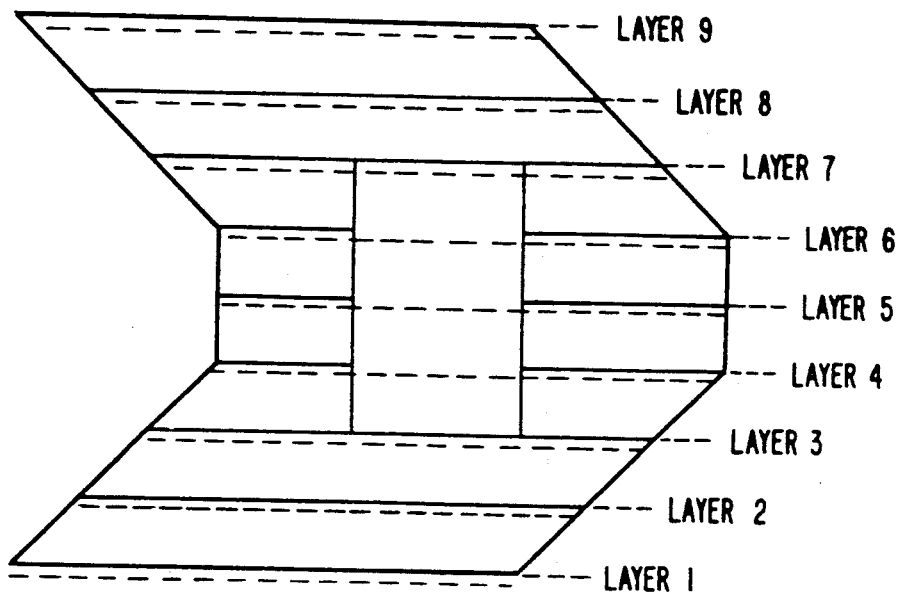
FIG. 30a is a side view of a CAD designed object showing positions of slice layers and planes one bit down for creation of layer boundary vectors.
Figure 30B:
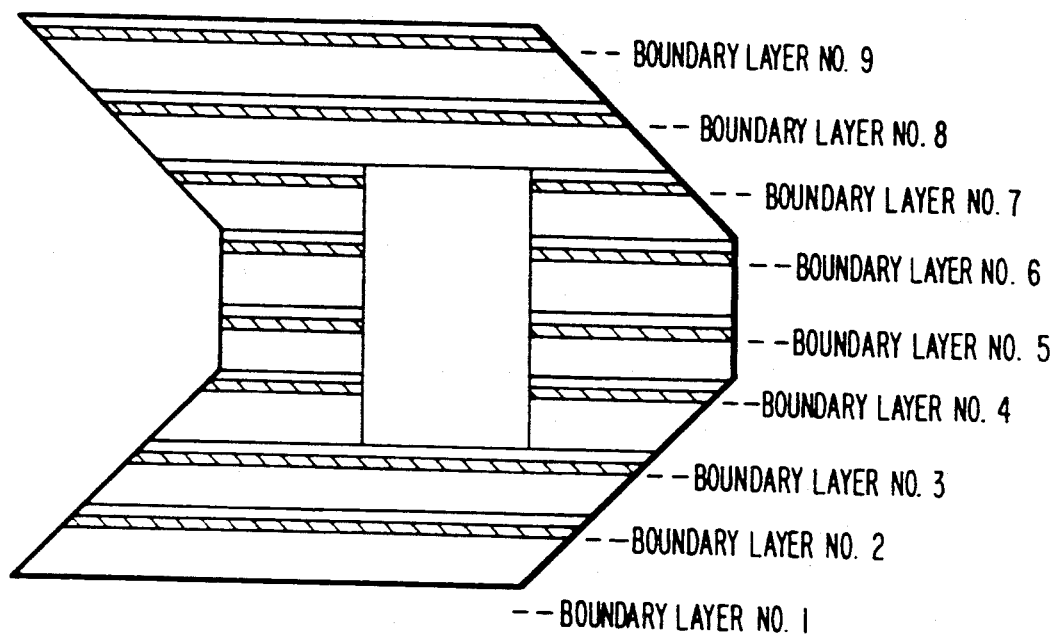
FIG. 30b is a side view of a CAD designed object showing the layer boundary vectors at the positions where they were created.
Figure 30C:
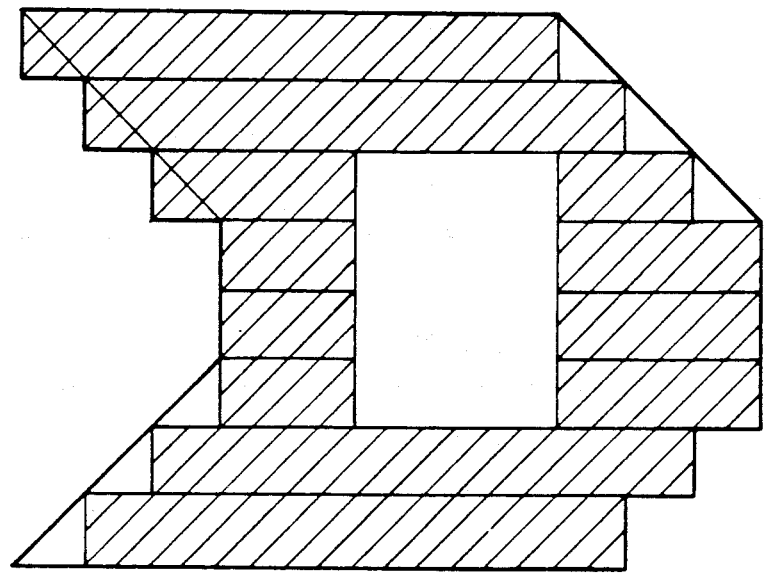
FIG. 30c is a side view of a CAD designed object along fully cured layer boundaries.

FIG. 30a is a side view of a CAD designed object showing positions of slice layers and planes one bit down for creation of layer boundary vectors. FIG. 30b is a side view of a CAD designed object showing the layer boundary vectors at the positions where they were created. FIG. 30c is a side view of a CAD designed object along with fully cured layer boundaries.

Near-flat skin fill vectors are obtained from fill lines intersecting near-flat skin boundaries.

When creating near-flat skin for a layer whether it be up-facing or down-facing we compare the current layer to the layer above (as stated earlier this comparison is made exactly on the slice layers and not above or below). This means that near-flat up-facing and near-flat down-facing skin vectors have nothing to build on so they can be moved up or down to find support or they can be moved to or stay on layers that don't already contain support if we use near-flat boundaries and hatch to build full layer thicknesses of material (for support). The requirement of maintaining an object of consistent size and shape relative to the CAD design demands that near-flat up-facing skin vectors be moved up one layer and that the associated boundaries and hatch be given a full layer cure. Additionally, near-flat, down-facing vectors must be moved up a layer, therefore, making hatch unnecessary, because of the presence of layer hatch.

Figure 30D:
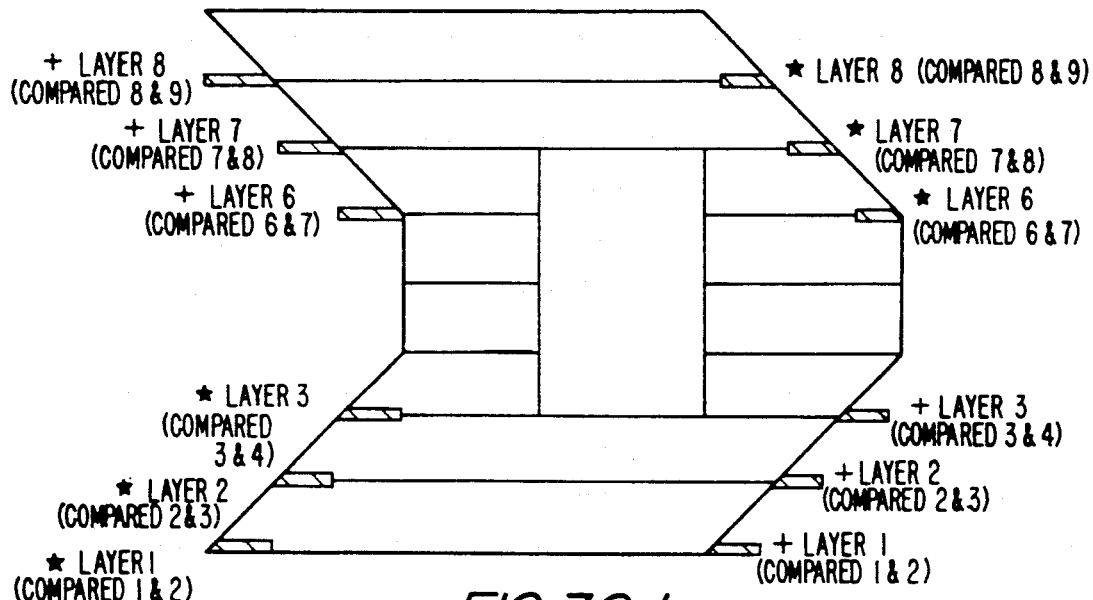
FIG. 30d is a side view of a CAD designed object along with near-flat skin boundaries.
Figure 30E:
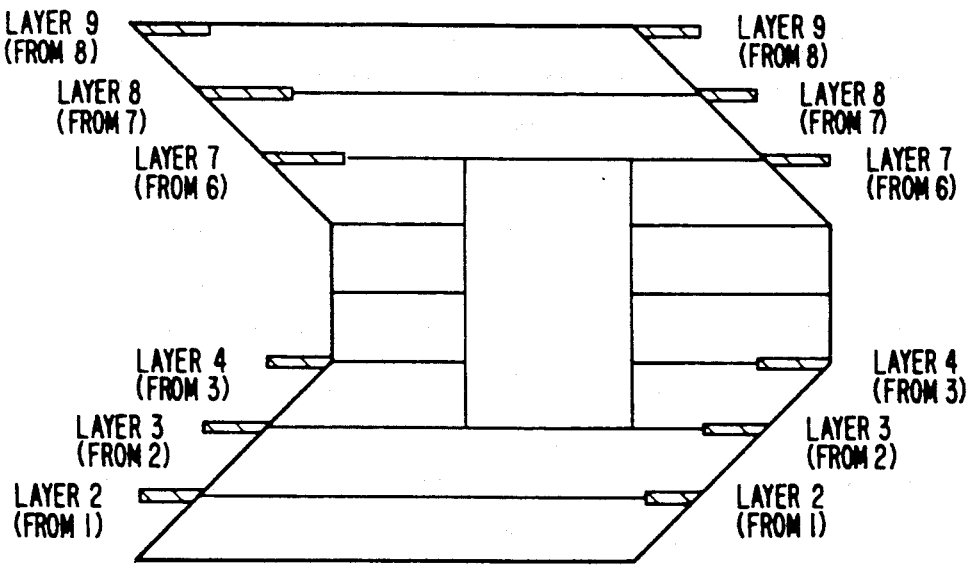
FIG. 30e is a side view of a CAD designed object along with near-flat skin boundaries after being moved to the layers on which they will be built.
Figure 30F:
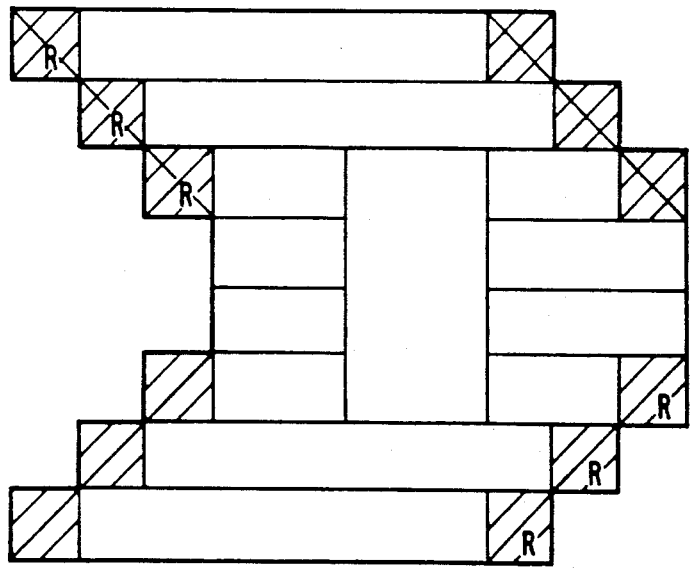
FIG. 30f is a side view of a CAD designed object along near-flat skin boundaries being given a full cure and indicates where these boundaries overlap already cured layer boundaries.
Figure 30G:
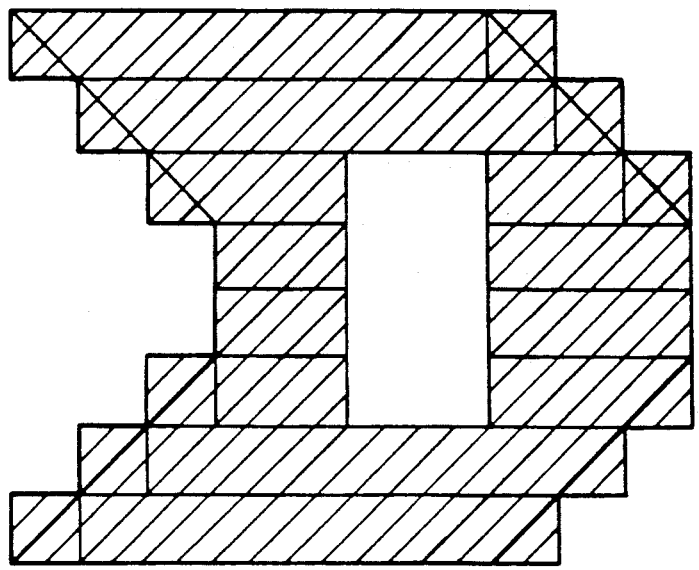
FIG. 30g is a side view of a CAD designed object showing superposition of layer boundaries and near-flat skin boundaries.

FIG. 30d is a side view of a CAD designed object along with near-flat skin boundaries. FIG. 30e is a side view of a CAD designed object along with near-flat skin boundaries after being moved to the layers that they will be built on. FIG. 30f is a side view of a CAD designed object along with near-flat skin boundaries being given a full cure, and also indications as to where these boundaries overlap already cured layer boundaries. FIG. 30g is a side view of a CAD designed object showing superposition of layer boundaries and near-flat skin boundaries.

The style 2 method of deriving vectors and their associated placement gives us the same important result that Style 1 did: We can make a gradual transition from vertical to horizontal structures while always insuring that we will have solid material below on previous layers to attach our current layer to.

All four types of skin fill are to be drawn as relatively thin films (i.e. shallow) at the top of the layers they are placed on but eventually before drawing down-facing skins we will probably lift the part out of the liquid slightly (less than 1 layer) thereby allowing the skin to fill the bottom the layer to minimize ripple between fill and hatch.

Figure 30H:
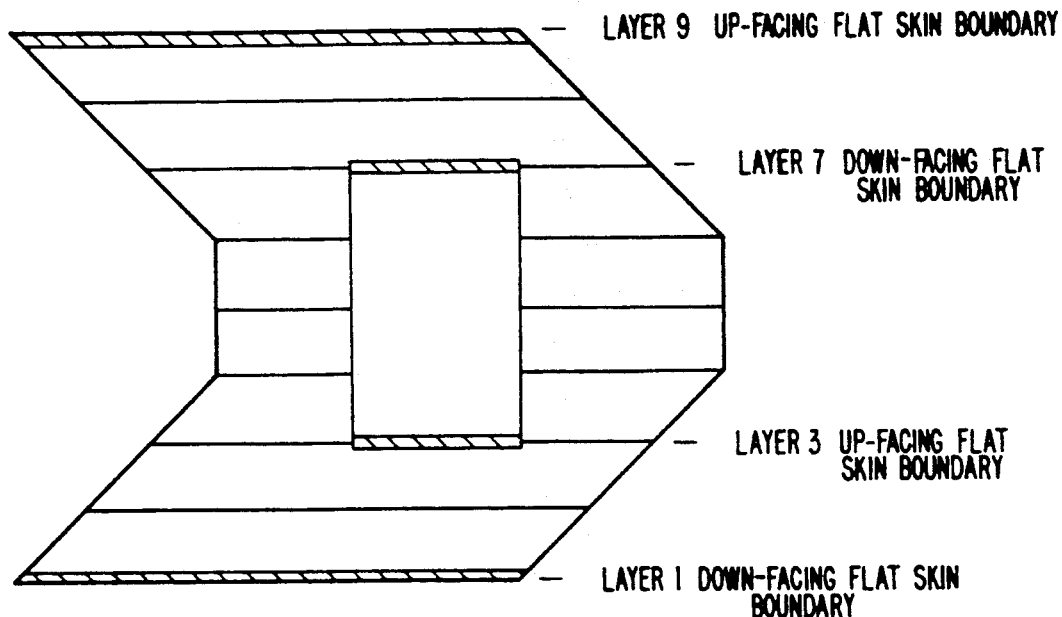
FIG. 30i is a side view of a CAD designed object along with flat skin boundaries being moved to the layers on which they will be built.
FIG. 30j is a side view of a CAD designed object showing superposition of all vectors, with down facing skins being drawn at the bottom of their layers.
Figure 30I:
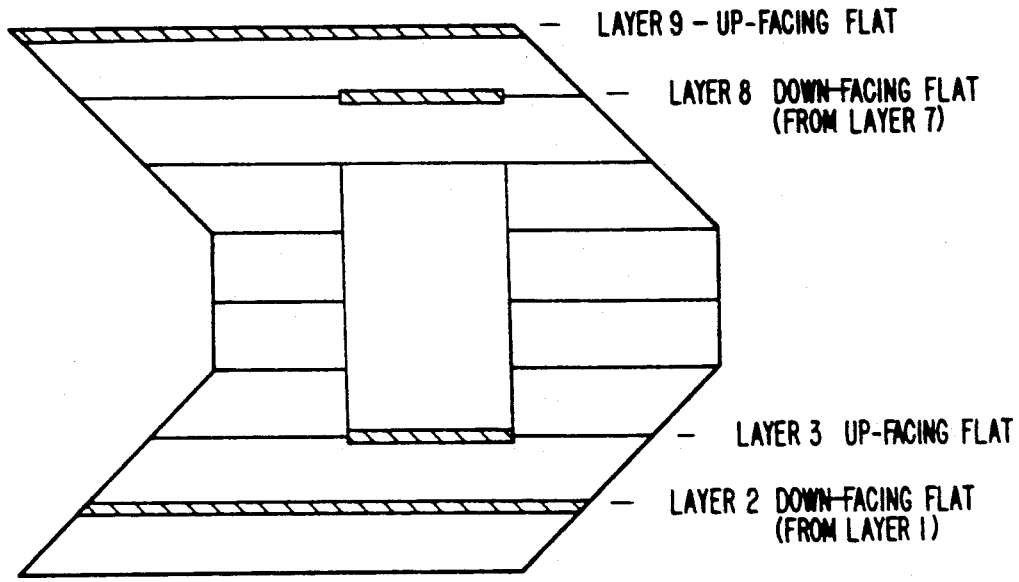
Figure 30J:
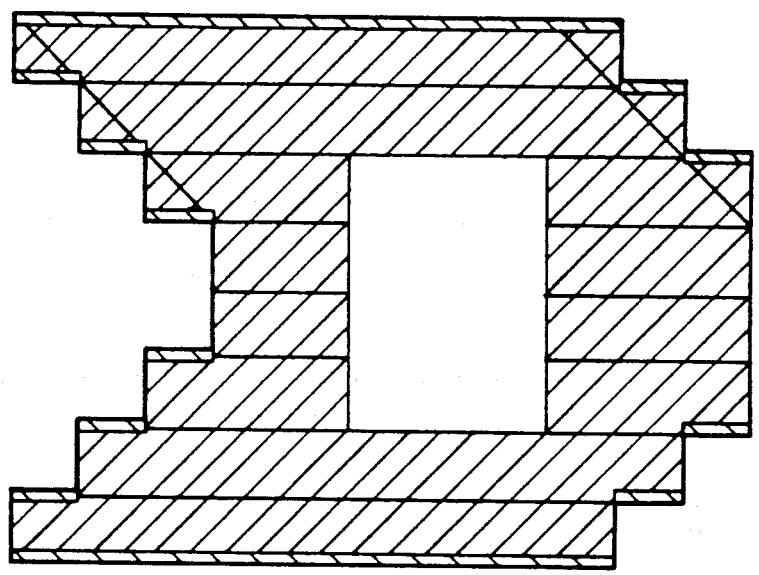

FIG. 30h is a side view of a CAD designed object along with flat skin boundaries. FIG. 30i is a side view of a CAD designed object along with flat skin boundaries being moved to the layers they will be built on. FIG. 30j is a side view of a CAD designed object showing superposition of all vectors (with down facing skins being drawn at the bottom of their layers). Style 3 and Style 4

Styles 3 and 4 are very different from Styles 1 and 2; Styles 1 and 2 are used to build objects that are slightly oversized in the X and Y dimensions, whereas Styles 3 and 4 are used to build objects that are slightly undersized in the X and Y dimensions Styles 1 and 2 can build any general object; whereas Styles 3 and 4 can have problems when attempting to build parts that include thin walled sections at small angles to the horizontal. The circumstances under which problems can occur are based on relationships between layer thickness, layer levels, and geometric relationships between features. The conditions under which Styles 3 and 4 can be used to successfully build objects will be discussed in more detail after discussing the methods of generating vectors. Styles 3 and 4 derive their vectors from a combination of vector types used on Styles 1 and 2, respectively. Note: The statements below that reference vector types from Styles 1 and 2 refer to the layers from which those vector types were derived (they are not indicating the layer on which the vectors are moved to before they are drawn).

Layer boundaries for Style 3 (layer N) surround the areas enclosed by the layer boundaries of Style 1 (layer N) minus the intersection of areas enclosed by the layer boundaries from Style 1 (layer N) with the areas enclosed by up-facing, near-flat boundaries from Style 1 (layer N).

Figure 31A:
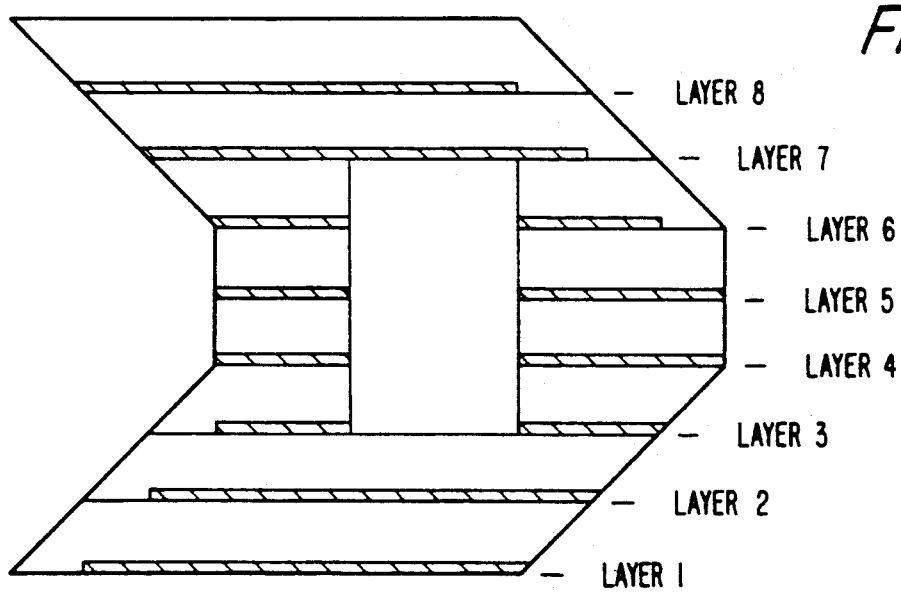
FIG. 31a is a side view of a CAD designed object positions of slice layers and location of layer boundaries.
Figure 31B:
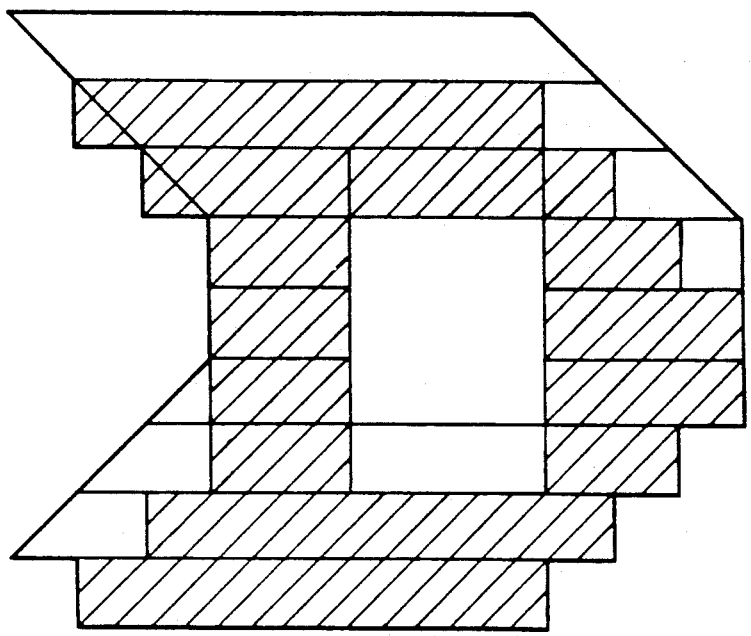
FIG. 31b is a side view of a CAD designed object with layer boundaries being given a full layer cure depth.

FIG. 31a is a side view of a CAD designed object showing positions of slice layers and obtainment of layer boundaries. FIG. 31b is a side view of a CAD designed object with layer boundaries being given a full layer cure depth.

Layer hatch vectors are obtained from hatch paths intersecting layer boundaries.

Near-flat, down-facing boundaries for Style 3 (layer N) surround areas enclosed by the intersection of areas enclosed by down-facing near-flat boundaries from Style 1 (layer N) with areas enclosed by the layer boundaries of Style 1 from (layer N+1).

Figure 31C:
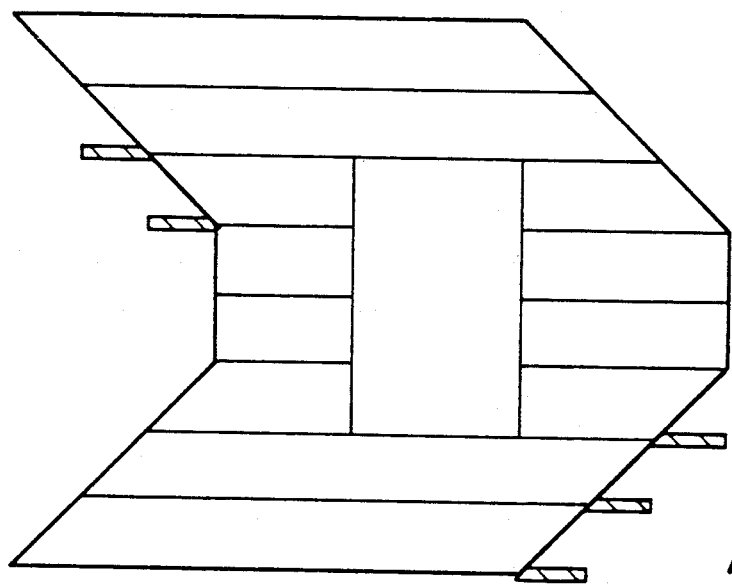
FIG. 31c is a side view of a CAD designed object showing positions where down-facing, near-flat boundaries are obtained.
Figure 31D:
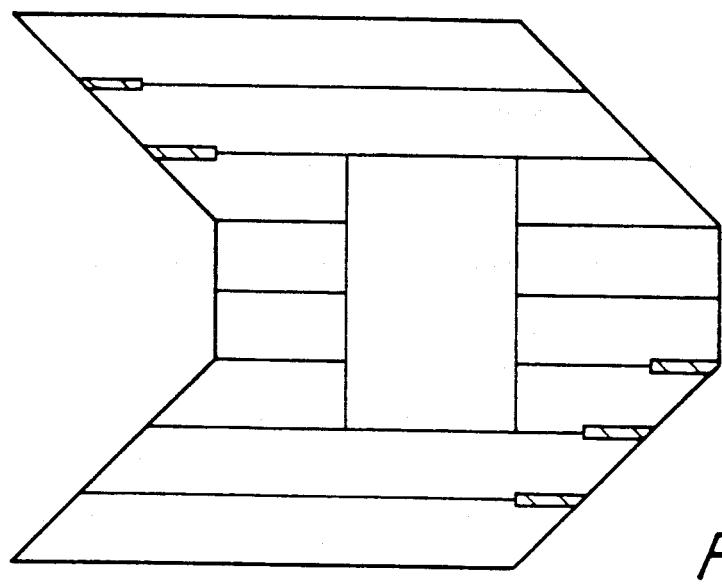
FIG. 31d is a side view of a CAD designed object showing down-facing near-flat boundaries on which they will be built (up one layer)

FIG. 31c is a side view of a CAD designed object showing positions where down-facing near-flat boundaries are obtained. FIG. 31d is a side view of a CAD designed object showing down-facing near-flat boundaries on which they will be built (up on layer).

Near-flat, down-facing hatch and fill are obtained from hatch and fill paths intersecting near-flat, down-facing boundaries. Near-flat, down-facing hatch duplicates layer hatch and is therefore not generally needed. Near-flat, down-facing vectors are moved up one layer to be built (layer N+1).

Up-facing, near-flat boundaries for Style 3 surround the areas enclosed by the intersection of areas enclosed by up-facing, near-flat boundaries from Style 1 (layer N) with the areas enclosed by layer boundaries of Style 1 (layer N−1).

Figure 31E:
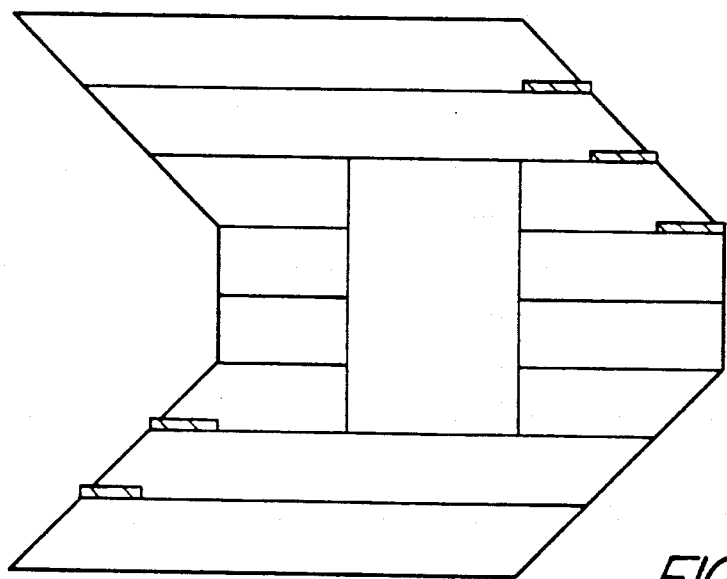
FIG. 31e is a side view of a CAD designed object showing positions where up-facing, near-flat boundaries are obtained.
Figure 31F:
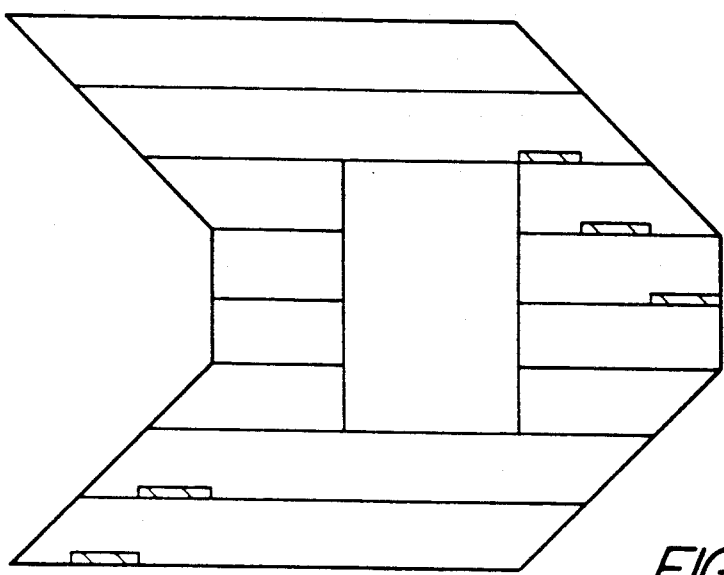
FIG. 31f is a side view of a CAD designed object showing up-facing near-flat boundaries after they are moved to the layers on which they will be built (down one layer)

FIG. 31e is a side view of a CAD designed object showing positions where up-facing near-flat boundaries are obtained. FIG. 31f is a side view of a CAD designed object showing up-facing near-flat boundaries after they are moved to the layers on which they will be built (down one layer).

Near-flat, up-facing hatch and fill are obtained from hatch and fill paths intersecting near-flat up-facing boundaries. Near-flat, up-facing hatch duplicates layer hatch and is therefore not generally needed. Near-flat, up-facing vectors are moved down to the previous layer (layer N−1).

Flat, up-facing skin boundaries for Style 3 surround the areas enclosed by flat-up facing skin boundaries from Style 1 (layer N) minus the intersection of areas enclosed by flat up-facing boundaries from Style 1 (layer N) with the areas enclosed by near-flat, down-facing boundaries from Style 1 (layer N−1).

Figure 31G:
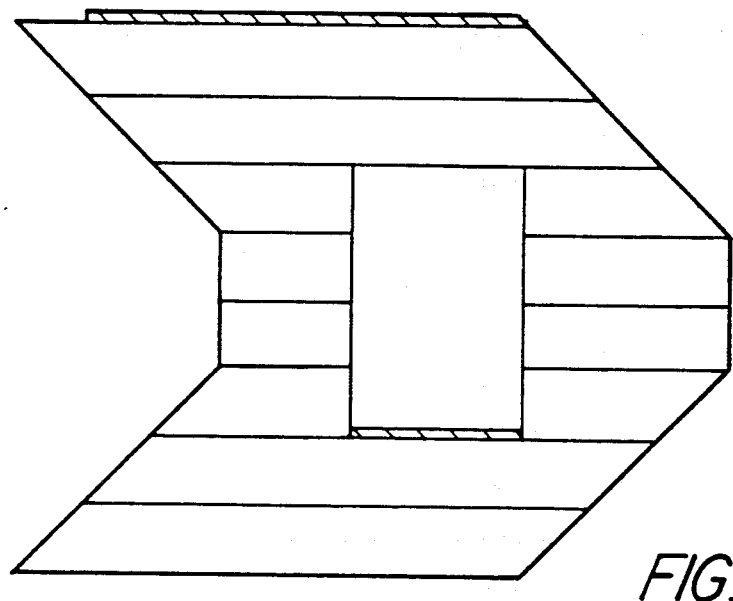
FIG. 31g is a side view of a CAD designed object showing the positions where up-facing flat skin boundaries are obtained.
Figure 31H:
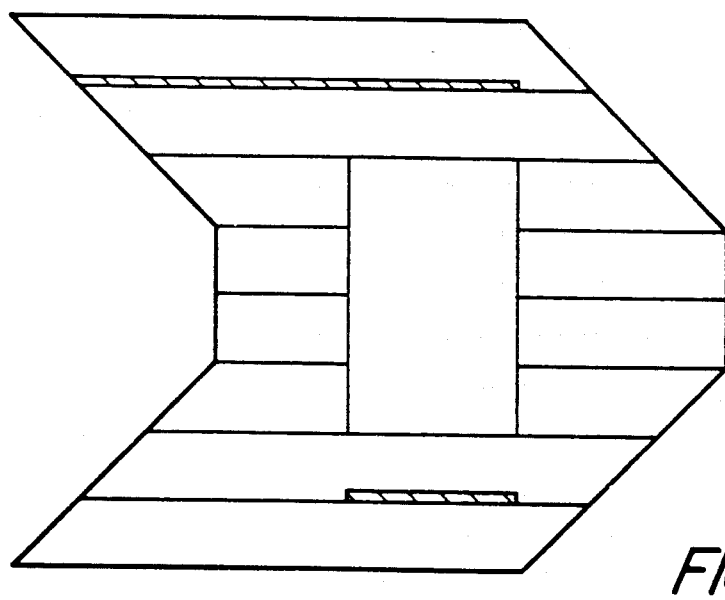
FIG. 31h is a side view of a CAD designed object showing up-facing flat boundaries after they are moved to the layers on which they will be built (down one layer)

FIG. 31g is a side view of a CAD designed object showing the positions where up-facing flat skin boundaries are obtained. FIG. 31h is a side view of a CAD designed object showing up-racing flat boundaries after they are moved to the layers on which they will be built (down one layer).

Flat, up-facing hatch and fill are generated from hatch and fill paths intersecting flat up-facing boundaries. Flat, up-facing hatch duplicates layer hatch and is, therefore, not generally needed. Vectors associated with flat, up-facing skin (layer N) are moved down to the previous layer to be built (layer N−1).

Flat, down-facing boundaries for Style 3 (layer N) surround the areas enclosed by flat down-facing boundaries from Style 1 (layer N) minus the intersection of areas enclosed by flat, down-facing boundaries from Style 1 (layer N) with the areas enclosed by near-flat, up-facing boundaries from Style 1 (layer N).

Figure 31I:
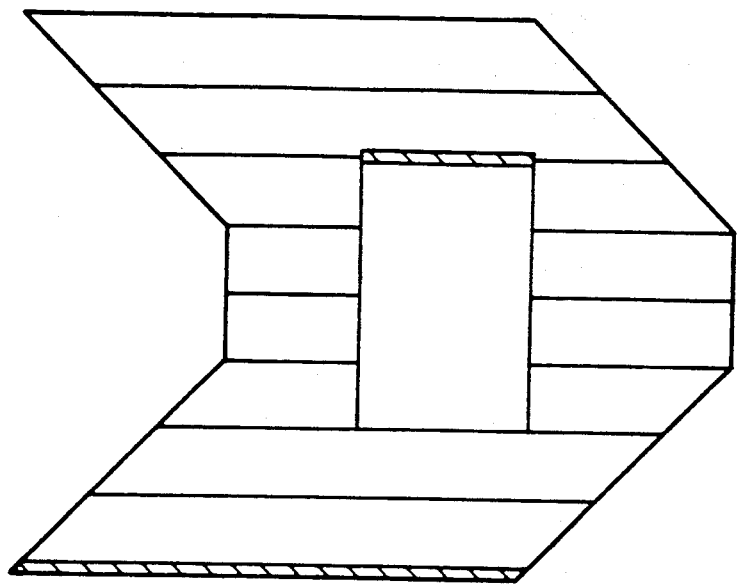
FIG. 31i is a side view of a CAD designed object showing the positions where down-facing flat skin boundaries are obtained (built on same layer as obtained)

FIG. 31i is a side view of a CAD designed object showing the positions where down-facing flat skin boundaries are obtained (built on same layer as obtained).

Flat, down-facing hatch and fill are obtained from hatch and fill paths intersecting flat down-facing boundaries. Flat, down-facing hatch duplicates layer hatch and is therefore not generally needed. Flat, down-facing skin vectors stay on the same layer on which they were found (layer N).

Figure 31J:
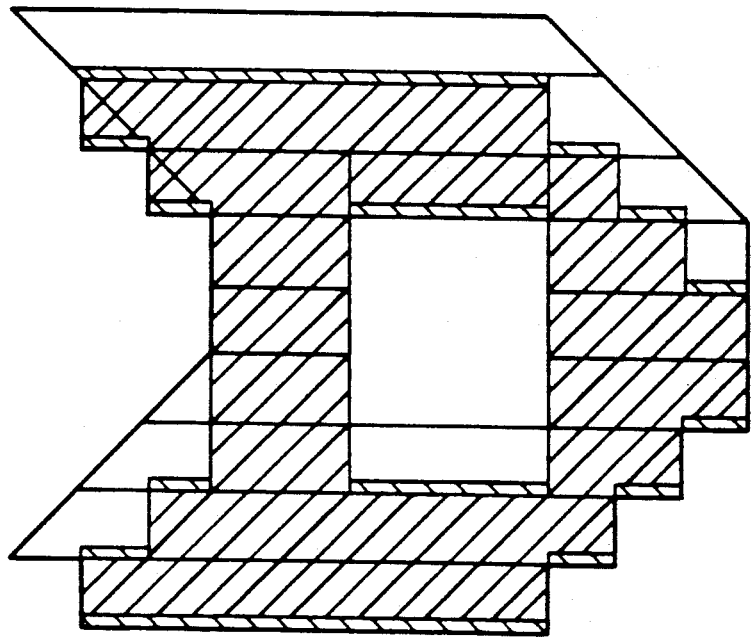
FIG. 31j is a side view of CAD designed object with vectors superimposed and drawn to the proper cure depth.

FIG. 31j is a side view of CAD designed object with all vectors superimposed and drawn to the proper cure depth (remembering that hatch and fill always are created from boundaries).

STYLE 4

Layer boundaries for Style 4 (layer N) surround the areas enclosed by the layer boundaries of Style 2 (layer N) minus the intersection of the areas enclosed by layer boundaries from Style 2 (layer N) with the areas enclosed by down-facing, near-flat boundaries from Style 2 (layer N−1).

Figure 31K:
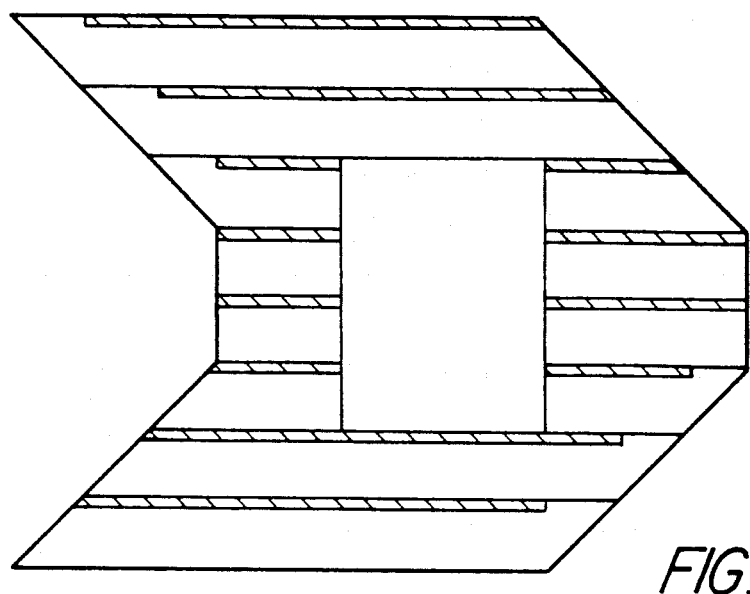
FIG. 31k is a side view of a CAD designed object showing positions of slice layers and location of layer boundaries.
Figure 31L:
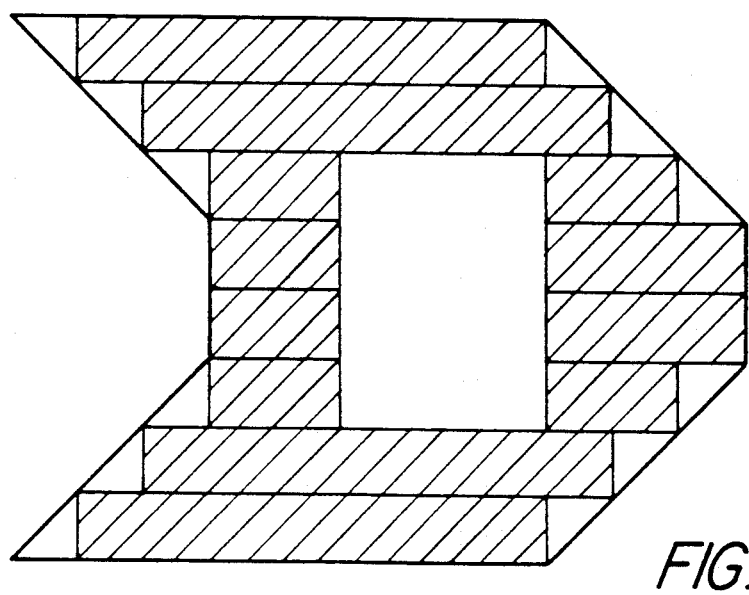
FIG. 31l is a side view of a CAD designed object with layer boundaries being given a full layer cure depth.

FIG. 31k is a side view of a CAD designed object showing positions of slice layers and obtainment of layer boundaries. FIG. 31l is a side view of a CAD designed object with layer boundaries being given a full layer cure depth.

Layer hatch vector are obtained from hatch paths intersecting layer boundaries.

Near-flat, down-facing boundaries for Style 4 surround areas enclosed by the intersection of the areas enclosed by down-facing near-flat boundaries from Style 2 (layer N) with the ares enclosed by layer boundaries from Style 2 (layer N+2).

Near-flat, down-facing hatch and fill are obtained from hatch and fill paths intersecting near-flat down-facing boundaries. Near-flat, down-facing hatch duplicates layer hatch and is therefore not generally needed. Near-flat, down-facing vectors are moved up two layers to be built (layer N+2).

Figure 31M:
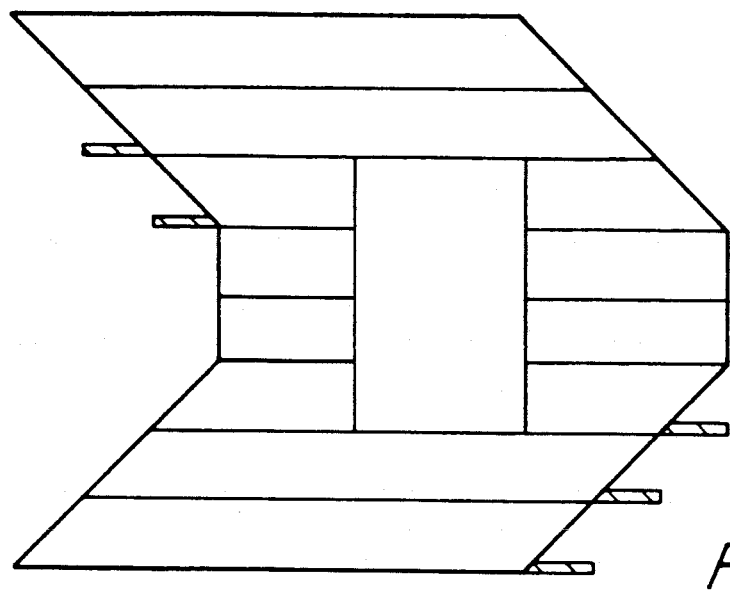
FIG. 31m is a side view of a CAD designed object showing positions where down-facing, near-flat boundaries are obtained.
Figure 31N:
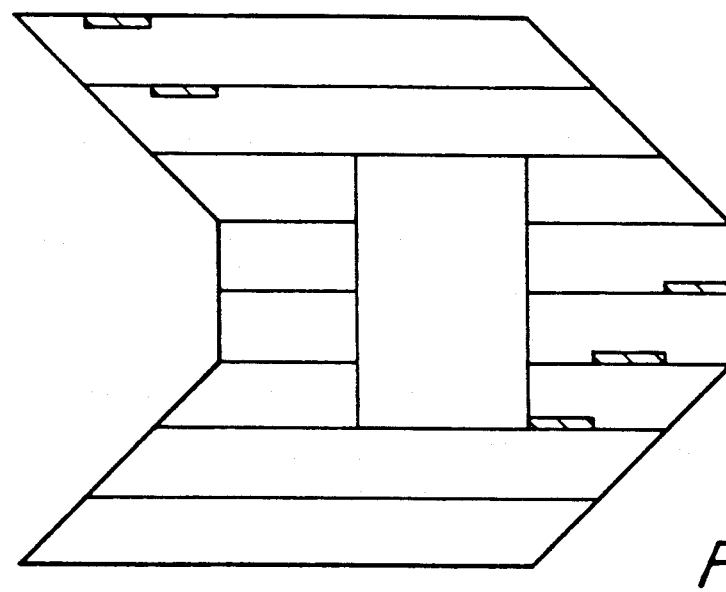
FIG. 31n is a side view of a CAD designed object showing down-facing, near-flat boundaries after they are moved to the layers on which they will be built (up two layers)

FIG. 31m is a side view of a CAD designed object showing positions where down-facing near-flat boundaries are obtained. FIG. 31n is a side view of a CAD designed object showing down-facing near-flat boundaries after they are moved to the layers on which they will be built (up two layers).

Near-flat, up-facing boundaries for Style 4 surround areas enclosed by the intersection of the areas enclosed by near-flat, up-facing boundaries from Style 2 (layer N) with the areas surrounded by the layer boundaries from Style 2 (layer N).

Near-flat, up-facing hatch and fill are obtained from hatch and fill paths intersecting near-flat up-facing boundaries. Near-flat, up-facing hatch duplicates layer hatch and is, therefore, not generally needed. Near-flat, up-facing vectors remain on the layer from which they were derived when they are built (layer N).

Flat, up-facing skin boundaries for Style 4 surround the areas enclosed by the flat, up-facing skin boundaries of Style 2 (layer N) minus the intersection of areas enclosed by flat, up-facing ,boundaries from Style 2 (layer N) with the areas enclosed by near-flat, down-facing boundaries from Style 2 (layer N−1).

Figure 31O:
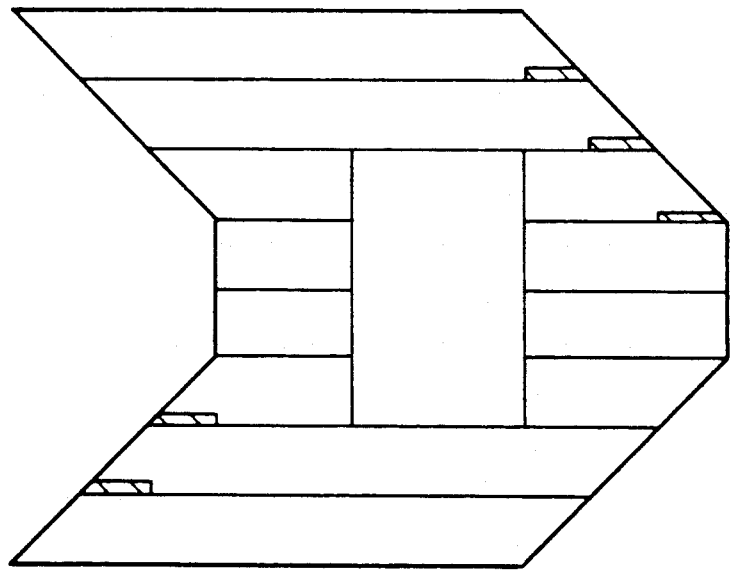
FIG. 31o is a side view of a CAD designed object showing positions where up-facing near-flat boundaries are obtained.
Figure 31P:
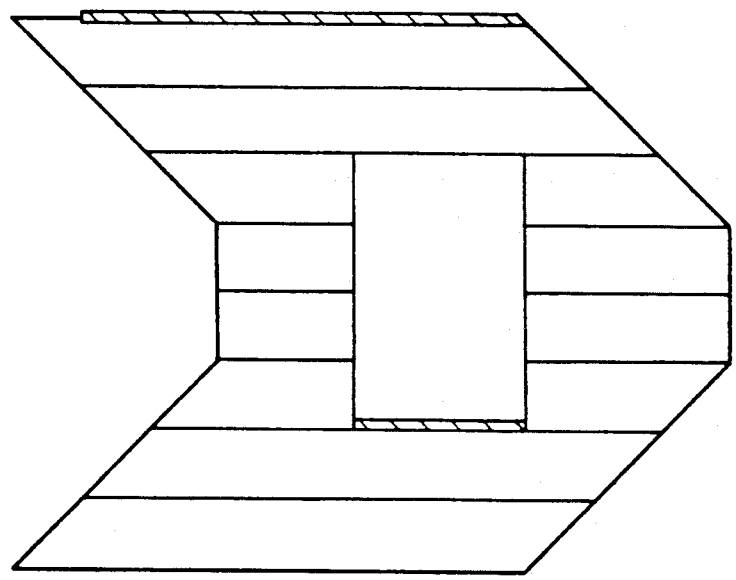
FIG. 31p is a side view of a CAD designed object showing the positions where up-facing flat skin boundaries are obtained (built on the same layer derived)

FIG. 31o is a side view of a CAD designed object showing positions where up-facing near-flat boundaries are obtained. FIG. 31p is a side view of a CAD designed object showing the positions where up-facing flat skin boundaries are obtained (built on the same layer derived).

Flat, up-facing hatch and fill are generated from hatch and fill paths intersecting flat, up-facing boundaries. Flat, up-facing hatch duplicates layer hatch and is, therefore, not generally needed. Vectors associated with flat, up-facing skin (layer N) stay on the layer from which they were created when they are built.

Flat, down-facing boundaries for Style 4 (layer N) surround the areas enclosed by flat, down-facing boundaries from Style 2 (layer N) minus the intersection of areas enclosed by flat, down-facing boundaries from Style 2 (layer N) with areas enclosed by near-flat, up-facing boundaries from Style 2 (layer N).

Figure 31Q:
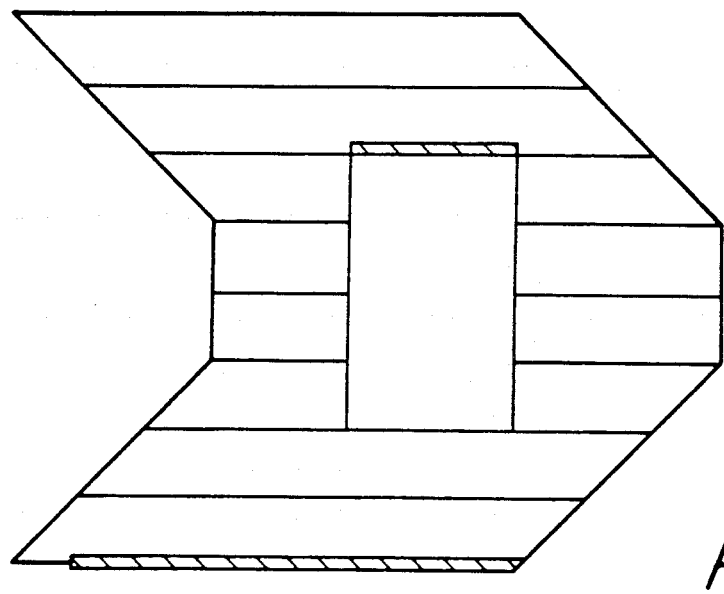
FIG. 31q is a side view of a CAD designed object showing the positions where down-facing, flat skin boundaries are obtained.
Figure 31R:
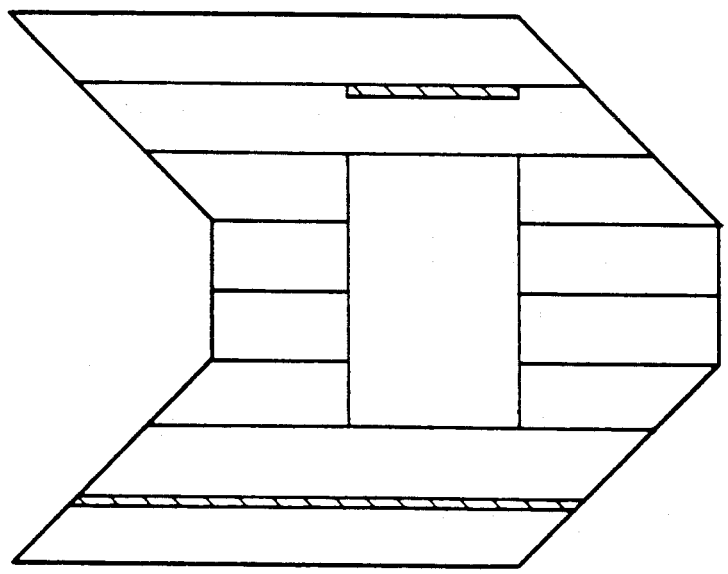
FIG. 31r is a side view of a CAD designed object showing down-facing, flat boundaries after they are moved to the layers on which they will be built (up one layer)

FIG. 31q is a side view of a CAD designed object showing the positions where down-facing flat skin boundaries are obtained. FIG. 31r is a side view of a CAD designed object showing down-facing flat boundaries after they are moved to the layers on which they will be built (up one layer).

Flat, down-facing hatch and fill are obtained from hatch and fill paths intersecting flat down-facing boundaries. Flat, down-facing hatch duplicates layer hatch and is, therefore, not generally needed. Flat, down-facing skin vectors move up one layer relative to where they were found (layer N+1).

Figure 31S:
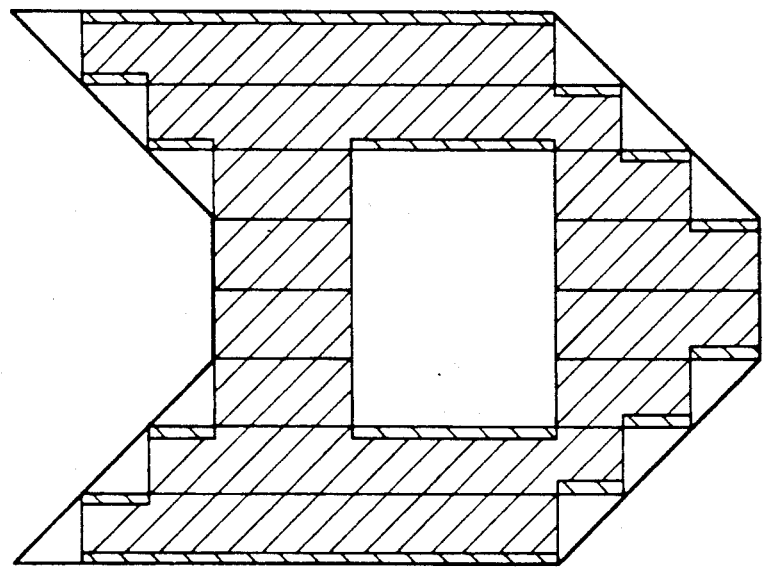
FIG. 31s is a side view of CAD designed object with all vectors superimposed and drawn to the proper cure depth.

FIG. 31s is a side view of CAD designed object with all vectors superimposed and drawn to the proper cure depth (remembering that hatch and fill always are created from boundaries).

As stated earlier, Styles 3 and 4 cannot be used to build general objects, but can be useful for building objects that meet particular requirements. To insure that Styles 3 and 4 will build a particular object properly the object should be inspected using the following criteria: 1) using the appopriate layer thickness determine where each slice layer will be, 2) image the object being built completely within the envelope of its (rounded) CAD designed skin, 3) determine if there are any critical areas on each layer that will not adhere to the layer below; if such areas exist the object cannot be built using the chosen parameters (layer thickness and- /or slice layer levels); if such areas do not exist the object can be built.

FIGS. 31t–31t''' are side views of straight but slanted beams showing that objects can be built with particular layer thicknesses but not with others. FIGS. 31u–31u' are side views of an object similar to that used in describing Styles 3 and 4 but with a wider window and varying layer thicknesses.

OFFSETTING OF VECTORS

When boundary vectors are drawn they cure a desired depth of material but they also cure a finite width of material. Since our boundary vectors are created at the exact edges of objects these edges are displaced by ½ of a cure width into the area that is supposed to be hollow. Since any object has two edges per feature this expansion will cause an increase of 1 cure width in cross-section of each feature. One cure width can range from 10 mils to 30 mils. This amount of over cure throws us way out of our desired tolerance of +/−5 mils for any feature. The solution to this size problem can be implemented in the original CAD design or preferably by an offset of all boundary vectors ½ a cure width into the solid region of the object. The solution at the CAD design stage is functional but trivial, therefore, we will discuss an algorithmic process to implement boundary vector offsetting.

Figure 32A:
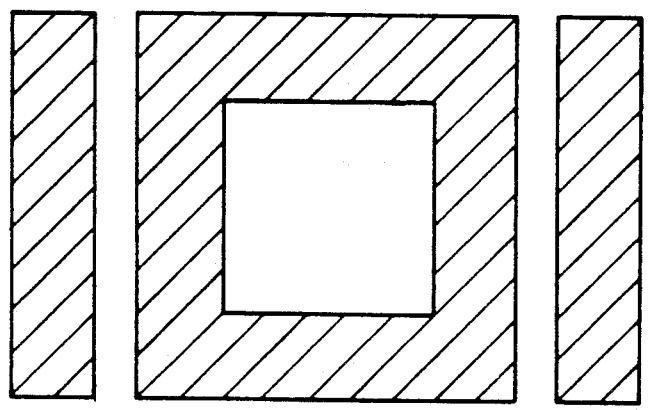
FIGS. 32a and 32b are top views of the cross-section of a CAD designed object depicting desired boundaries and boundaries after curing.
Figure 32B:
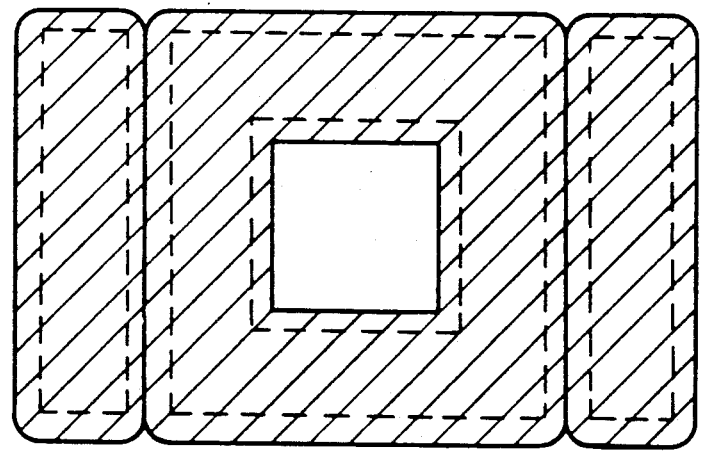

FIGS. 32a and 32b are top views of the cross-section of a CAD designed object depicting desired boundaries and boundaries after curing.

The major steps required in the offsetting procedure are as follows:

A) Produce boundary vectors. For each boundary vector store the starting point (Xs, Ys), the ending point (Xe, Ye), the complete unit length normal information (in the plane), and the equation for the vector. The equation of the line should be specified in the form aX+bY=c.

B) Group vectors with same equations (whether normals are opposite or not).
  1) Determine whether any vectors with the same overlap in space.
  2) If any do, divide the vectors into separate vectors, ones that completely overlap with other vectors and ones that do not overlap anywhere. This increases the number of vectors. Next process the vectors that overlap to determine whether any of them can be reduced to a single non-overlapping vector. Vectors that overlap are processed by determining the net normal for the area covered by the vectors. The determination of the net normal yields a net normal of 0, or a normal of unit length pointing in one of two possible directions. If a non-zero net normal is determined the overlapping vectors are to be considered as only one vector whose normal points in the direction of the net; this vector is to be placed in with the other non-overlapping vectors for further processing. If a zero net normal is determined the overlapping vectors are to be considered as two vectors that have opposite pointing normals. These two vectors are to be removed from further processing. This leaves us with boundaries formed by non-overlapping vectors.
  3) Using the vectors from step 2 maximize the lengths of the vectors by combining any join end to end and have the same equation. This will minimize the number of vectors.

C) Order the resulting vectors from the previous step so that the head of one vector ends at the tail of the next, and continue until a closed loop is formed. After this loop is closed take the next unused vector and continue to order the remaining vectors to form additional loops. If everything has been processed properly to this point we should only have closed loops formed, also these closed loops should have consistent normal directions.

D) The next step is to offset the boundary loops half a cure width into solid regions (opposite direction to boundary normals). The offsetting of vectors can be done by modifying the vector beginning and ending points by use of the following equations:
  1) Variable definitions
    $Xbo$ = X coordinate beginning point after offsetting
    $Ybo$ = Y coordinate beginning point after offsetting
    $Xeo$ = X coordinate ending point after offsetting
    $Yeo$ = Y coordinate ending point after offsetting
    $Xb$ = X coordinate beginning point before offsetting
    $Yb$ = Y coordinate beginning point before offsetting
    $Xe$ = X coordinate ending point before offsetting
    $Ye$ = Y coordinate ending point before offsetting
    $Xn$ = X component of unit length boundary normal
    $Yn$ = Y component of unit length boundary normal
  Equations $$Xbo = Xb - Xn$$

$$Xeo = Xe - Xn$$

$$Ybo = Yb - Yn$$

$$Yeo = Ye - Yn$$

E) The next step is to recalculate the intersection points between boundary vectors. Since we ordered vectors in an earlier step, we now know which vectors should meet (consecutive vectors meet head to tail). The line equations for each pair of vectors are used to determine the new intersection point of the two vectors (head of the first vector and tail of the second).

Mathematically it is simple to find the intersection of two lines but another check must be performed at the same time: Each of the vectors must be checked to see if it is still pointing in the same direction; if it is we go on to the next pair; if not we remove the vector that changed direction (180 degree flip), along with the calculated intersection point and proceed to recalculate a new intersection point based on the good vector from the first pair and the next vector in the list. This procedure is continued until the new intersection points for all boundary vectors are obtained. Note this procedure is based on the assumption that no feature will collapse when the offset occurs.

The previous section described a method of implementing cure compensation based on determining a reliable vector ordering procedure, then offsetting all vectors ½ a linewidth in the direction opposite to the direction in which the normal pointed, and then finally recalculating the intersection points between consecutive vectors along with removal of vectors that changed directions. In this section we describe another method of implementing cure compensation based on determining another reliable vector ordering procedure and then offsetting vector beginning and end points. By off-setting setting beginning and end points we don't need to recalculate intersections of vectors after the compensation as we needed to do previously, but we still need to insure that vectors don't cross each other (change direction). There are subtle differences between these two approaches with each having some disadvantages and advantages compared to the other. Some appropriate mixing of the techniques will probably yield an even better cure compensation process.

Ordering of vectors as presently implemented begins with picking any boundary vector and defining the tail to head orientation of the vector to keep its normal pointing towards the left as one proceeds from head to tail along the vector. Next one searches the remaining vectors for one that adjoins to the head of this first vector that will have its normal pointing in the proper direction when this adjoining point is defined as the tail of this second vector. This process is continued until a closed loop is formed, and then the loop is set aside and processing continues until all vectors are used. Note, cure compensation is done only to boundary vectors; hatch and fill are determined after compensation is completed.

Two difficulties can arise when ordering vectors: 1) Several vectors meet at one point, and going along the wrong path can lead to inappropriate formation of loops, and 2) Sometimes, due to flipping of triangles, normals can point in the wrong direction so formation of loops is not possible when requiring that vectors have the proper normal.

The first difficulty can be resolved by a technique of breaking off loops when they form. For example if 10 vectors are ordered and then another vector is ordered vectors 5 through 11 may form a closed loop. If this occurs set vectors 5 thru 11 aside and start with 4 again and look for an adjoining vector.

The second problem isn't really solved by this process. Closed boundary loops may not always be possible, so it doesn't require them, it just produces an output that warns that a hatching or filling problem might result because this situation has occurred. Note, a combination of the various ordering algorithms described can produce a more reliable ordering, especially by combining loop removal of the section with ordering previously described in the immediately prior section.

The actual method of compensating for cure width now that the vectors are ordered, is next described. Part of the process is used to minimize the possibility of the compensation causing crossovers of vectors. Crossovers can occur when vectors are short compared to the required compensation, along with a function of the angles between several consecutive vectors. The vector which offsets the vertex (offsetting vector) drops a line from its endpoint to each of the vectors that formed it. These lines are perpendicular to each of the forming vectors and their intersection points are required to be less than $\frac{1}{2}$ the distance from the vertex to the end of each vector. If this is not the case, then the offsetting vector is shortened until the $\frac{1}{2}$ point limit is not exceeded.

Figure 34A:
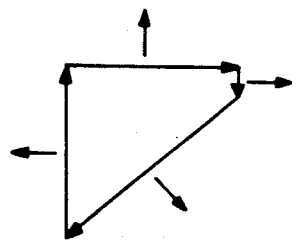
FIGS. 34a, 34b and 34c are top views of vectors that can crossover if not handled properly.
Figure 34B:
Figure 34C:
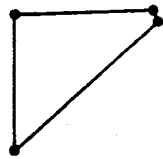
Figure 34D:
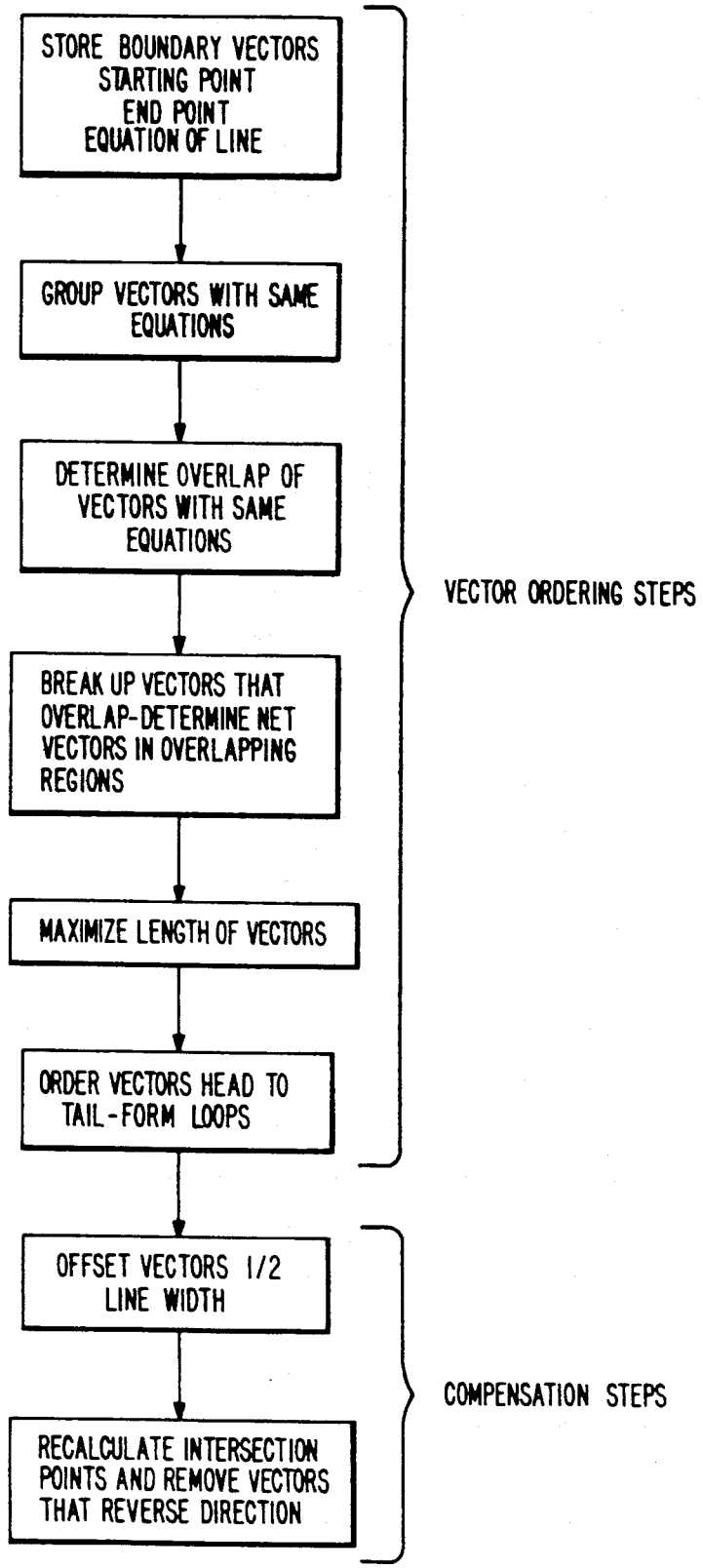
Figure 34I:
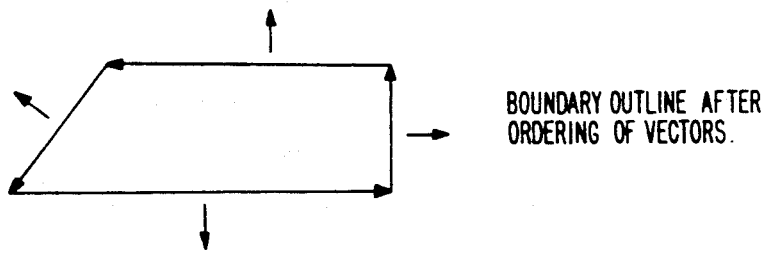
Figure 34J:
Figure 34K:
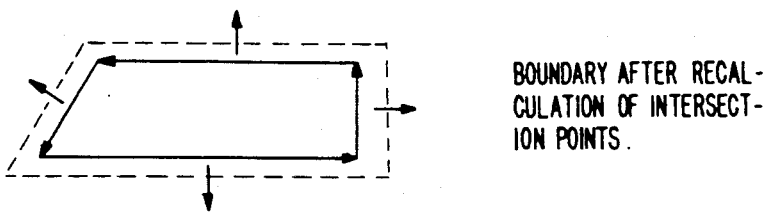
Figure 34L:
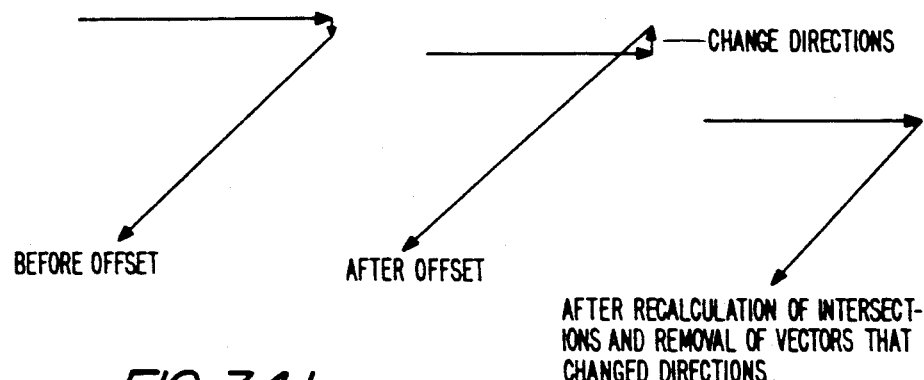

FIGS. 34a, b, and c are top views of vectors that can crossover if not handled properly. Another portion of the implemented process is that, on acute angles, the length of the offsetting vector is limited to a maximum of 2 laser beam widths so that complete loss of narrow features doesn't occur.

The SLICE program accepts input data in the form of three dimensional triangles and creates output data consisting of line segments (vectors) to be beamed upon the surface of a photopolymerizing compound in a layer by layer manner. It is a goal of this process that it be accurate to within several thousandths of an inch (mils). Clearly, to achieve such accuracy to the true dimensions of the part being made, factors such as the radius of the laser beam must be taken into account.

Thus the purpose of cure compensation (previously termed "tangent following") is to correct for the radius of the laser beam when either inner or outer borders of a layer are traced. This problem is akin to those common in numerically controlled milling (NC), except that here the distances are much smaller. Note that while the original part is defined in three dimensions, we have reduced the problem to a two dimensional one. The corrections for the third dimension, the vertical or z direction, are taken into account by the post processing logic in SLICE.

It originally appeared that a scaling operation might be the solution—could simply shrink the outline (in the case of outer perimeter). But scaling will not be uniform on layers that do not have radial symmetry, and requires calculating a "center of inertia" for each outline. To many irregular outlines, scaling would induce a distortion that is much different than the desired cure compensation. Therefore an approach that adjusts each vertex would have to be taken.

For outer perimeters (borders) the compensation is essentially a path reduction by a factor related to the laser beam radius. For inner perimeters (holes, and inner surfaces of walls) the path the laser beam travels must be expanded.

The final algorithmic process we developed is based upon vector algebra and trigonometry. Realizing that each pair of line segments comprising the border can be though of as two vectors (rays) emanating from a common point (local origin), a model was developed using APL under MS-DOS.

FIGS. 35a and 35b are APL programs for such a model. Some of the various compensation cases that can arise are shown in the attached graphs FIGS. 36a through 36m. Note that we assume that the conversation from input triangles to endpoint-sorted segments has already been performed satisfactorily.

In fact this conversation is not always straight forward. The endpoint sort algorithm process will subsequently discussed in greater detail. For an overview of the entire conversion process from input triangles to layered segments reference is made to the previous discussion and to FIG. 33.

The following discussion refers to FIGS. 36a–36m that illustrate specific cure compensation cases. Due to the pitch of the dot matrix printer the graphs are not in a 1 to 1 aspect ratio, though they do appear at 1 to 1 on the computer monitor. The figures are plotted in non-specific units. The origin is shown in the lower left of each graph, in which the x axis is horizontal, and the y axis is vertical.

In order to exaggerate the effects of cure compensation the laser beam radius (0.4) is quite large compared to the perimeters. One distortion that is clearly visible in all cases of the photopolymerization process is that sharp corners are rounded, because the laser beam spot is round itself.

In each graph the circles represent laser beam spots at the vertices of the compensated perimeter. The lines connecting the centers of the circles indicates the beam path of the laser.

BASIC CURE COMPENSATION

Figure 36A:
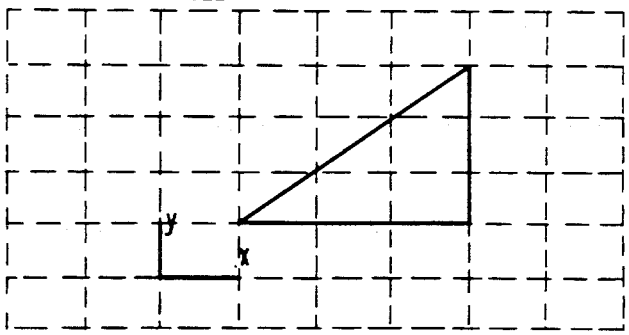
Figure 36B:
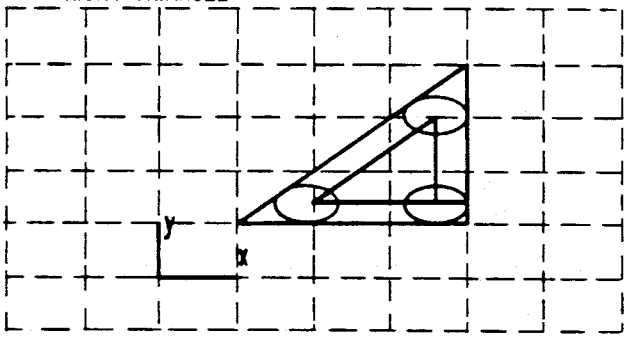

An outer perimeter in the shape of a right triangle is considered in FIG. 36a. Its coordinates are plotted and they are (1,1) (4,1) (4,4).

Cure compensation is applied to these coordinates and they are moved inward; i.e. the outer perimeter is reduced in size. The amount of reduction can be visualized geometrically by inscribing a circle the laser beam) at each vertex of the perimeter. The centers of these circles thus gives us the new vertices of the compensated perimeter.

We can see that each such inscribed circle will be tangent to the two vectors sharing a common point; that point is the vertex to be compensated in the perimeter. Since the relationship is bitangential it will cause the compensation to vary as the angle between the two vectors varies.

ACUTE ANGLE CASE

Figure 36C:
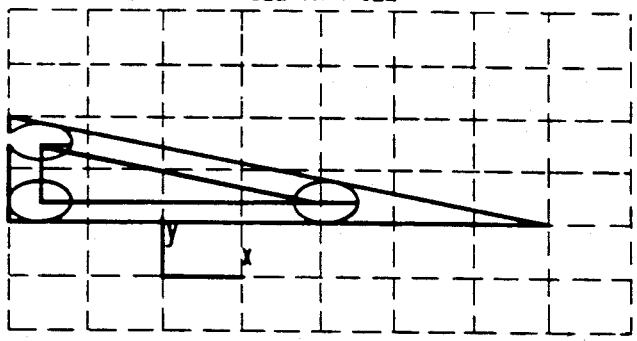
Figure 36D:
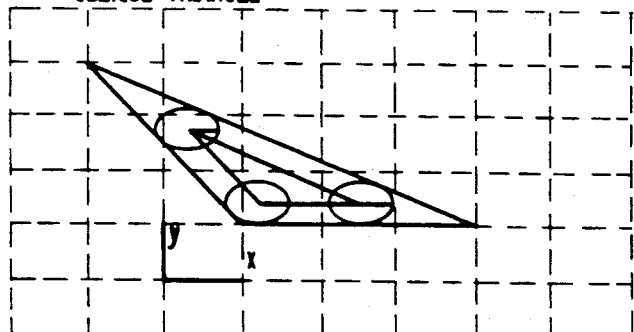

To illustrate this point, consider FIG. 36c in which we have an acute angle at vertex (5,1). Note the significant displacement of the circle that is required to maintain the required bitangential condition. Thus we see that for acute angles there will be considerable compensation resulting in a foreshortening distortion of the perimeter.

The acute angle distortion should not necessarily be regarded as undesirable because 1) the distortion is relative to laser beam radius which is quite small to begin with, and 2) the feature that would have existed without the compensation may have been structurally weak, or 3) the uncompensated feature itself would be a distortion of the outer perimeter. This distortion is an outcome of the bitangential effect of inscribing the laser beam wholly within the original outer perimeter, and could be ameliorated by relaxing this condition, i.e. allowing a portion of the laser beam to exceed the actual outer perimeter.

OBLIQUE ANGLE CASE

An oblique angle does not induce a significant distortion. An example of this case is shown in FIG. 36c at vertex (1,1). Note that the inscribed circle near (1,1) does not touch point (1,1). Rather, it is tangent to the vectors sharing that vertex.

INSIDE ANGLE CASE

The same effect of oblique angle compensation even more pronounced in the case of the "inside angles", i.e. angles greater than 180 degrees. In this case the inscribed circle is tangent to the infinite projections of the two vectors. This angle is shown in FIG. 36c at vertex (3,3).

COLLINEAR VERTEX CASE

A vertex is collinear when the angle between the vectors is 180 degrees. In this case the vertex is not a significant feature and can be dealt with by deleting it from the vertex list forming the perimeter. The collinear vertex is shown in FIG. 36a.

COINCIDENT POINT CASE

Figure 36E:
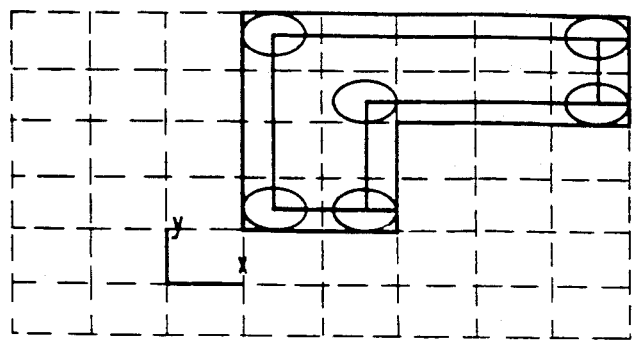
Figure 36F:
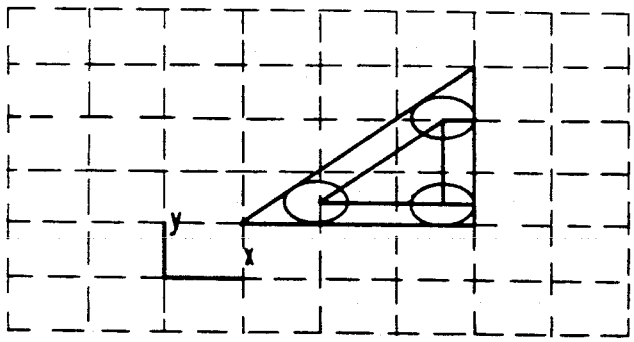
Figure 36G:
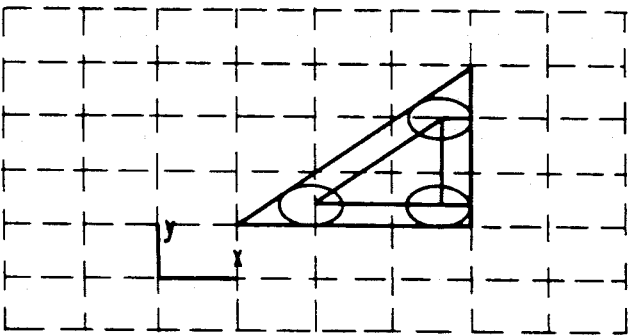

Two vertices that are coincident are also redundant. One of them is deleted from the vertex list of the perimeter. The angle is indeterminate until there is only one vertex at that coordinate. The coincident point is shown in FIG. 36e at vertex (4,1).

INVASIVE ANGLE CASE

When the angle is greater than 180 degrees it is an "inside angle" and the circle must be inscribed along the projections of the vectors. An angle that is additionally greater than 270 degrees is termed an "invasive angle" because into the perimeter.

There is no significant distortion induced by this feature, however the laser beam will overlap itself to an increasing degree as the angle approached 360 degrees. At the boundary case of 0 degrees, the laser beam will trace inward and outward, no effect on the perimeter at all. The invasive vertex is shown on FIG. 36f vertex (4,2).

COMPLES POLYGON CASE

The complex perimeter will likely contain an assortment of the above enumerated cases. An additional possibility exists that cure compensation will move a perimeter segment to cross over an adjacent segment. Such is very nearly the case in FIG. 36g near vertex (1,1).

Such a case must be regarded as an ill defined part, but could be dealt with using more advanced techniques beyond the scope of the algorithm presented in this paper.

WALLS

Figure 36H:
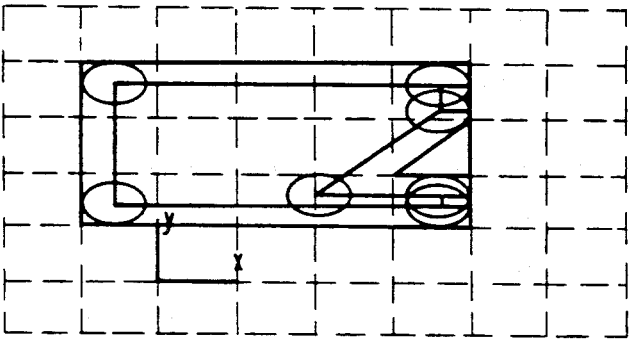

So far we have only considered outer perimeters which are reduced. Inner perimeters are encountered as the boundaries of holes, or as the insides of walls. Inner perimeters must be compensated by expansion, as shown in FIG. 36h. For clarity the beams are not shown, but this is in fact the cases of a right angle (handled as an oblique angle), and an invasive angle of 270 degrees for the inner perimeter.

The distinction between inner and outer perimeters can be made in several ways. In this particular model the convention is adopted that outer perimeters shall have their vertices ordered in a clockwise manner, and inner perimeters counterclockwise. Another mathematically sound method is to use a negative beam radius for inner perimeters. The type of a perimeter can additionally be determined by comparing the vector normals to a known orientation at the start; this is the method used in SLICE cure compensation.

ADJOINING OUTER PERIMETERS

Figure 36I:
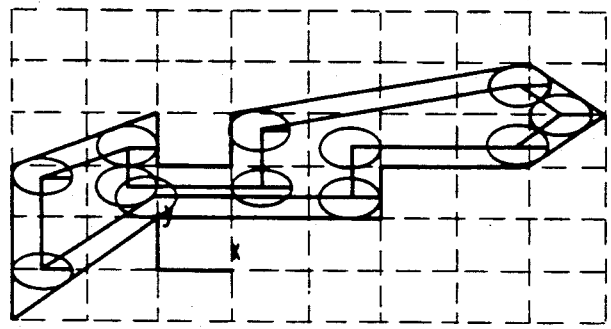
Figure 36J:
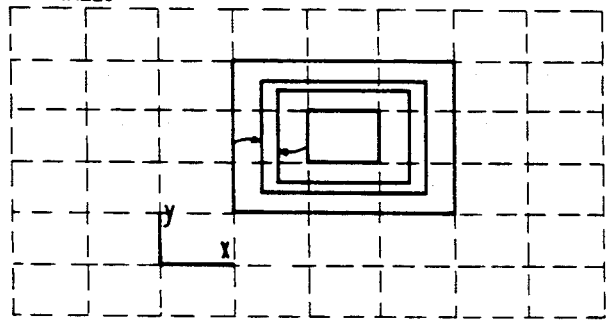
Figure 36K:
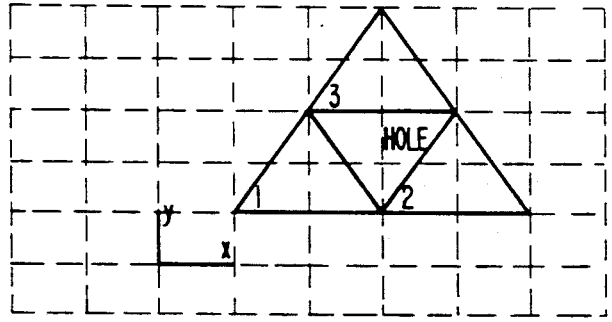
Figure 36L:
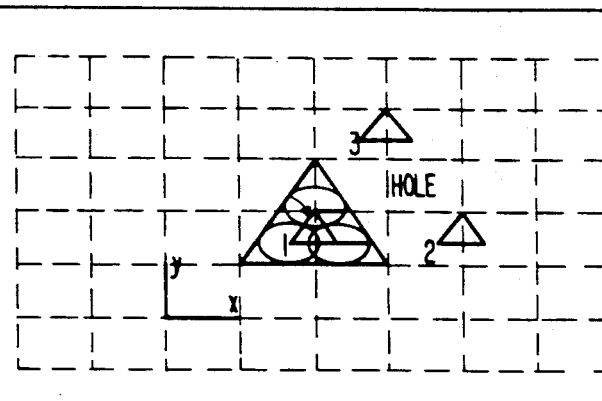

Cure compensation may have some structural effects on a part. Consider a layer in a part in which there are three adjacent triangles that form a hole in the center as shown in FIG. 36i. The key structural point is that the triangles abut each other. After cure compensation the triangles are reduced, since they are each outer perimeters, so that they no longer touch one another. This will affect the three dimensional structural qualities of the part.

It is not possible for a two-dimensional compensation algorithm such as that presented here to correct for these types of structural cases. This may be a topic for future research. Currently these types of cases will require user intervention.

FIGS. 37a and 37b illustrate the mathematical basis and derivations for cure compensation.

When parts are built using stereolithography, resin is cured by exposing its surface with a laser that traces the appropriate pattern by use of many straight variable length line segments (vectors). These vectors serve different purposes, some are used to create skin, some to create boundaries, some to create internal structure (cross-hatch), etc. We have divided the vectors that can occur on a particular layer into 11 types, called blocks. These eleven blocks are significant for part building when using Style 1; if another style is used the number of blocks and their types will probably change. The fourteen types are:

| Type | Label | Full name | Styles used on |
|------|-------|-----------|----------------|
| 1 | LB | Layer boundary | 1, 2, 3, 4 |
| 2 | LH | Layer cross-hatch | 1, 2, 3, 4 |
| 3 | NFDB | Near-flat down-facing skin boundary | 1, 2, 3, 4 |
| 4 | NFDH | Near-flat down-facing skin cross-hatch | 1 |
| 5 | NFDF | Near-flat down-facing skin fill | 1, 2, 3, 4 |
| 6 | NFUB | Near-flat up-facing skin boundary | 1, 2, 3, 4 |
| 7 | NFUH | Near-flat up-facing skin cross-hatch | 2 |
| 8 | NFUF | Near-flat up-facing skin fill | 1, 2, 3, 4 |
| 9 | FDB | Flat down-facing skin boundardy | 1, 2, 3, 4 |
| 10 | FDH | Flat down-facing skin cross-hatch | 2 |
| 11 | FDF | Flat down-facing skin fill | 1, 2, 3, 4 |
| 12 | FUB | Flat up-facing skin boundary | 1, 2, 3, 4 |
| 13 | FUH | Flat up-facing skin cross-hatch | 2 |
| 14 | FUF | Flat up-facing skin fill | 1, 2, 3, 4 |

Each of the 5 boundaries could have corresponding hatch and fill vectors. The reason some of these hatch and fill blocks are not included is because we find them redundant or at least unnecessary when the above blocks are used. All these vector blocks, along with the ones that aren't included, are discussed in more detail in the disclosure sections that discuss part building styles.

To build good parts we not only require that the above vectors be drawn with certain curing requirements, but also that they be drawn in a particular order. The required drawing order is actually the order of the blocks in the list above. This drawing order is required to minimize curl, and/or to minimize birdnesting, and/or to insure that vectors that are drawn do not affect the curing of vectors that will be drawn afterwards, etc. If details on the decisions that went into choosing this drawing order will be useful, they can be supplied.

The easiest way to insure that vectors are drawn in the right order is to have slice output the blocks in the proper order. The above order is used for the slice output file with regard to each layer. The ordering of layers in the output file is done from lowest to highest. If a given object is not continuous in the vertical direction (the gaps will be filled in by other objects that will be built at the same time), slice will include layer header information for the missing layers in the output file. The layer header information is supplied for all layers. It is included as a twelfth block which is labelled "L" followed by a number indicating the scale bit spacing in the vertical dimension from which the vector blocks were derived.

The new and improved stereolithographic method and apparatus has many advantages over currently used methods for producing plastic objects. The method avoids the need of producing tooling drawings and tooling. The designer can work directly with the computer and a stereolithographic device, and when he is satisfied with the design as displayed on the output screen of the computer, he can fabricate a part for direct examination information defining the object being specially processed to reduce cure and distortion, and increase resolution, strength and accuracy of reproduction. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary. Moreover, the data manipulation techniques of the present invention enable production of objects with reduced stress, curl and distortion, and increased resolution, strength accuracy, speed and economy of production, even for difficult and complex object shapes.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is particularly useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

While a variety of stereolithographic systems have been disclosed for the practice of the present invention, they all have in common the concept of drawing upon a substantially two-dimensional surface and extracting a three-dimensional object from that surface.

The present invention satisfies a long existing need in the art for a CAD and CAM system capable of rapidly, reliably, accurately and economically designing and fabricating three-dimensional plastic parts and the like.

It will be apparent from the foregoing that, while particular forms of the invention have been illustrated and described, various modifications can be made without departing from the spirit and scope of the invention. Accordingly, it is not intended that the invention be limited, except as by the appended claims.

We claim:

1. A system for forming a three-dimensional object cross-section by cross-section out of a material capable of selective physical transformation upon exposure to synergistic stimulation, comprising:
   at least one computer programmed to process data descriptive of said three-dimensional object comprised of at least some polygons having vertices, the polygons substantially spanning a surface of the object, by overlaying the descriptive data with a plurality of slicing planes spaced along a slicing axis, placing at least some of the polygon vertices to at least one of the slicing planes to obtain preliminary descriptive data, and then converting the preliminary descriptive data to data descriptive of object cross-sections; and means for selectively exposing layers of said material to said synergistic stimulation in accordance with said data descriptive of said cross-sections to form said object cross-section by cross-section.

2. A system for forming a three-dimensional object cross-section by cross-section out of a material capable of selective physical transformation upon exposure to synergistic stimulation, comprising:

at least one computer programmed to process data descriptive of said three-dimensional object comprised of at least some polygons having vertices, the polygons substantially spanning a surface of the object, by overlaying the descriptive data with a plurality of slicing planes spaced along a slicing axis, placing at least some of the polygon vertices to at least one of the slicing planes to obtain preliminary descriptive data, and then converting the preliminary descriptive data to data descriptive of object cross-sections, said data descriptive of said cross-sections being created, at least in part, from the preliminary descriptive data at planes offset from the slicing planes; and means for selectively exposing layers of said material to said synergistic stimulation in accordance with said data descriptive of said cross-sections to form said object cross-section by cross-section.

3. A system for forming a three-dimensional object cross-section by cross-section out of a material capable of selective physical transformation upon exposure to synergistic stimulation, comprising:

at least one computer programmed to convert data descriptive of the object into data descriptive of object cross-sections, by overlaying the object descriptive data with a plurality of slicing levels spaced along a slicing axis, and generating near-flat skin data on a cross-section from the object descriptive data at more than one of said slicing levels; and means for selectively exposing layers of said material to said synergistic stimulation in accordance with said data descriptive of said cross-sections to form said object cross-section by cross-section.

4. The system of claim 3 wherein said at least one computer is programmed to form said near-flat skin data which is up facing near-flat skin data.

5. The system of claim 3 wherein said at least one computer is programmed to form said near-flat skin data which is down-facing near-flat skin data.

6. A system for forming a three-dimensional object cross-section by cross-section out of a material capable of selective physical transformation upon exposure to synergistic stimulation, comprising:

at least one computer programmed to convert data descriptive of the object into data representative of cross-sections of the object, the data representative of said cross-sections specifying, at least in part, lines of solidified material on a cross-section which leave areas of substantially unsolidified material on that cross-section; and means for selectively exposing layers of said material to said synergistic stimulation in accordance with said data representative of said cross-sections to form said object cross-section by cross-section.

7. A system for forming a three-dimensional object cross-section by cross-section out of a material capable of selective physical transformation upon exposure to synergistic stimulation, comprising:

at least one computer programmed to convert data descriptive of the object into preliminary data descriptive of cross-sections of the object specifying, at least in part, lines of solidified material having a width, and to modify at least some of the preliminary data in order to offset at least some of the lines to at least partially compensate for the width of the lines to obtain data descriptive of said cross-sections; and means for selectively exposing layers of said material to said synergistic stimulation in accordance with said data descriptive of said cross-sections to form said object cross-section by cross-section.

8. A system for forming a three-dimensional object cross-section by cross-section out of a material capable of selective physical transformation upon exposure to synergistic stimulation, comprising:

at least one computer programmed to convert data descriptive of the object to data descriptive of cross-sections of the object, the data descriptive of said cross-sections specifying first and second blocks of lines of solidified material on a cross-section, with a first exposure specified for the first block of lines which is different from a second exposure specified for the second block of lines; and selectively exposing layers of said material to said synergistic stimulation in accordance with said data descriptive of said cross-sections to form said object cross-section by cross-section.

9. A system for forming a three-dimensional object cross-section by cross-section from a material capable of selective physical transformation upon exposure to synergistic stimulation, comprising:

at least one computer programmed to convert data descriptive of a faceted representation of the object into data descriptive of object cross-sections; and means for selectively exposing layers of said material to said synergistic stimulation in accordance with said data descriptive of said cross-sections to form said object cross-section by cross-section.

10. A method for forming a three-dimensional object cross-section by cross-section out of a material capable of selective physical transformation upon exposure to synergistic stimulation, comprising the steps of:

providing data descriptive of said three-dimensional object comprised of at least some polygons having vertices, the polygons substantially spanning a surface of the object;

processing said object descriptive data by overlaying the object descriptive data with a plurality of slicing planes spaced along a slicing axis, and placing at least some of the polygon vertices to at least one of the slicing planes to obtain preliminary object descriptive data;

converting the preliminary object descriptive data to data representative of object cross-sections; and selectively exposing layers of said material to said synergistic stimulation in accordance with said data representative of said cross-sections to form said object cross-section by cross-section.

11. A method for forming a three-dimensional object cross-section by cross-section out of a material capable of selective physical transformation upon exposure to synergistic stimulation, comprising the steps of:

providing data descriptive of said three-dimensional object comprised of at least some polygons having vertices, the polygons substantially spanning a surface of the object;

processing said descriptive data by overlying said data with a plurality of slicing planes spaced along a slicing axis, and placing at least some of the polygon vertices to at least one of the slicing planes to obtain preliminary object descriptive data;

converting the preliminary object descriptive data to data representative of object cross-sections, the data representative of said cross-sections being created, at least in part, from the object descriptive data at planes offset from the slicing planes; and selectively exposing layers of said material to said synergistic stimulation in accordance with said data representative of said cross-sections to form said object cross-section by cross-section.

12. A method for forming a three-dimensional object cross-section by cross-section out of a material capable of selective physical transformation upon exposure to synergistic stimulation, comprising the steps of:

providing data descriptive of the three-dimensional object;

converting the object descriptive data into data representative of object cross-sections by overlaying the object descriptive data with a plurality of slicing levels spaced along a slicing axis, and generating near-flat skin data for a cross-section from said object descriptive data at more than one of said slicing levels; and selectively exposing layers of said material to said synergistic stimulation in accordance with said data representative of said cross-sections to form said object cross-section by cross-section.

13. The method of claim 12, wherein the converting step further comprises generating said near-flat data which is up-facing near-flat data.

14. The method of claim 12, wherein the converting step further comprises generating said near-flat data which is down-facing near-flat data.

15. A method for forming a three-dimensional object cross-section by cross-section out of a material capable of selective physical transformation upon exposure to synergistic stimulation, comprising the steps of:

providing data descriptive of the three-dimensional object;

converting the data descriptive of the object into preliminary data descriptive of cross-sections of the object, the preliminary data descriptive of said cross-sections specifying lines of solidified material having a width;

modifying at least some of the data to offset at least some of the lines to at least partially compensate for the width of the lines to obtain data descriptive of said cross-sections; and selectively exposing layers of said material to said synergistic stimulation in accordance with said data descriptive of said cross-sections to form said object substantially cross-section by cross-section.

16. A method for forming a three-dimensional object cross-section by cross-section out of a material capable of selective physical transformation upon exposure to synergistic stimulation, comprising the steps of:

providing data descriptive of the three-dimensional object;

converting the data descriptive of the object to data descriptive of cross-sections of the object, the data descriptive of said cross-sections specifying first and second blocks of lines of solidified material on a cross-section, with a first exposure specified for the first block of lines which is different from a second exposure specified for the second block of lines; and selectively exposing layers of said material to said synergistic stimulation in accordance with said data descriptive of said cross-sections to form said object cross-section by cross-section.

17. A method for forming a three-dimensional object cross-section by cross-section from a material capable of selective physical transformation upon exposure to synergistic stimulation, comprising the steps of:

providing data descriptive of a faceted representation of the object;

converting the object descriptive data to data descriptive of object cross-sections; and selectively exposing layers of said material to said synergistic stimulation in accordance with said data descriptive of said cross-sections to form said object cross-section by cross-section.

18. The system of claim 8 wherein said at least one computer is programmed to convert said data descriptive of the object to said data descriptive of object cross-sections, including generating cross-hatch data specifying forming said first block of lines of solidified material on a cross-section at said first exposure, and generating skin data specifying forming said second block of lines of solidified material at said second exposure different from the first exposure on that same cross-section.

19. A system for forming a three-dimensional object cross-section by cross-section from a material capable of selective physical transformation upon exposure to synergistic stimulation, said system comprising:

at least one computer programmed to convert data descriptive of the object into data descriptive of object cross-sections by generating data descriptive of a boundary of a cross-section, and boundary orientation information, and generating skin data, specifying lines of solidified material within the boundary of that cross-section, at least in part, from the data descriptive of the boundary and the boundary orientation information; and means for selectively exposing layers of said material to said synergistic stimulation in accordance with said data descriptive of said cross-sections to form said object cross-section by cross-section.

20. The system of claim 19 wherein said at least one computer generates said skin data which is flat skin data.

21. The system of claim 19 wherein said at least one computer generates said skin data which is near-flat skin data.

22. The system of claim 19 wherein said at least one computer generates said skin data which is up-facing skin data.

23. The system of claim 19 wherein said at least one computer generates said skin data which is down-facing skin data.

24. A system for forming a three-dimensional object cross-section by cross-section out of a material capable of selective physical transformation upon exposure to synergistic stimulation, said system comprising:

at least one computer programmed to convert data descriptive of the object to data descriptive of object cross-sections including generating data descriptive of a boundary of a cross-section, and boundary orientation information, and then generating cross-hatch data, specifying lines of solidified material within the boundary of that same cross-section, at least in part, from the data descriptive of the boundary and the boundary orientation information; and means for selectively exposing layers of said material to said synergistic stimulation in accordance with said data descriptive of said cross-sections to form said object cross-section by cross-section.

25. A system for forming a three-dimensional object cross-section by cross-section from a material capable of selective physical transformation upon exposure to synergistic stimulation, said system comprising:

at least one computer programmed to convert data descriptive of the object into data descriptive of cross-sections of the object, the data descriptive of said cross-sections specifying first and second blocks of lines of solidified material on a cross-section, and specifying a spacing between the lines in the first block which is different from a spacing between the lines in the second block; and means for selectively exposing layers of said material to said synergistic stimulation in accordance with said data descriptive of said cross-sections to form said object cross-section by cross-section.

26. A system for forming a three-dimensional object cross-section by cross-section from a material capable of selective physical transformation upon exposure to synergistic stimulation, said system comprising:

at least one computer including a CAD computer, programmed to convert data descriptive of the object, generated on the CAD computer, to data descriptive of a faceted representation of the object, and to convert the data descriptive of the faceted representation to data descriptive of object cross-sections; and means for selectively exposing layers of said material to said synergistic stimulation in accordance with said data descriptive of said cross-sections to form said object cross-section by cross-section.

27. A system for forming a three-dimensional object cross-section by cross-section out of a material capable of selective physical transformation upon selective exposure to synergistic stimulation, comprising:

at least one computer programmed to convert a descriptive representation of the object to representations of object cross-sections, the representations of said cross-sections specifying a surface comprised of substantially transformed material enclosing at least some material that is not substantially transformed in an area specified to be solid by the descriptive representation; and means for selectively exposing layers of said material to said synergistic stimulation in accordance with said representations of said cross-sections to form said object cross-section by cross-section.

28. A system for forming a three-dimensional object cross-section by cross-section out of a material capable of selective physical transformation upon selective exposure to synergistic stimulation, comprising:

at least one computer programmed to convert data descriptive of the object into data representative of object cross-sections by first generating preliminary cross-sectional data from the data descriptive of the object located at spaced splicing planes, and then adding at least some near-flat data to the preliminary cross-sectional data to form said data representative of said cross-sections, which specifies an object which is substantially uniformly oversized compared to the object described by the object descriptive data; and means for selectively exposing layers of said material to said synergistic stimulation in accordance with said data representative of said cross-sections to form said object cross-section by cross-section.

29. A system for forming a three-dimensional object cross-section by cross-section out of a material capable of selective physical transformation upon selective exposure to synergistic stimulation, comprising:

at least one computer programmed to convert data descriptive of the object into data representative of object cross-sections by first generating preliminary cross-sectional data from the object descriptive data located at spaced slicing planes, and the removing at least some near-flat data from the preliminary cross-sectional data to form said data representative of said cross-sections which specifies an object which is substantially uniformly undersized compared to the object specified by the object descriptive data; and means for selectively exposing layers of said material to said synergistic stimulation in accordance with said data representative of said cross-sections to form said object cross-section by cross-section.

30. A system for forming a three-dimensional object cross-section by cross-section out of a material capable of selective physical transformation upon selective exposure to synergistic stimulation, comprising:

at least one computer programmed to convert data descriptive of the object into data representative of a number of object cross-sections, which are situated between an up-facing feature of the object spaced from a down-facing feature of the object by a distance, by utilizing a number of slicing planes spaced along a slicing axis between the up and down-facing features, which planes substantially span the distance between the up- and down-facing features, wherein the number of cross-sections is one less than the number of slicing planes; and means for selectively exposing layers of said material to said synergistic stimulation in accordance with said data representative of said cross-sections to form said object cross-section by cross-section.

31. A method for forming a three-dimensional object cross-section by cross-section out of a material capable of selective physical transformation upon selective exposure to synergistic stimulation, comprising:

providing data descriptive of the object;

utilizing a number of slicing planes, spaced along a slicing axis between an up-facing feature of the object and a down-facing feature of the object spaced by a distance from the up-facing feature, which planes substantially span the distance between the up- and down-facing features, to convert the data descriptive of the object into data representative of a number of object cross-sections situated between the up- and down-facing features, wherein the number of cross-sections is one less than the number of slicing planes; and selective exposing layers of said material to said synergistic stimulation in accordance with said data representative of said cross-sections to form said object cross-section by cross-section.

32. A method for forming a three-dimensional object cross-section by cross-section out of a material capable of selective physical transformation upon exposure to synergistic stimulation, comprising the steps of:

providing data descriptive of the object;

converting the data descriptive of the object into data descriptive of cross-sections of the object, the data descriptive of said cross-sections specifying first and second blocks of lines of solidified material on a cross-section, and specifying a spacing between the lines of the first block which is different from a spacing between the lines of the second block; and selectively exposing layers of said material to said synergistic stimulation in accordance with said data representative of said cross-sections to form said object cross-section by cross-section.

33. A system for forming three-dimensional object cross-section by cross-section out of a material capable of selective physical transformation upon exposure to synergistic stimulation, comprising:

at least one computer programmed to convert data descriptive of the object into data descriptive of cross-sections of the object, the data descriptive of said cross-sections specifying first and second blocks of lines of solidified material on a cross-section, the lines in the first block specified to be exposed before the lines on the second block; and selectively exposing layers of said material to said synergistic stimulation in accordance with said data descriptive of said cross-sections to form said object cross-section by cross-section.

34. A method for forming a three-dimensional object cross-section by cross-section out of a material capable of selective physical transformation upon exposure to synergistic stimulation, comprising the steps of:

providing data descriptive of the object;

converting the data descriptive of the object into data descriptive of cross-sections of the object, the data descriptive of said cross-sections specifying first and second blocks of lines of solidified material on a cross-section, the lines in the first block specified to be exposed before the lines in the second block; and selectively exposing layers of said material to said synergistic stimulation in accordance with said data descriptive of said cross-sections to form said object cross-section by cross-section.

35. A system for forming a three-dimensional object cross-section by cross-section out of a material capable of selective physical transformation upon exposure to synergistic stimulation, comprising:

at least one computer programmed to convert data descriptive of the object into data descriptive of cross-sections of the object, the data descriptive of said cross-sections specifying a first block of lines of solidified material on a cross-section generated from a first boundary, and a second block of lines of solidified material on the cross-section generated from a second boundary; and means for selectively exposing layers of said material to said synergistic stimulation in accordance with said data descriptive of said cross-sections to form said object cross-section by cross-section.

36. A method for forming a three-dimensional object cross-section by cross-section out of a material capable of selective physical transformation upon exposure to synergistic stimulation, comprising the steps of:

providing data descriptive of the object;

converting the data descriptive of the object into data descriptive of cross-sections of the object, the data descriptive of said cross-sections specifying a first block of lines of solidified material on a cross-section generated from a first boundary, and a second block of lines of solidified material on the cross-section generated from a second boundary; and selectively exposing layers of said material to said synergistic stimulation in accordance with said data descriptive of said cross-sections to form said object cross-section by cross-section.

37. A system for forming a three-dimensional object cross-section by cross-section out of a material capable of selective physical transformation upon exposure to synergistic stimulation, comprising:

at least one computer programmed to convert data descriptive of the object into data descriptive of cross-sections of the object, the data descriptive of said cross-sections specifying a first boundary on a cross-section generated from the data descriptive of the object located at at least one slicing plane, and specifying a second boundary on the cross-section generated from the data descriptive of the object located at at least one different slicing plane; and means for selectively exposing layers of said material to said synergistic stimulation in accordance with said data descriptive of said cross-sections to form said object cross-section by cross-section.

38. A method for forming a three-dimensional object cross-section by cross-section out of a material capable of selective physical transformation upon exposure to synergistic stimulation, comprising the steps of:

providing data descriptive of the object;

converting the data descriptive of the object into data descriptive of cross-sections of the object, the data descriptive of said cross-sections specifying a first boundary on a cross-section generated from the data descriptive of the object located at at least one slicing plane, and specifying a second boundary on the cross-section generated from the data descriptive of the object located at at least one different slicing plane; and selectively exposing layers of said material to said synergistic stimulation in accordance with said data descriptive of said cross-sections to form said object cross-section by cross-section.

39. The system of claim 33 wherein said at least one computer is programmed to convert said data descriptive of the object into said data descriptive of cross-sections of the object, the data descriptive of said cross-sections specifying forming boundary lines of solidified material on a cross-section prior to forming hatch lines of solidified material on the cross-section.

40. The method of claim 34 further comprising converting said data descriptive of the object into said data descriptive of cross-sections of the object, the data descriptive of said cross-sections specifying forming boundary lines of solidified material on a cross-section prior to forming hatch lines of solidified material on the cross-section.

41. The system of claim 33 wherein said at least one computer is programmed to convert said data descriptive of the object into said data descriptive of cross-sections of the object, the data descriptive of said cross-sections specifying forming boundary lines of solidified material on a cross-section prior to forming skin lines of solidified material on the cross-section.

42. The method of claim 34 further comprising converting the data descriptive of the object into said data descriptive of cross-sections of the object, the data descriptive of said cross-sections specifying forming boundary lines of solidified material on a cross-section prior to forming skin lines of solidified material on the cross-section.

43. The system of claim 33 wherein said at least one computer is programmed to convert said data descriptive of the object into said data descriptive of cross-sections of the object, the data descriptive of said cross-sections specifying forming hatch lines of solidified material on a cross-section prior to forming skin lines of solidified material on the cross-section.

44. The method of claim 34 further comprising converting the data descriptive of the object into said data descriptive of cross-sections of the object, the data descriptive of said cross-sections specifying forming hatch lines of solidified material on a cross-section prior to forming skin lines of solidified material on the cross-section.

45. A method for forming a three-dimensional object cross-section by cross-section out of a material capable of selective physical transformation upon exposure to synergistic stimulation, comprising the steps of:
providing data descriptive of the object;
converting the data descriptive of the object to data descriptive of object cross-sections including generating data descriptive of a boundary on a cross-section, and boundary orientation information, and then generating cross-hatch data specifying lines of solidified material within the boundary at least in part from the data descriptive of the boundary and the boundary orientation information; and
selectively exposing layers of said material to said synergistic stimulation in accordance with said data representative of said cross-sections to form said object cross-section by cross-section.

46. The method of claim 16 further comprising converting the data descriptive of the object to said data descriptive of object cross-sections, including generating cross-hatch data specifying forming said first block of lines of solidified material on a cross-section at said first exposure, and forming said second block of lines of solidified material on the same cross-section at said second exposure different from the first exposure.

47. The system of claim 8 wherein said at least one computer is programmed to convert said data descriptive of the object to said data descriptive of object cross-sections, including generating at least some boundary data specifying forming said first block of lines of solidified material on a cross-section at said first exposure, and generating skin data specifying forming said second block of lines of solidified material on the cross-section at said second exposure different from the first exposure.

48. The method of claim 16 further comprising converting the data descriptive of the object to said data descriptive of object cross-sections, including generating at least some boundary data specifying forming said first block of lines of solidified material on a cross-section at said first exposure, and generating skin data specifying said second block of lines of solidified material on the cross-section at said second exposure different from the first exposure.

49. A system for forming a three-dimensional object cross-section by cross-section from a material capable of selective physical transformation upon exposure to synergistic stimulation, said system comprising:
at least one computer programmed to convert data descriptive of the object to data descriptive of object cross-sections, including generating at least some boundary data specifying forming a first block of lines of solidified material on a cross-section, and generating cross-hatch data specifying forming a second block of lines of solidified material on the same cross-section which leaves areas of substantially unsolidified material on that cross-section; and
means for selectively exposing layers of said material to said synergistic stimulation in accordance with said cross-sectional data to form said object cross-section by cross-section.

50. A system for forming a three-dimensional object cross-section by cross-section from a material capable of selective physical transformation upon exposure to synergistic stimulation, comprising:
at least one computer programmed to convert data descriptive of the object to data descriptive of object cross-sections, including generating preliminary cross-sectional data specifying lines of solidified material on the cross-sections, and removing any of said preliminary data specifying duplicate lines of solidified material on the cross-sections; and
means for selectively exposing layers of said material to said synergistic stimulation in accordance with said data descriptive of said cross-sections to form said object cross-section by cross-section.

51. A system for forming a three-dimensional object cross-section by cross-section from a material capable of selective physical transformation upon exposure to synergistic stimulation, comprising:
at least one computer programmed to convert data descriptive of the object to data descriptive of object cross-sections, said data descriptive of said cross-sections specifying over-curing at least some regions on a cross-section that overlay regions on a previous cross-section to insure adhesion between these cross-sections; and
means for selectively exposing layers of said material to said synergistic stimulation in accordance with said data descriptive of said cross-sections to form said object cross-section by cross-section.

52. A system for forming a three-dimensional object cross-section by cross-section from a material capable of selective physical transformation upon exposure to synergistic stimulation, comprising:
at least one computer programmed to convert data descriptive of the object to data descriptive of object cross-sections, including generating preliminary data specifying lines of solidified material on the cross-sections, and ordering the preliminary data to reduce jumping distance of said beam of said synergistic stimulation; and
means for selectively exposing layers of said material to said beam of said synergistic stimulation in accordance with said data descriptive of said cross-sections to form said object cross-section by cross-section.

53. A method for forming a three-dimensional object cross-section by cross-section from a material capable of selective physical transformation upon exposure to synergistic stimulation, comprising the steps of:
providing data descriptive of the object generated on a CAD computer;

converting the data descriptive of the object to data descriptive of a faceted representation of the object;

converting the data descriptive of the faceted representation of data descriptive of object cross-sections; and selectively exposing layers of said material to said synergistic stimulation in accordance with said data descriptive of said cross-sections to form said object cross-section by cross-section.

54. A system for forming a three-dimensional object cross-section by cross-section from a material capable of selective physical transformation upon exposure to synergistic stimulation, comprising:

at least one computer programmed to convert data descriptive of a faceted representation of the object, the faceted representation comprising a plurality of facets substantially spanning a surface of the object, including specified facets having slopes with respect to the surface, to data descriptive of cross-sections of the object utilizing at least in part information representative of the slopes; and means for selectively exposing layers of said material to said synergistic stimulation in accordance with said data descriptive of said cross-sections to form said object cross-section by cross-section.

55. A method for forming a three-dimensional object cross-section by cross-section from a material capable of selective physical transformation upon exposure to synergistic stimulation, comprising the steps of:

providing data descriptive of a faceted representation of the object, the faceted representation comprising a plurality of facets substantially spanning a surface of the object, including specified facets having slopes relative to the surface of the object, to data descriptive of object cross-sections utilizing at least in part information representative of said slopes; and selectively exposing layers of said material to said synergistic stimulation in accordance with said data descriptive of said cross-sections to form said object cross-section by cross-section.

56. The system of claim 25 wherein said at least one computer is programmed to convert said data descriptive of the object to said data representative of cross-sections of the object including generating cross-hatch data specifying said first block of lines of solidified material on a cross-section, and skin data specifying said second block of lines of solidified, material on that cross-section.

57. The method of claim 32 further comprising converting the object descriptive data into said data descriptive of object cross-sections, including generating cross-hatch data specifying said first block of lines of solidified material on a cross-section and generating skin data specifying said second block of lines of solidified material on that cross-section.

* * * * *

UNITED STATES PATENT AND TRADEMARK OFFICE
CERTIFICATE OF CORRECTION

PATENT NO. : 5,059,359
DATED : October 22, 1991
INVENTOR(S) : Hull et al.

It is certified that error appears in the above-identified patent and that said Letters Patent is hereby corrected as shown below:

Column 1,
Line 22, "and apparatus for" should read -- methods and apparatus for --.

Column 7,
Line 49, "laser and opti" should read -- laser and optical --.

Column 8,
Line 18, "designed sliced" should read -- designed object sliced --.

Column 9,
Line 29, "and hatch show" should read -- and hatch showing --.

Column 10,
Line 30, "designed object" should read -- designed object showing --.

Column 11,
Line 24, "FIG. 31t - 31t'" should read -- FIGS. 31t - 31t'"--.
Line 27, "reside views of" should read -- are side views of --.

Column 12,
Line 45, "stereolitho set forth" should read -- stereolithography set forth --.

Column 35,
Line 9, "point closest" should read -- has a point closest --.

Column 46,
Line 20, "could simply" should read -- we could simply --.

Column 48,
Line 7, "into the perimeter" should read -- it cuts into the perimeter --.
Line 12, "outward, no" should read -- outward, with no --.

UNITED STATES PATENT AND TRADEMARK OFFICE
CERTIFICATE OF CORRECTION

PATENT NO.    : 5,059,359
DATED         : October 22, 1991
INVENTOR(S)   : Hull et al.

It is certified that error appears in the above-identified patent and that said Letters Patent is hereby corrected as shown below:

Column 61,
Line 5, "sentation of data" should read -- sentation to data --.

Signed and Sealed this

Eleventh Day of March, 2003

JAMES E. ROGAN
*Director of the United States Patent and Trademark Office*